(12) United States Patent
Nakata et al.

(10) Patent No.: US 10,380,470 B2
(45) Date of Patent: Aug. 13, 2019

(54) DATA STORAGE MEDIUM AND MANUFACTURING METHOD THEREOF, DATA STORAGE MEDIUM, DATA READ OUT APPARATUS AND DATA READ OUT METHOD

(71) Applicant: DAI NIPPON PRINTING CO., LTD., Tokyo (JP)

(72) Inventors: Naoko Nakata, Tokyo (JP); Hirokazu Oda, Tokyo (JP); Yuki Aritsuka, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/575,732

(22) PCT Filed: Sep. 16, 2016

(86) PCT No.: PCT/JP2016/077407
§ 371 (c)(1),
(2) Date: Nov. 20, 2017

(87) PCT Pub. No.: WO2017/047737
PCT Pub. Date: Mar. 23, 2017

(65) Prior Publication Data
US 2018/0293477 A1    Oct. 11, 2018

(30) Foreign Application Priority Data

Sep. 18, 2015 (JP) ................ 2015-186064
Sep. 18, 2015 (JP) ................ 2015-186065
Sep. 18, 2015 (JP) ................ 2015-186066

(51) Int. Cl.
*G03F 7/00* (2006.01)
*G03F 7/30* (2006.01)
(Continued)

(52) U.S. Cl.
CPC ..... *G06K 19/06159* (2013.01); *G03F 7/0002* (2013.01); *G03F 7/30* (2013.01);
(Continued)

(58) Field of Classification Search
None
See application file for complete search history.

(56) References Cited

U.S. PATENT DOCUMENTS 5,686,718 A    11/1997   Iwai et al.
5,866,895 A    2/1999    Fukuda et al.
(Continued)

FOREIGN PATENT DOCUMENTS

CN    103842858 A    6/2014
JP    H11-175991 A   7/1999
(Continued)

OTHER PUBLICATIONS

Dec. 20, 2016 Search Report issued in International Patent Application No. PCT/JP2016/077407.
(Continued)

*Primary Examiner* — Kristy A Haupt
(74) *Attorney, Agent, or Firm* — Oliff PLC

(57) ABSTRACT

A data storage medium includes a convexoconcave structure formed in a storage area which is set on a first surface of a quartz glass substrate. The storage area includes a plurality of unit storage areas which are arrayed at least in one direction, and non-data storage areas which are disposed between the unit storage areas, which are adjacent to each other. The convexoconcave structure includes unit data patterns, address patterns and boundary patterns. The unit data patterns are formed in the plurality of unit storage areas respectively in the array sequence of the unit storage areas, and the address patterns are formed in the non-data storage (Continued)

areas so as to correspond to each of the unit storage areas in which the unit data patterns are formed respectively.

44 Claims, 23 Drawing Sheets

(51) Int. Cl.
| | | |
|---|---|---|
| *G06K 7/10* | (2006.01) | |
| *G06K 7/14* | (2006.01) | |
| *G06K 19/02* | (2006.01) | |
| *G06K 19/06* | (2006.01) | |
| *G11B 7/005* | (2006.01) | |
| *G11B 7/2531* | (2013.01) | |
| *G11B 7/24097* | (2013.01) | |
| *G11B 7/007* | (2006.01) | |
| *G11B 7/24091* | (2013.01) | |
| *G11B 7/26* | (2006.01) | |
| *G03F 7/36* | (2006.01) | |
| *G06K 19/04* | (2006.01) | |

(52) U.S. Cl.
CPC ........... *G03F 7/36* (2013.01); *G06K 7/10712* (2013.01); *G06K 7/14* (2013.01); *G06K 19/02* (2013.01); *G06K 19/041* (2013.01); *G06K 19/06* (2013.01); *G06K 19/06131* (2013.01); *G11B 7/005* (2013.01); *G11B 7/007* (2013.01); *G11B 7/24091* (2013.01); *G11B 7/24097* (2013.01); *G11B 7/2531* (2013.01); *G11B 7/26* (2013.01)

(56) References Cited

U.S. PATENT DOCUMENTS

| | | |
|---|---|---|
| 6,252,836 B1 | 6/2001 | Kobayashi |
| 2014/0097250 A1 | 4/2014 | Antognini et al. |
| 2014/0313581 A1 | 10/2014 | Kashima et al. |
| 2014/0341009 A1* | 11/2014 | Carson ............... G11B 7/24094 369/275.1 |

FOREIGN PATENT DOCUMENTS

| | | |
|---|---|---|
| JP | 2003-6944 A | 1/2003 |
| JP | 2003-296972 A | 10/2003 |
| JP | 2004-66724 A | 3/2004 |
| JP | 2010-55663 A | 3/2010 |
| JP | 4991487 B2 | 8/2012 |
| JP | 5286246 B2 | 9/2013 |

OTHER PUBLICATIONS

May 23, 2017 Office Action issued Japanese Patent Application No. 2015-186064.
May 16, 2017 Office Action issued in Japanese Patent Application No. 2015-186065.
May 23, 2017 Office Action issued in Japanese Patent Application No. 2015-186066.
Apr. 22, 2019 Office Action Issued in Chinese Patent Application No. 201680028871.1.

* cited by examiner

DATA STORAGE MEDIUM AND MANUFACTURING METHOD THEREOF, DATA STORAGE MEDIUM, DATA READ OUT APPARATUS AND DATA READ OUT METHOD

TECHNICAL FIELD

The present invention relates to a data storage medium and a manufacturing method thereof, a data storage medium, a data read out apparatus, and a data read out method.

BACKGROUND ART

For a long time paper has been used for recording various information, and even now a lot of information is recorded on paper. On the other hand, along with industrial growth, film (e.g. microfilm) for recording image information, such as moving images and still images, phonograph records for recording sound and the like have begun to be used, and in recent years, optically readable optical recording media, semiconductor recording media and the like, including magnetic recording media, CD, DVD and optical cards, are used as media for recording digital data.

Some information recorded on the above mentioned media are demanded to be stored for a very long time, beyond 100 years. The above mentioned media has durability for not causing problems in terms of the respective intended use, and such media as paper, film and phonograph records, for example, have sufficient durability on a time scale of several years. However, on a time scale exceeding 100 years, time related deterioration is inevitable, and stored information may be lost or damaged by water and heat. For example, in the case of microfilm constituted by cellulose acetate, vinegar syndrome occurs, that is, the film decomposes depending on the temperature and humidity of the storage environment, and acetic acid is generated on the surface of the film, which makes it impossible to read out data. Therefore the life of microfilm is regarded as 30 years or less. In the case of microfilm constituted by polyester, life is regarded to be about 500 years, but this is implemented only when the microfilm is stored in an environment specified by ISO and JIS standards. In other words, the storage environment is still one risk factor in losing information.

Magnetic recording media, optical recording media, semiconductor recording media and the like have sufficient durability with which no problem occurs when using standard electronic apparatuses, but such media are not designed considering a time scale of several decades, hence they are inappropriate for the permanent or semipermanent storage of information. For example, in the case of EEPROM, represented by flash memory, which is a semiconductor-based recording medium, data is recorded and stored by holding charges using floating gates, and the time of holding charges by floating gates is influenced by the storage environment. Further, the insulating layer may be damaged by repeatedly writing data, whereby holding charges may become impossible. ROM is known as a long life semiconductor recording medium, but cost is exorbitant to reproduce ROM as a backup.

Another problem of the above mentioned media is that fire resistance and heat resistance are low. For example, if fire occurs in a location where the above mentioned recording media exists, the data thereof is lost due to heat. In other words, it is virtually impossible to permanently or semipermanently store information using the currently available media.

As a method for permanently or semipermanently storing information, a method of recording and storing information in a media having durability, such as quartz glass, was proposed (see PTL 1 and 2). In concrete terms, the proposed methods are: a method for three-dimensionally recording data in micro cells in a cylindrical medium utilizing the difference of light transmittance, and reading out the information while rotating this medium based on the computer tomography technique (see PTL 1); and a method of irradiating an electromagnetic wave to a cylindrical medium while changing the irradiation angle and measuring the difference of transmittance, and reading out the information based on the computer tomography technique (see PTL 2).

In the case of such recording media as CD and DVD, a laser beam is irradiated to the surface of the recording medium that is set on a rotating stage of a read out apparatus, while rotating the recording medium in a predetermined direction, and the reflected light, which changes depending on the convexoconcave structure on the surface of the recording medium, is detected, whereby the recorded information is read. In the case of an optical card as well, light is irradiated to a recording medium inserted into a read out apparatus, and the contrast of reflectance between a hole portion and a non-hole portion formed on the recording medium is detected, whereby the recording information is read out. To read out information recorded on such an information medium, the recording medium must be set in a correct position in the read out apparatus, such as the front surface/rear surface of the CD or DVD, and the insertion direction of an optical card. In the read out apparatus to read information recorded on the recording medium, the direction to read out the information is set based on the assumption that the recording medium is set in a correct position. Normally in such recording medium as a CD or DVD, a label surface constituted by a material that is different from the substrate of the recording medium is formed on one surface of the recording medium, and in such a recording medium as an optical card, a mark indicating the insertion direction is printed (For information on the optical card, see PTL 3). The operator can set the medium in the correct position in the read out apparatus by confirming the label surface or the mark.

CITATION LIST

Patent Literature

[PTL 1] Japanese Patent No. 4991487
[PTL 2] Japanese Patent No. 5286246
[PTL 3] Japanese Patent Application Publication No. 2004-66724

SUMMARY OF INVENTION

Technical Problem

As disclosed in PTL 1 and PTL 2, information can be permanently and semipermanently recorded and stored if the cylindrical quartz glass is used as a medium, and information is three-dimensionally recorded and stored inside thereof. To read information recorded or stored like this, the information must be read from cells which are three-dimensionally dispersed inside the medium. Hence Fourier transform processing or the like must be used based on a computer tomographic technique. However, if the computer tomographic technique used when the information was originally recorded and stored no longer exists due to the passage of long time scale, such as several hundred years, the recorded and stored information can no longer be read.

To make a reproduction as a backup of the above mentioned medium, in order to reduce the risk of losing information due to damage to the medium on which information is recorded and stored, another quartz glass, in which no information is recorded and stored, must be prepared, the information must be newly recorded and stored. Therefore a reproduction cannot be made if the original medium of the information to be recorded and stored does not exist. Also operation to make such a reproduction is complicated and costly.

In recent years, a recoding medium that can stably store information for a long period of time, exceeding a hundred years, is demanded as the recording medium mentioned above. In the case of when the recording medium has a label surface constituted by material that is different from the substrate of the recording medium, such as a CD and DVD, the material constituting the label surface is more vulnerable to environmental changes than the material constituting the substrate of the recording medium, and further, the life of the recording medium is limited when stress, such as thermal stress, or the like is applied to the substrate of the recording medium, which eventually makes it difficult to stably store information for a very long period of time.

If the label surface is not formed on the recording medium, such as CD and DVD, to solve the above problem, it is difficult to identify the front surface and the back surface of the recording medium. If the recording medium is set in an incorrect direction in the read out apparatus, the read out direction specified for the read out apparatus does not match with the arrangement direction of the information recorded on the recording medium, and information cannot be correctly read out.

One problem in the case when a mark to indicate the insertion direction is printed, such as the case of an optical card, this mark may wear off depending on the storage environment when this medium is stored for a long period of time, and this makes it difficult to recognize the insertion direction of the optical card.

With the foregoing in view, it is an object of the present invention to provide a data storage medium and a manufacturing method thereof, a data storage medium, a data read out apparatus, and a data read out method, which allow to easily fabricate a reproduction of a backup, having durability against changes in the storage environment even after the information is recorded and stored. It is another object of the present invention to provide a data storage medium and a manufacturing method thereof, a data storage medium, a data read out apparatus, and a data read out method which allow to easily recognize the read out direction of the recorded information, even if the information is stored for a very long time.

Solution to Problem

To solve the above problem, an aspect of the present invention provides a data storage medium in which data is stored, the medium including: a substrate constituted by quartz, and having a first surface and a second surface facing the first surface; and a convexoconcave structure formed in a storage area which is set on the first surface of the substrate. The storage area includes a plurality of unit storage areas which are arrayed at least in one direction, and non-data storage areas which are disposed between the unit storage areas which are adjacent to each other. The convexoconcave structure includes a plurality of unit data patterns which indicate data content of a plurality of unit data acquired by dividing the data, address patterns which indicate respective position information of the plurality of unit storage areas in the storage area, and boundary patterns which indicate the boundary of the unit storage areas which are adjacent to each other. Each of the plurality of unit data patterns is formed in each of the plurality of unit storage areas in an array sequence of the plurality of unit storage areas, and the address patterns are formed in the non-data storage areas so as to correspond to the plurality of unit storage areas respectively, in which the plurality of unit data patterns are formed respectively.

At least the data patterns may be disposed so as to overlap with an intersection of virtual grids when the vertical grid is set in the storage area, and the data pattern and the address pattern may have substantially the same dimensions.

In the storage area, the plurality of unit storage areas are arrayed in a matrix of M rows×N columns (one of M and N is 2 or greater integer, the other is 1 or greater integer), and the address pattern is constituted by a convexoconcave structure which indicates an arrayed position of each unit storage area in the pth row (p is an integer of $1 \le p \le M$), and the qth column (q is an integer of $1 \le q \le N$).

An aspect of the present invention provides a data storage medium in which data is stored, the medium including: a substrate constituted by quartz, and having a first surface and a second surface facing the first surface; a data pattern which is formed in a rectangular storage area defined on the first surface of the substrate, and expresses a data bit string of the data by a physical structure corresponding to each bit of the data bit string; and an arrangement direction index mark which is disposed on the first surface of the substrate so as to correspond to the storage area, and indicates information on an arrangement direction of the data bit string expressed by the physical structure of the data pattern formed in the storage area. The arrangement direction index mark is disposed in a position which enables specifying the arrangement direction of the data bit string expressed by the physical structure of the data pattern.

A plurality of storage areas disposed in a matrix may be defined on the first surface of the transparent substrate. In each of the plurality of storage areas, a unit data pattern, which expresses each data bit string of a plurality of unit data acquired by dividing the data, by using a unit physical structure corresponding to each bit of the data bit string, is formed. The arrangement direction index mark may correspond to each of the plurality of storage areas, and is disposed in a position which enables specifying an arrangement direction of the data bit string of the unit data expressed by the unit physical structure of the unit data pattern, which is formed in each of the plurality of storage areas.

The arrangement direction index mark may be disposed in a position where an overall shape of the storage area and the arrangement direction mark is not symmetric, or the arrangement direction index mark may be disposed in an area outside the storage area, or may be disposed inside the storage area.

The physical structure may be constituted by a concave portion or a convex portion corresponding to each bit of the data bit string, and the arrangement direction index mark may be constituted by a concave portion or a convex portion. The physical structure may be constituted by a through hole or a non-hole portion corresponding to each bit of the data bit string, and the arrangement direction index mark may be constituted by a through hole or a non-hole portion.

An aspect of the present invention provides a data storage medium in which data is stored, including: a substrate constituted by quartz, and having a first surface and a second surface facing the first surface; and a convexoconcave structure formed in a storage area which is set on the first surface of the substrate. The storage area includes a plurality of unit storage areas which are arranged at least in one direction, and non-data storage areas which are disposed between the unit storage areas which are adjacent to each other. The convexoconcave structure includes: a data pattern which is formed in a data area in the unit storage area and expresses data content of the data; a dummy pattern which is formed in a dummy area, which is an area other than the data area in the unit storage area; and a discernment pattern which is formed in the unit storage area so as to discern the boundary between the data pattern and the dummy pattern. Each of the data pattern and the dummy pattern is formed in the data area and the dummy area so that an area density of the convexoconcave structure in the storage area becomes substantially uniform.

The data pattern and the dummy pattern may have substantially the same shapes and dimensions, and the discernment pattern may have a shape and dimensions which are different from those of the data pattern and the dummy pattern.

An aspect of the present invention provides a data storage medium which is used for storing data, the medium including a substrate constituted by quartz, which has a first surface and a second surface facing the first surface. A storage area, in which a plurality of unit storage areas are arrayed, is set on the first surface of the substrate. The storage area includes a plurality of unit storage areas which are arrayed at least in one direction, and non-data storage areas which are disposed between the unit storage areas which are adjacent to each other. Each of the plurality of unit storage areas is an area in which each of the plurality of unit data patterns, indicating data content of unit data, acquired by dividing the data content of the data into a plurality of data, is to be formed. In the non-data storage area, address patterns which indicate respective position information of the unit storage areas in the storage area are formed so as to correspond to the plurality of unit storage areas respectively, and boundary patterns which indicate the boundary of the unit storage areas adjacent to each other, are formed. The address patterns and the boundary patterns are both constituted by convexoconcave structures.

In the storage area, the plurality of unit storage areas may be arrayed in an M rows×N columns matrix (one of M and N is 2 or greater integer, and the other is 1 or greater integer), and the address pattern may be constituted by a convexoconcave structure which indicates an arrayed position of each unit storage area in the pth row (p is an integer of $1 \leq p \leq M$) and the qth column (q is an integer of $1 \leq q \leq N$).

An aspect of the present invention provides a manufacturing method for the data storage medium, the method including: setting a virtual grid in an area corresponding to a storage area of the data storage medium, on a first surface side of a data storage medium substrate constituted by quartz and having a first surface and a second surface facing the first surface; forming a resist pattern, corresponding to the data pattern which indicates data content of the data stored in the data storage medium, on an intersection of the virtual grids in an area corresponding to each of the unit storage areas of the data storage medium; forming resist patterns corresponding to the address pattern and the boundary pattern respectively in an area corresponding to the non-data storage area of the data storage medium; and etching the first surface of the data storage medium substrate using the resist pattern as a mask.

The resist patterns corresponding to the data pattern and the address pattern respectively may be formed to have substantially the same dimensions. The data storage medium substrate may have a hard mask layer on the first surface, so that the resist pattern is formed on the hard mask layer, a hard mask pattern is formed by etching the hard mask layer using the resist pattern as a mask, and the first surface of the data storage medium substrate is etched using the hard mask pattern as a mask.

An aspect of the present invention provides a manufacturing method for a data storage medium in which data is stored, the method including: a pattern data generation step of generating pattern data, which is used for forming a convexoconcave structure on a first surface side of a data storage medium substrate constituted by quartz and having a first surface and a second surface facing the first surface; and a convexoconcave structure formation step of forming the convexoconcave structure on the first surface of the data storage medium substrate based on the pattern data. The convexoconcave structure includes: a data convexoconcave structure which is formed in a data area in a storage area defined on the first surface side of the data storage medium substrate and expresses the data content of the data; and a dummy convexoconcave structure which is formed in a dummy area, which is an area other than the data area in the storage area. The pattern data generation step includes a first step of generating a first pattern data corresponding to the data convexoconcave structure, and a second step of generating the pattern data by adding a second pattern data corresponding to the dummy convexoconcave structure to the first pattern data, and in the second step, the second pattern data is added to the first pattern data, so that an area density of the convexoconcave structure in the storage area becomes substantially uniform based on the first pattern data.

In the pattern data generation step, a pattern data generation area corresponding to the storage area may be set. In the first step, the first pattern data may be generated by disposing a first graphic cell corresponding to the data convexoconcave structure in the pattern data generation area. The second step may include: a step of extracting, as a first pattern data generation area, an area, in which the first graphic cell is disposed, in the pattern data generation area, based on the first pattern data; a step of extracting, as a second pattern data generation area corresponding to the dummy area, an area other than the first pattern data generation area; and a step of generating the second pattern data by disposing a second graphic cell corresponding to the dummy convexoconcave structure in the second pattern data generation area.

The storage area may include a plurality of unit storage areas arranged in a matrix. The data convexoconcave structure may be constituted by a plurality of unit data convexoconcave structures which express respective data content of a plurality of unit data acquired by dividing the data. A plurality of unit pattern data generation areas, corresponding to the plurality of unit storage areas respectively, may be set in the pattern data generation step. In the first step, the first pattern data is generated by disposing the first graphic cell corresponding to each of the unit data convexoconcave structures in each of the plurality of unit pattern data generation areas in the sequence of the matrix arrangement of the unit pattern data generation areas. The second step may include: a step of extracting, as a first pattern data generation area, an area, in which the first graphic cell is disposed, in each of the plurality of unit pattern data generation areas, based on the first pattern data; a step of extracting, as a second pattern data generation area corresponding to the dummy area, an area other than the first pattern data generation area; and a step of generating the second pattern data by disposing the second graphic cell corresponding to the dummy convexoconcave structure in the second pattern data generation area.

In the step of generating a second pattern data, a ratio of a total area of the first graphic cell with respect to a total area of the first pattern data generation area in which the first graphic cell is disposed may be calculated based on the first pattern data, and the second pattern data may be generated by disposing the second graphic cell in the second pattern data generation area at substantially the same area ratio as the ratio of the total area of the first graphic cell.

In the step of generating the second pattern data, the unit pattern data generation area located around the second pattern data generation area may be extracted based on the first pattern data, so that a ratio of a total area of the first graphic cell, with respect to a total area of the extracted unit pattern data generation area, is calculated, and the second pattern data may be generated by disposing the second graphic cell in the second pattern data generation area at substantially the same area ratio as the ratio of the total area of the first graphic cell.

In the step of generating the second pattern data, a gradient of the ratio of the total area of the first graphic cell in the unit pattern data generation area may be calculated from the ratio of the total area of the first graphic cell in the unit pattern data generation area located around the second pattern data generation area, and the second pattern data may be generated by disposing the second graphic cell in the second pattern data generation area based on the gradient of the ratio of the total area of the first graphic cell.

The convexoconcave structure may further include a determination convexoconcave structure for determining a boundary between the data convexoconcave structure and the dummy convexoconcave structure. The pattern data generation step may further include a step of adding a third pattern data corresponding to the determination convexoconcave structure to the first pattern data generated in the first step. In the second step, the second pattern data may be added to the first pattern data, to which the third pattern data has been added. The data convexoconcave structure and the dummy convexoconcave structure may have substantially the same dimensions.

An aspect of the present invention provides a data read out apparatus reading out data stored in the data storage medium, the apparatus including: an image data acquisition unit configured to acquire a plurality of image data including the plurality of unit storage areas and the address pattern which indicates position information of each of the plurality of unit storage areas; a data read out unit configured to read out the unit data from the image data, based on the unit data pattern which is formed in each of the plurality of unit storage areas; a position information read out unit configured to read out the position information of each of the unit storage areas from the image data, based on the address pattern formed in the non-data storage area; a storage unit configured to store in association with each other the unit data read out by the data read out unit and the position information of the unit storage area; and data restoration unit configured to restore the data based on the plurality of unit data which has been read out by the data read out unit.

The data read out apparatus may further include: a determination unit configured to determine whether reading of the unit data is possible or not from the image data acquired by the image data acquisition unit, based on the unit data pattern formed in the unit storage area; and an error data generation unit configured to generate error data when the determination unit determines that reading of the unit data is impossible. The data read out unit reads out the unit data, based on the unit data pattern when the determination unit determines that reading of the unit data is possible, and the storage unit stores in association with each other the unit data which has been read out by the data read out unit and the corresponding position information of the unit storage area, or stores in association with each other the error data generated by the error data generation unit and the position information of the unit storage area.

When the error data generated by the error data generation unit is stored in the storage unit, the image data acquisition unit may acquire, based on the position information of the unit storage area stored in the storage unit in association with the error data, image data including the unit storage area, which is specified by the address pattern indicating position information that is the same as the position information in a reproduction of the data storage medium.

An aspect of the present invention provides a data read out apparatus reading out data stored in the data storage medium, the apparatus including: a medium mounting unit on which the data storage medium is mounted; an image data acquisition unit configured to acquire image data of an area which includes the storage area of the data storage medium mounted on the medium mounting unit; an extraction direction determination unit configured to determine a direction to extract a physical structure of the data pattern formed in the storage area from the image data acquired by the image data acquisition unit; and a data read out unit configured to extract the physical structure from the image data in accordance with the extraction direction of the physical structure determined by the extraction direction determination unit, and read the data from the physical structure. The extraction direction determination unit recognizes the arrangement direction index mark from the image data acquired by the image data acquisition unit, and determines the extraction direction of the physical structure, based on the positional relationship of the arrangement direction index mark with respect to the storage area.

The image data acquisition unit may acquire image data by which the arrangement direction index mark and the data pattern formed in the storage area can be recognized. The image data acquisition unit may acquire first image data by which the arrangement direction index mark can be recognized but the data pattern cannot be recognized, and second image data by which the physical structure of the data pattern can be recognized. The extraction direction determination unit may determine the extraction direction of the physical structure, based on the first image data. The image data acquisition unit may acquire the second image data to display the physical structure of the data pattern at a normal position based on the extraction direction determined by the extraction direction determination unit. The data read out unit may read out the physical structure based on the second image data.

An aspect of the present invention provides a data read out apparatus reading out data stored in the data storage medium, the apparatus including: an image data acquisition unit configured to acquire image data which includes the storage area; and a data read out unit configured to extract the data convexoconcave structure out of the convexoconcave structure formed in the storage area, from the image data, and read out the data, based on the extracted data convexoconcave structure.

The convexoconcave structure formed in the storage area of the data storage medium may further include a determination convexoconcave structure for determining the boundary between the data convexoconcave structure and the dummy convexoconcave structure. The data read out unit may extract the data convexoconcave structure, out of the convexoconcave structure, from the image data using the determination convexoconcave structure as an index.

An aspect of the present invention provides a data read out method of reading out data stored in the data storage medium, the method including: a step of acquiring a plurality of image data including the plurality of unit storage areas and the address pattern which indicates position information of each of the unit storage areas; a step of reading out the unit data from the image data, based on the unit data pattern formed in each of the plurality of unit storage areas; a step of reading out the position information of each of the unit storage areas from the image data, based on the address pattern formed in the non-data storage area; a step of storing in association with each other the unit data and the position information of the unit storage area; and a step of restoring the data, based on the plurality of unit data.

The data read out method may further include: a step of determining whether reading of the unit data is possible or not from the image data, based on the unit data pattern formed in the unit storage area, and a step of generating error data when the reading of the unit data is determined impossible. In the step of reading the unit data, the unit data may be read out based on the unit data pattern when reading of the unit data is determined possible. In the step of storing, the unit data and the corresponding position information of the unit storage area, or the error data and the position information of the unit storage area, may be associated with each other and stored.

When an error data is stored, the data read out method may further include a step of acquiring, based on the position information of the unit storage area stored in association with the error data, image data including the unit storage area, which is specified by the address pattern indicating position information that is the same as the position information in a reproduction of the data storage medium.

An aspect of the present invention provides a data read out method of reading data stored in the data storage medium, the method including: an image data acquisition step of acquiring image data in an area including the storage area of the data storage medium; an extraction direction determination step of determining a direction of extracting a physical structure of the data pattern formed in the storage area, from the image data; and a data read out step of extracting the physical structure from the image data in accordance with the extraction direction of the physical structure determined in the extraction direction determination step, and reading the data from the physical structure. In the extraction direction determination step, the arrangement direction index mark is recognized from the image data, and the extraction direction of the physical structure is determined based on a positional relationship of the arrangement direction index mark with respect to the storage area.

In the image data acquisition step, the image data by which the arrangement direction index mark and the data pattern formed in the storage area can be recognized, may be acquired. The image data acquisition step may be a first image data acquisition step of acquiring first image data by which the arrangement direction index mark can be recognized but the data pattern cannot be recognized. The extraction direction of the physical structure may be determined based on the first image data in the extraction direction determination step. A second image data acquisition step of acquiring second image data by which the physical structure of the data pattern is displayed at a normal position based on the determined extraction direction, and by which the physical structure of the data pattern can be recognized, may be further included. In the data read out step, the physical structure may be read out based on the second image data.

An aspect of the present invention provides a data read out method of reading out the data stored in the data storage medium, the method including: an image data acquisition step of acquiring image data including the storage area; and a data read out step of extracting the data convexoconcave structure out of the convexoconcave structure formed in the storage area, from the image data, and reading out the data, based on the extracted data convexoconcave structure.

The convexoconcave structure formed in the storage area of the data storage medium may further include a determination convexoconcave structure for determining the boundary between the data convexoconcave structure and the dummy convexoconcave structure, and in the data read out step, the data convexoconcave structure, out of the convexoconcave structure, may be extracted from the image data, using the determination convexoconcave structure as an index.

Advantageous Effects of Invention

The present invention can provide a data storage medium and a manufacturing method thereof, a data storage medium, a data read out apparatus and a data read out method, which allow to easily fabricate a reproduction as a backup having a durability against the change in storage environment even after the information is recorded and stored, and allow to easily recognize the read out direction of the recorded information, even if the information is stored for a very long time.

DESCRIPTION OF EMBODIMENTS

Figure 1:
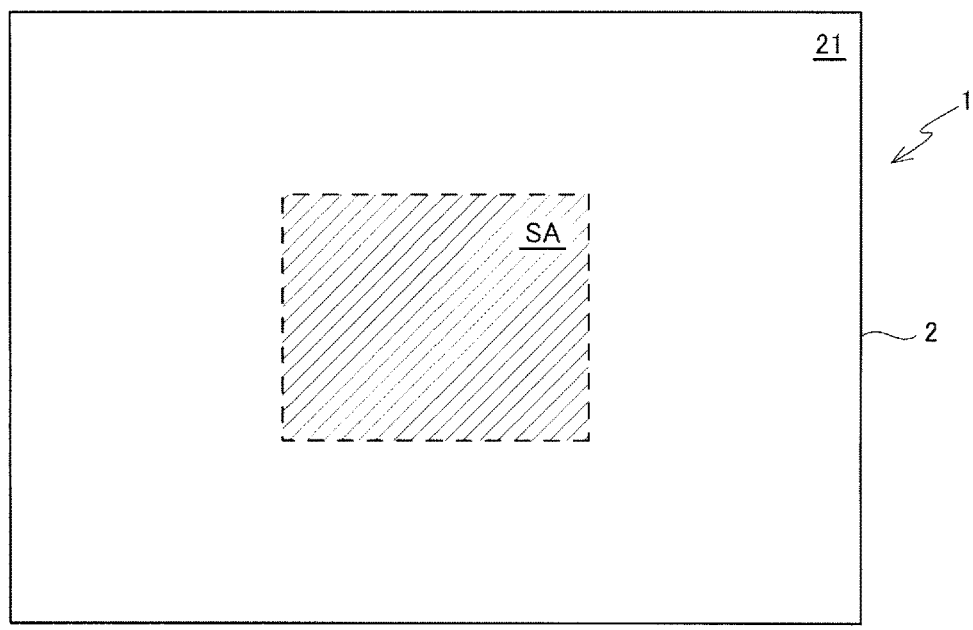
FIG. 1 is a plan view depicting a general configuration of a data storage medium according to Embodiments 1 to 3 of this invention.

Embodiments of this invention will be described with reference to the drawings. In the drawings accompanying this description, the shape, scale, ratio of the vertical and horizontal dimensions and the like of each component may be changed or overemphasized compared with the actual component in order to facilitate easier understanding.

In this description, the numerical range expressed by using "to" is a range that includes the numerical values before and after "to" as the lower limit value and the upper limit value.

In this description, such terms as "film", "sheet" and "plate" are not clearly distinguishable. For example, "plate" is a concept which includes components which are generally called a "sheet" or a "film".

Embodiment 1

[Data Storage Medium]

Figure 2:
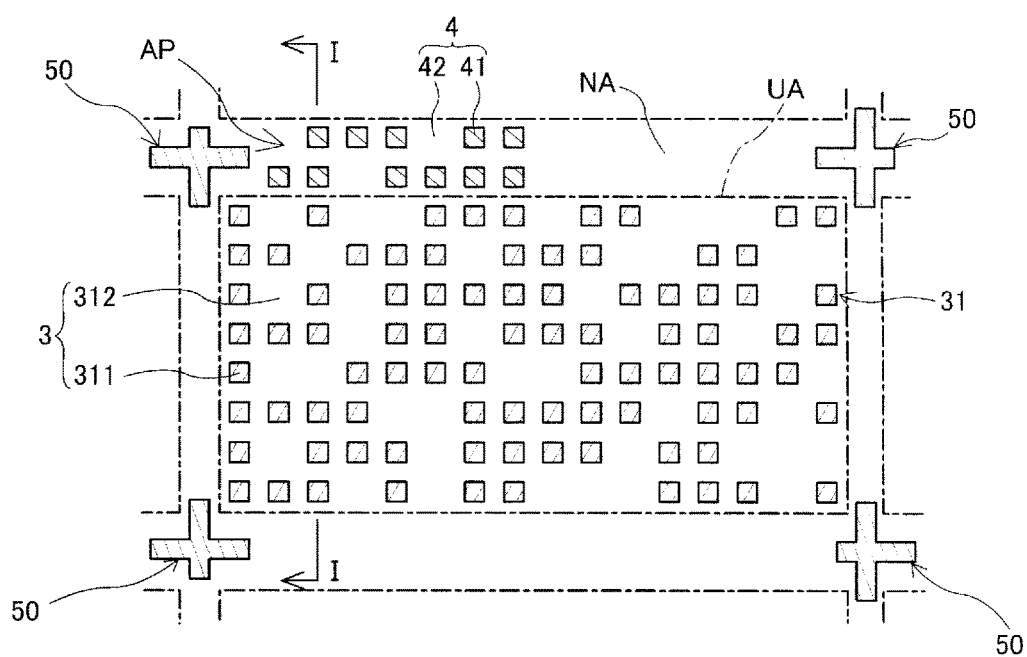
FIG. 2 is a plan view depicting a general configuration of a unit storage area according to Embodiment 1 of this invention.
Figure 3:
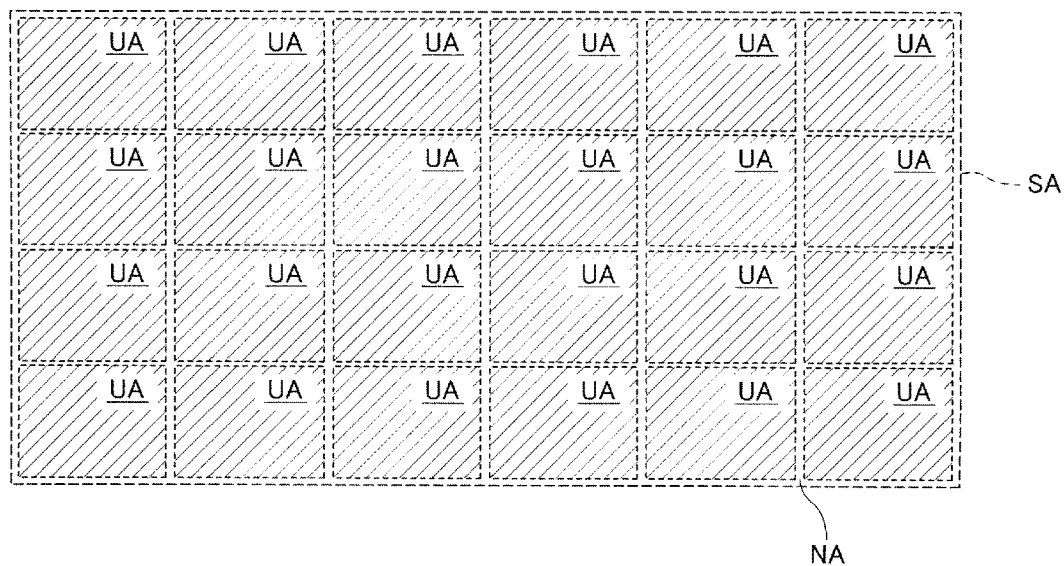
FIG. 3 is a plan view depicting a storage area according to Embodiment 1 and Embodiment 2 of this invention.
Figure 4:
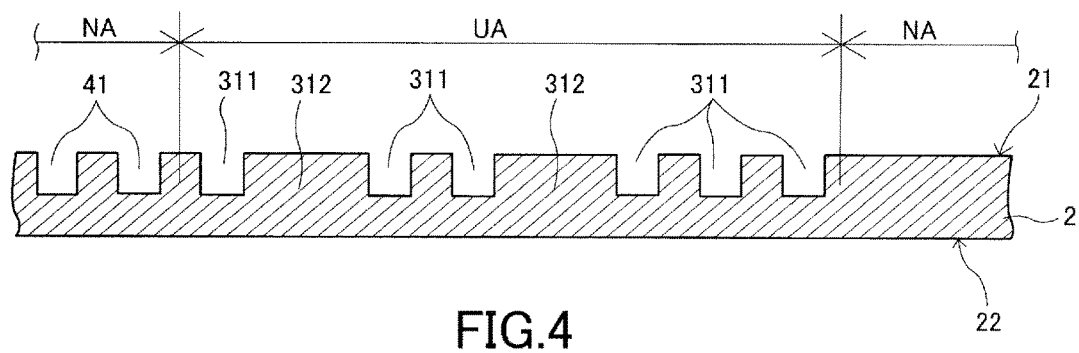
FIG. 4 is an enlarged partial cross-sectional end view of the data storage medium according to Embodiment 1 of this invention, and is a cross-sectional end view sectioned at the I-I line in FIG. 2.

FIG. 1 is a plan view depicting a general configuration of a data storage medium according to Embodiment 1, FIG. 2 is a plan view depicting a general configuration of a unit storage area according to Embodiment 1, FIG. 3 is a plan view depicting a storage area according to Embodiment 1, and FIG. 4 is an enlarged partial cross-sectional end view of the data storage medium according to Embodiment 1, and is a cross-sectional end view sectioned at the I-I line in FIG. 2.

The data storage medium 1 according to Embodiment 1 includes an approximately rectangular substrate 2 constituted by quartz glass having a first surface 21 and a second surface 22 facing the first surface 21, and a convexoconcave structure which is formed inside a storage area SA which is set on the first surface 21 of the substrate 2.

In the storage area SA, a plurality of unit storage areas UA are arrayed in an M rows×N columns matrix (one of M and N is 2 or greater integer, the other is 1 or greater integer). As illustrated in FIG. 3, in Embodiment 1, 24 unit storage areas UA are arrayed in a 4 rows (M=4)×6 columns matrix (N=6), but this invention is not limited to this form.

The storage area SA includes a plurality of unit storage areas UA, and the non-data storage areas NA which are positioned like "foot paths between rice fields" between adjacent unit storage areas UA. Each unit storage area UA is an area where a unit data pattern 31 (convexoconcave structure 3) is formed, and the non-data storage area NA is an area where an address pattern AP (convexoconcave structure 4) and a boundary pattern 50 (convexoconcave structure) are formed.

The size of the unit storage area UA is appropriately set in accordance with the size of the area that can be imaged by a later mentioned imaging unit 111. The size of the non-data storage area NA is not especially limited as long as the address pattern AP can be formed, but if the size of the non-data storage area NA is minimized, the ratio of the unit storage area UA in the storage area SA can be increased, thereby the data storage capacity can be increased.

The unit data pattern 31 formed in each unit storage area UA is constituted by concave portions (holes) 311 and convex portions (portions where holes do not exist) 312, which express the data content (unit bit string) of the unit data where data recorded and stored in the data storage medium 1 is divided in to a plurality of data. In Embodiment 1, bit "1" in the unit bit string of this unit data is defined as the concave portion 311, and bit "0" is defined as the convex portion 312. For example, in FIG. 2, the unit data expressed by a unit bit string (unit bit matrix) of "1010011101 . . . " from the upper left corner is recorded and stored in the unit storage area UA of the data storage medium 1. Bit "1" of the unit bit string may be defined as the convex portion 312, and bit "0" thereof may be defined as the concave portion 311.

The type of data that is recorded and stored in the data storage medium 1 is not especially limited, and text data, image data such as a moving image and a still image, and voice data, for example, can be used.

Figure 5:
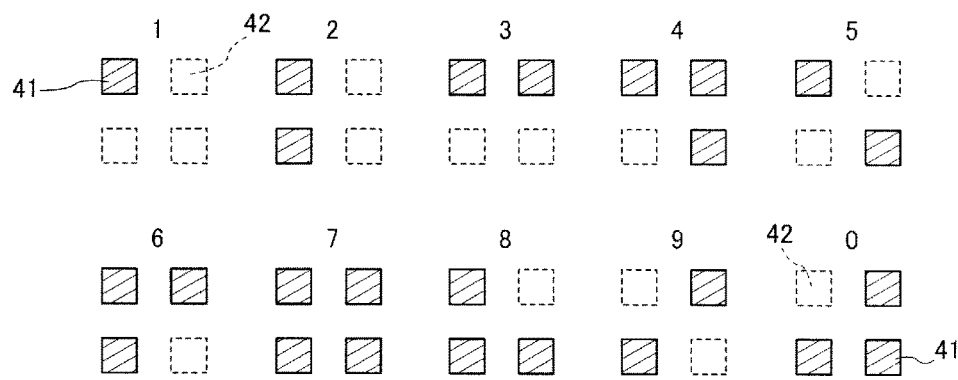
FIG. 5 is a plan view depicting an address pattern indicating the row numbers and the column numbers according to Embodiments 1 to 3 of this invention.

The address pattern AP is constituted by concave portions 41 and convex portions 42 which express position information of each unit storage area UA in the storage area SA. In Embodiment 1, the address pattern AP, which indicates the position information of each unit storage area UA in the storage area SA, is a braille-like pattern expressing the array position of each unit storage area UA as (p, q) by the pth row (p is an integer of $1 \leq p \leq M$), and the qth column (q is an integer of $1 \leq q \leq N$) (see FIG. 5), and this pattern is expressed by the convexoconcave structure 4 (concave portions 41 and convex portions 42). In FIG. 2, the address pattern AP indicates that the unit storage area UA is an area located at the 04th row and 02nd column.

The address pattern AP according to Embodiment 1 may be constituted by a convexoconcave structure 4 (concave portions 41 and convex portions 42) expressing bit strings of binarized row numbers and column numbers similarly to the unit data pattern 31.

The boundary pattern 50 is a pattern indicating the boundary between one unit storage area UA and other adjacent unit storage areas UA which are adjoined via the non-data storage area NA in the row direction and column direction, and is formed so as to be located outside the four corners of each rectangular unit storage area UA. By forming this boundary pattern 50, the imaging unit 111 can easily recognize each unit storage area UA, as mentioned later, and data which is recorded and stored as a plurality of unit data patterns 31 can be accurately read out.

In Embodiment 1, the boundary pattern 50 has an approximately cross-shape, and the length of one pattern 51, out of four patterns 51 to 54 which extend out from the intersection L thereof (length of the pattern in the extending direction from the intersection), is shorter than those of the three other patterns 52 to 54 (see FIG. 6(a)). The boundary pattern 50 having this shape is formed so as to be rotated 90° each time in the array sequence (sequence from the upper left in the horizontal direction in FIG. 3) of the plurality of unit storage areas UA in the storage area SA (see FIG. 7). As mentioned later, when the data recorded and stored in the data storage medium 1 according to Embodiment 1 is read out, the image data in each unit storage area UA is acquired while moving the data storage medium 1 relatively to the imaging unit 111. Therefore the position of the imaging unit 111 is aligned each time the imaging unit 111 is moved, then image data is acquired, but the boundary pattern 50 is rotated 90° each time in the array sequence of the unit storage areas UA, hence the image data can be acquired in the array sequence of the unit storage areas UA while scanning the imaging unit 111.

A plan view of the boundary pattern 50 may be either approximately L-shaped (having two patterns which extend from the reference point Cp in two direction perpendicular to each other) (see FIG. 6(b)), or may be approximately cross-shaped in which four patterns extend out from the reference point Cp, where the lengths of the four patterns (lengths of the patterns from the intersection in the extending direction) are substantially the same (see FIG. 6(c)).

It is preferable that the convexoconcave structures 3 and 4 constituting the unit data pattern 31 and the address pattern AP have substantially the same dimensions and pitches. Since both have substantially the same dimensions and the same pitches, the generation of reproduction errors (transfer errors of the convexoconcave structures 3 and 4), when the later mentioned reproduction 1' of the data storage medium 1 is fabricated, is prevented, and the processing of the image data that is acquired when the data is read out from the data storage medium 1 can be improved.

In Embodiment 1, the concave portions 311 and 41 constituting the unit data pattern 31 and the address pattern AP have approximately a rectangular hole shape in the plan view. The dimensions of the concave portions 311 and 41 can be any dimensions with which a standard imaging element can optically recognize the concave portions 311 and 41, but in order to increase the data capacitance which can be recorded and stored in the data storage medium 1, the dimensions of the concave portion 311 of the unit data pattern 31 may be set to 400 nm or less, preferably around 100 to 250 nm, for example.

Figure 8:
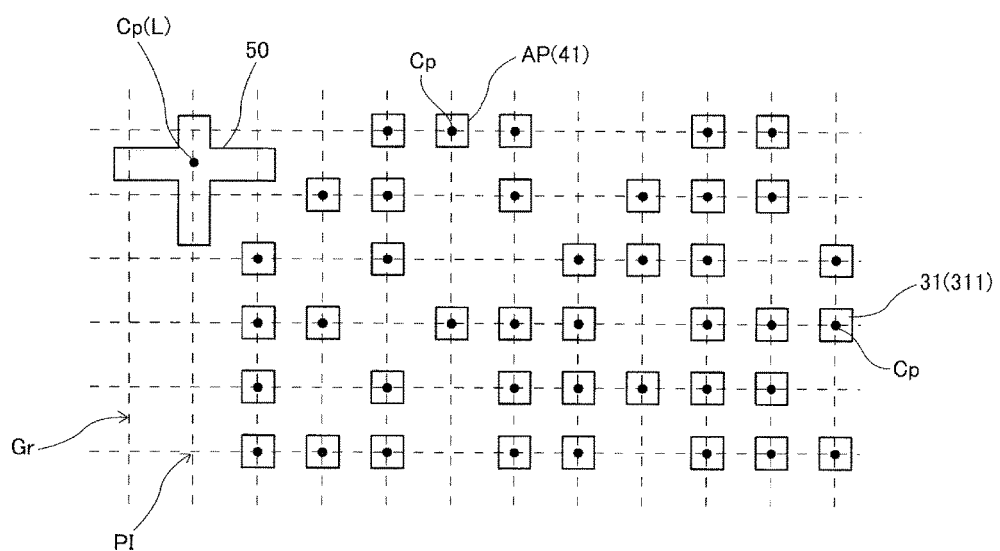
FIG. 8 is a partial plan view depicting an arrangement example of the unit data pattern, the address pattern and the boundary pattern according to Embodiment 1 of this invention.

As illustrated in FIG. 8, both the unit data pattern 31 and the address pattern AP are formed so as to overlap with the intersections PI of the virtual grid Gr which is set in the storage area SA, so that the boundary pattern 50 overlaps with the grid line of the virtual grid Br. In concrete terms, the unit data pattern 31, the address pattern AP, and the boundary pattern 50 are formed so that the reference point Cp of the boundary pattern 50 overlaps with the grid line of the virtual grid Gr, and is also located approximately at the center of the adjacent intersections PI (adjacent intersections PI in the vertical direction in FIG. 8), whereby the respective reference points Cp of the unit data patterns 31 (concave portions 311) and the address pattern AP (concave portion 41) overlap with the intersections PI of the virtual grid Gr. Here in the plan view, the reference points Cp of the unit data pattern 31 and the address pattern AP are the center points of the convexoconcave structures 3 and 4 (concave portions 311 and 41) constituting the unit data pattern 31 and the address pattern AP, and the reference point Cp of the boundary pattern 50 is an intersection L of the approximately cross-shaped pattern. It is sufficient that at least the reference point Cp of the unit data pattern 31 overlaps with the intersection PI of the virtual grid Gr, and the reference points Cp of the address pattern AP and the boundary pattern 50 may overlap with the intersections PI of the virtual grid Gr, or may not overlap with the intersections PI but overlap with the grid lines of the virtual grid Gr, or may overlap neither with the intersections PI of the virtual grid Gr nor the grid lines.

In the data storage medium 1 according to Embodiment 1 having the above configuration, the data content of the recorded and stored data is expressed by the convexoconcave structure 3 (concave portions 311 and convex portions 312) formed in each unit storage area UA of the storage area SA. This data storage medium 1 can be fabricated by processing a substrate constituted by quartz, and has extremely good heat resistance and water resistance. Therefore, even if the storing environment were changed, the recorded and stored data would not be lost, and the data can be stored for a very long time (at the level of several hundred years or more).

In the data storage medium 1 according to Embodiment 1, the data can be recorded and stored by the convexoconcave structure 3 (concave portions 311 and convex portions 312) formed on the first surface 21 of the substrate 2, hence reproduction (backup) of the data storage medium 1, in which this data is recorded and stored, can be easily fabricated by performing imprint lithography processing using this data storage medium 1, even if this source data (digital data) does not exist, as mentioned in detail later.

Further, the data recorded and stored in the data storage medium 1 according to Embodiment 1 is expressed by the convexoconcave structure which can be optically recognized using a standard imaging element, hence even in a very distant future, the data can be easily restored by imaging this convexoconcave structure 3 (concave portions 311 and convex portions 312) using an imaging element that is available at this time in future, and converting the image into bit strings.

Furthermore, in the data storage medium 1 according to Embodiment 1, the address pattern A, which indicates a position in each unit storage area UA in the storage area SA, in which data is recorded and stored as the convexoconcave structure, is formed, hence even in the case of reading a part of the data recorded and stored in the data storage medium 1 (unit data patterns 31 formed in a part of the unit storage areas UA of the plurality of unit storage areas UA), the target data (a part of the data) can be easily read out based on this address pattern AP. Even if a part of the convexoconcave structure 3 (concave portions 311) formed in the unit storage area UA is damaged, the unit storage area UA, where a part of the convexoconcave structure 3 is damaged, can be specified by an address pattern AP. Therefore if a reproduction (backup) of the data storage medium 1 has been fabricated in advance, the data recorded and stored in this unit storage area UA can be easily read out from this reproduction, and when this data is combined with the data read out from the other unit storage areas UA of the data storage medium 1, the data recorded and stored in the data storage medium 1 can be restored.

[Manufacturing Method for Data Storage Medium]

Figure 9:
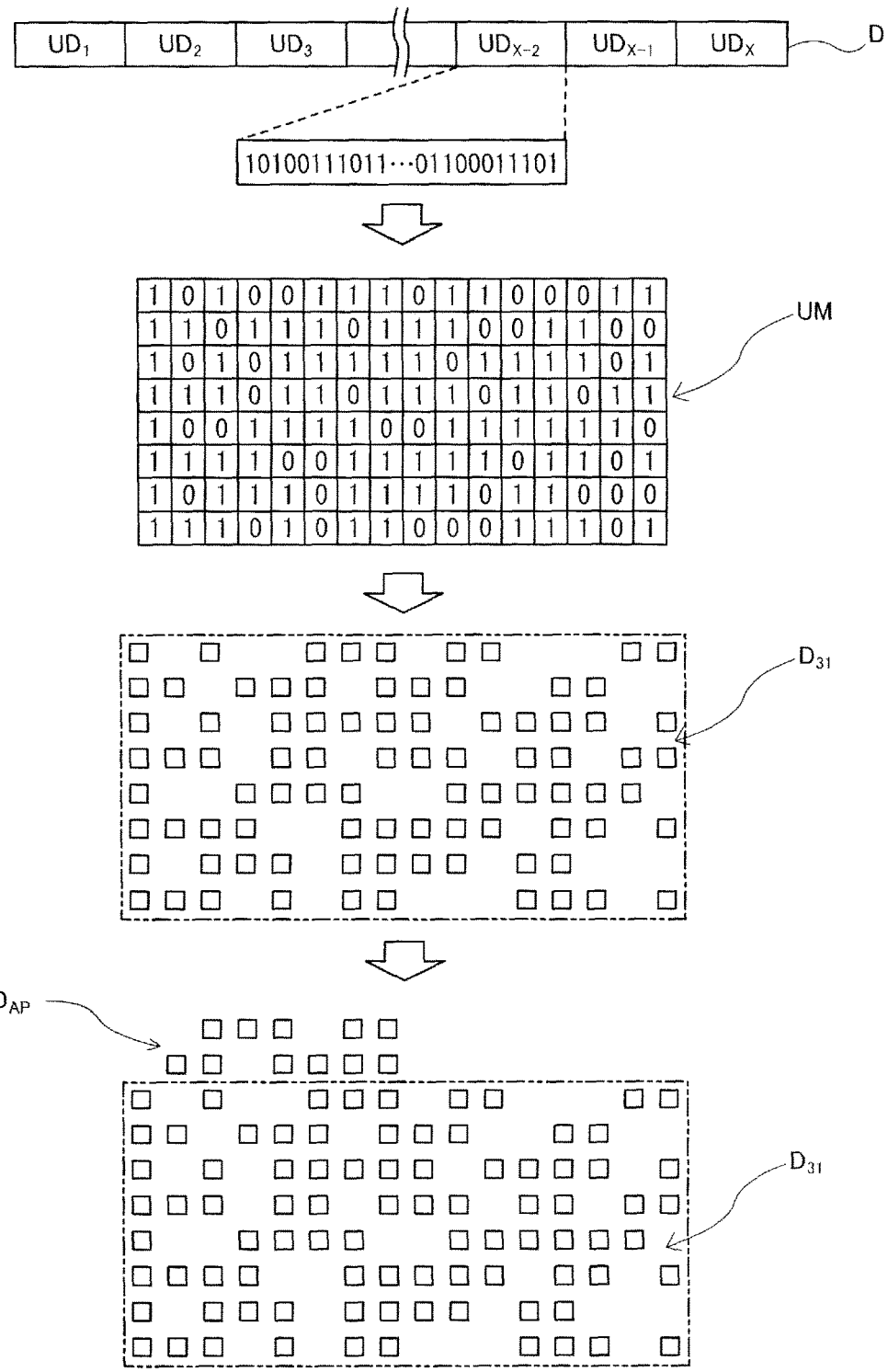
FIG. 9 is a schematic diagram of steps of generating the drawing data according to Embodiment 1 of this invention.
Figure 10:
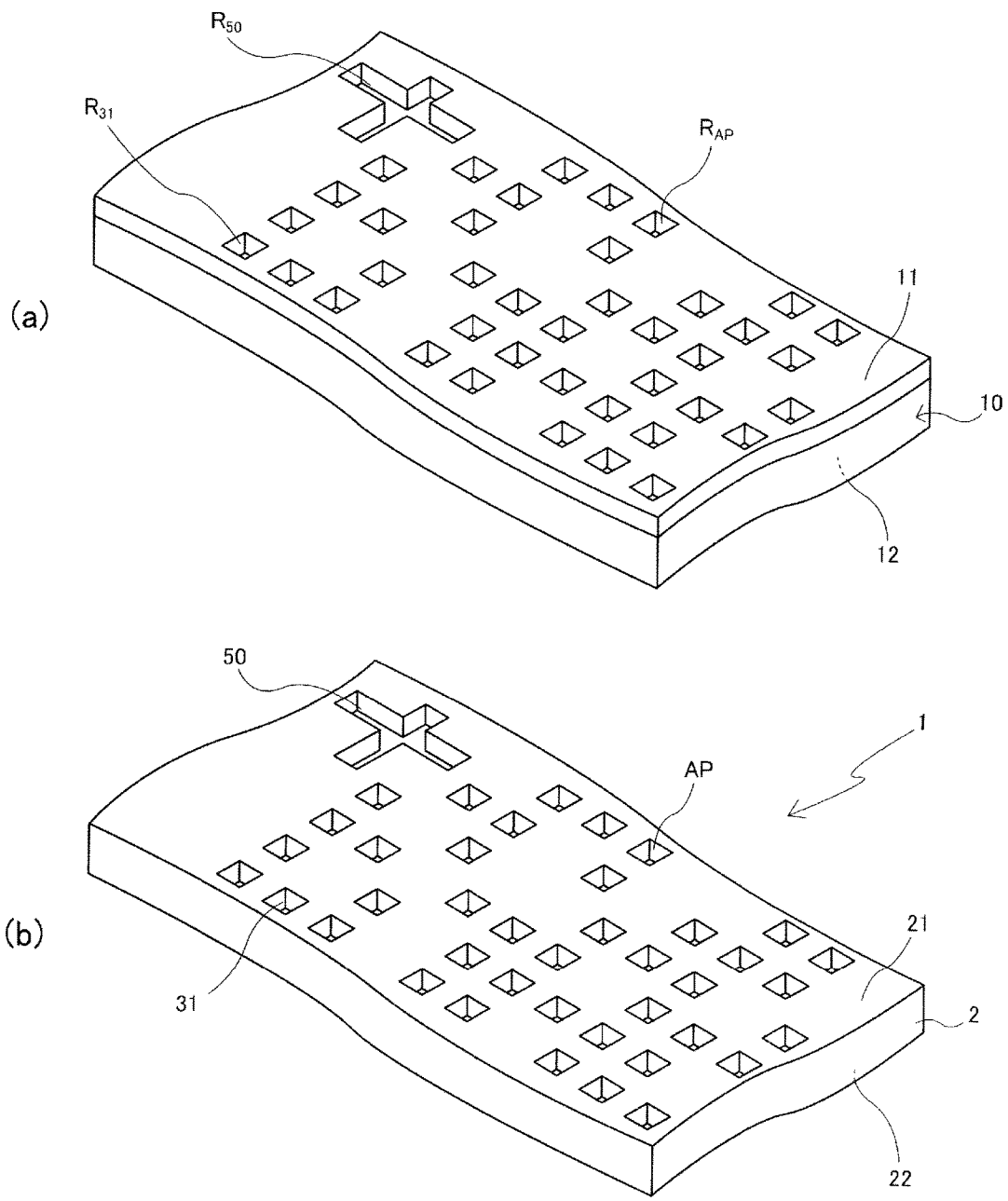
FIG. 10 shows perspective views depicting steps of the manufacturing method for the data storage medium according to Embodiment 1 of this invention.

The data storage medium 1 having the above configuration can be fabricated as follows. FIG. 9 is a flow chart depicting steps of designing the drawing data as a previous stage of fabricating the data storage medium 1 according to Embodiment 1, and FIG. 10 shows cross-sectional views depicting a flow of the steps of fabricating the data storage medium 1 according to Embodiment 1.

[Drawing Data Design Step]

First, the drawing data to form the convexoconcave structures 3 and 4 (the unit data pattern 31 and the address pattern AP) in the storage area SA of the data storage medium 1 is designed based on data D, which is recorded and stored in the data storage medium 1.

In concrete terms, all the bit strings of data D are divided into X number of unit bit strings (X is 2 or greater integer) from the beginning of the data D by predetermined bit length units, so as to generate the unit data $UD_1$ to $UD_x$ which include the unit bit strings. The bit length of the unit bit string of each unit data UD may be set to the same length as the bit length that can be recorded and stored in the unit storage area UA. If data can be stored in each unit storage area UA in an 8 row×16 column bit matrix in Embodiment 1, all the bit strings of the data D to be recorded and stored are divided into 128-bit long unit bit strings of the unit data UD from the beginning of data the D.

Then the unit bit strings of each unit data UD are converted into an 8 rows×16 columns unit bit matrix UM, and the unit pattern data $D_{31}$ is generated based on this unit bit matrix UM. In Embodiment 1, the virtual grid Gr is defined in an area corresponding to the unit storage area UA, and a bit graphic (square graphic) corresponding to the concave portion 311 is disposed only in positions corresponding to bit "1" in the unit bit matrix UM, so as to overlap with the intersections PI of the virtual grid Gr, and the bit graphic is not disposed in positions corresponding to bit "0" (see FIG. 8). This unit pattern data $D_{31}$ expresses 128-bit information constituting the unit bit matrix UM by the presence/absence of the bit graphic in each position constituting the 8 rows×16 columns of the matrix. This unit pattern data $D_{31}$ is used as the drawing data to form the unit data patterns 31 (convexoconcave structure 3) in the unit storage area UA.

The address pattern data $D_{AP}$ is added to the non-data storage area NA of the unit pattern data $D_{31}$. The address pattern data $D_{AP}$ is added according to the array sequence of the unit data UD in the data D to be recorded and stored in the data storage medium 1. This address pattern data $D_{AP}$ is used as the drawing data to form the address pattern AP (convexoconcave structure 4) in the non-data storage area NA.

After generating the unit pattern data $D_{31}$, which is the drawing data of the unit data patterns 31 to be formed in each unit storage area UA and the address pattern data $D_{AP}$, which is the drawing data of the address pattern AP to be formed in the non-data storage area NA, this pattern data is disposed in a matrix, and a predetermined boundary pattern data $D_{50}$ is added to the non-data storage area NA, whereby the drawing data can be generated.

[Data Storage Medium Fabrication Steps]

A data storage medium substrate 10 constituted by quartz, which has a first surface 11 and a second surface 12 facing the first surface 11, is prepared, and the resist patterns $R_{31}$, $R_{AP}$ and $R_{50}$ corresponding to the unit data pattern 31, the address pattern AP and the boundary pattern 50, are formed on the first surface 11 of this substrate 10 (see FIG. 10(a)).

These resist patterns $R_{31}$, $R_{AP}$ and $R_{50}$ can be formed using a known conventional exposure device (e.g. electron beam lithography apparatus, laser lithography apparatus) that is used for semiconductor manufacturing processes or the like. Using this exposure apparatus, a pattern latent image is formed on a resist layer, which is formed on the first surface 11 side of the data storage medium substrate 10, based on the drawing data generated as above, and the development processing is performed, whereby the resist patterns $R_{31}$, $R_{AP}$ and $R_{50}$ can be formed.

The material constituting the resist layer is not especially limited, and a known conventional energy line sensitive resist material (e.g. electron beam sensitive resist material) can be used. In the example depicted in FIG. 10(a), a positive type energy line sensitive resist material is used, hence concave resist patterns $R_{31}$, $R_{AP}$ and $R_{50}$ are formed by developing the resist layer on which the pattern latent image is formed.

After forming the resist patterns $R_{31}$, $R_{AP}$ and $R_{50}$ like this, the first surface 11 of the data storage medium substrate 10 is etched by a wet etching method or a dry etching method using these resist patterns $R_{31}$, $R_{AP}$ and $R_{50}$ as a mask (see FIG. 10(b)), and the remaining resist patterns $R_{31}$, $R_{AP}$ and $R_{50}$ are removed. Thereby the data storage medium 1 according to Embodiment 1, where the unit data pattern 31, the address pattern AP and the boundary pattern 50 are formed on the first surface 21 of the substrate 2, can be fabricated. A data storage medium substrate 10, where a hard mask layer constituted by chromium oxide or the like is formed on the first surface 11 side, may be used. In this case, the hard mask pattern is formed by etching using the resist patterns $R_{31}$, $R_{AP}$ and $R_{50}$ as a mask, the first surface 11 of the data storage medium substrate 10 is etched using this hard mask pattern as a mask, and the hard mask pattern is removed, whereby the data storage medium 1 is fabricated.

Figure 11:
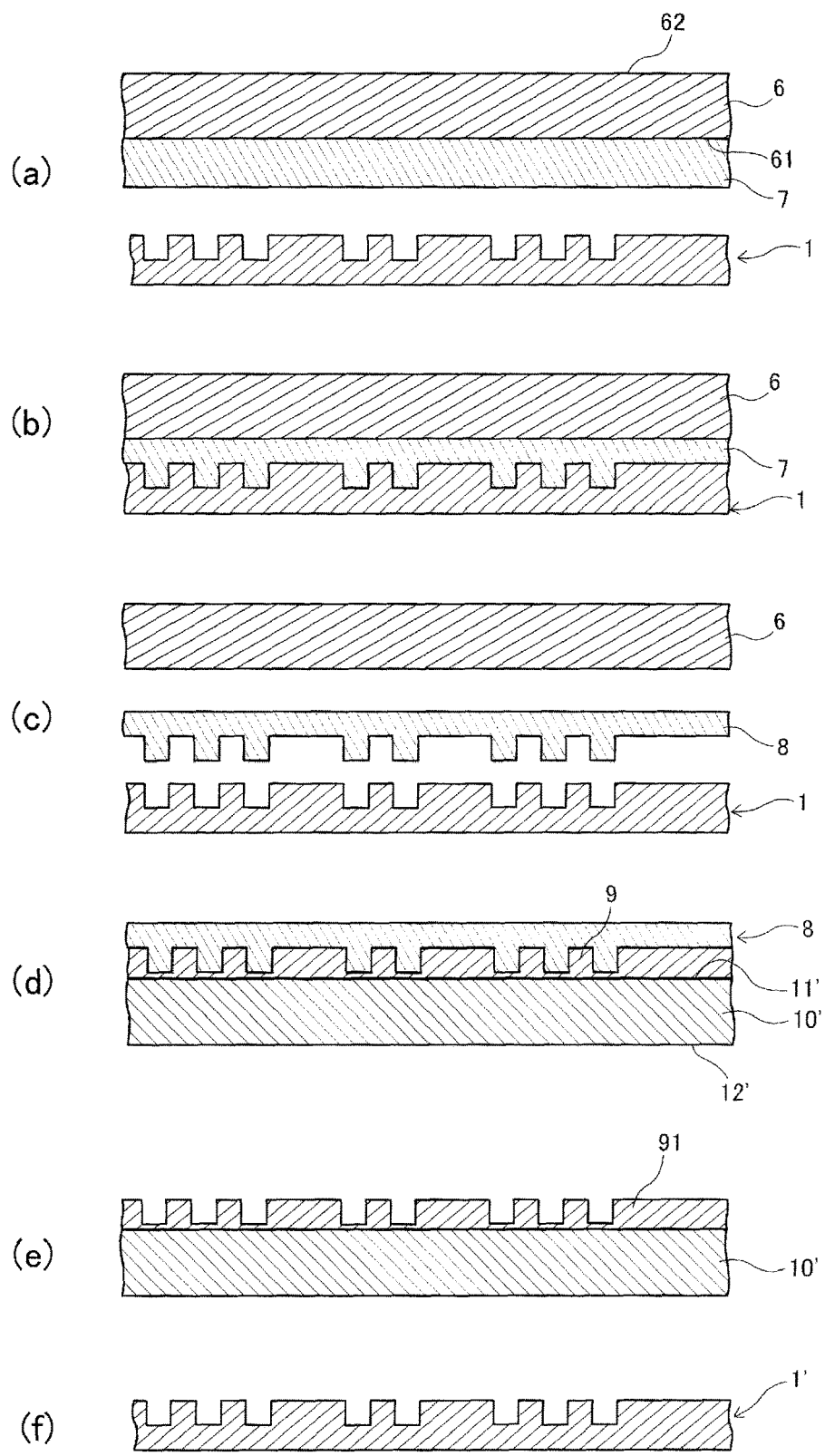
FIG. 11 shows process flow diagrams depicting steps of manufacturing reproduction of the data storage medium according to Embodiments 1 to 3 of this invention.

A method of fabricating a reproduction of the data storage medium 1 fabricated like this will be described. FIG. 11 is a process flow diagram which shows cross-sectional end view of steps of fabricating the reproduction of the data storage medium 1 according to Embodiment 1.

First a data storage medium 1, where the unit data pattern 31, the address pattern AP and the boundary pattern 50 are formed on the first surface 21 of the substrate 2, and a substrate 6 which has a first surface 61 and a second surface 62 facing the first surface 61, and has a resin layer 7 which is disposed on the first surface 61, are prepared (see FIG. 11(a)).

The material constituting the substrate 6 is not especially limited, and a single layer substrate constituted by: such glass substrate as quartz glass substrate, soda glass substrate, fluorite substrate, calcium fluoride substrate, magnesium fluoride substrate, acrylic glass substrate and borosilicate glass substrate; or such resin substrate as polycarbonate substrate, polypropylene substrate, polyethylene substrate and polyolefin substrate may be used, or a multilayer substrate constituted by laminating two or more substrates selected from the above substrates, may be used.

The resin layer 7 is a layer in which the reverse patterns of the unit data pattern 31, the address pattern AP and the boundary pattern 50 of the data storage medium 1 are formed in a later step (see FIG. 11(b)). For the resin material constituting the resin layer 7, such resin material as thermoplastic resin, thermosetting resin and UV curable resin can be used, and in concrete terms, an acrylic resin, styrene resin, olefin resin, polycarbonate resin, polyester resin, epoxy resin and silicone resin or the like can be used.

Then the first surface 21 of the data storage medium 1 is contacted with the resin layer 7 of the substrate 6 to transfer the unit data pattern 31, the address pattern AP and the boundary pattern 50 of the data storage medium 1 to the resin layer 7, so that the reverse patterns thereof are formed (see FIG. 11(b)). After the resin layer 7 is cured, the data storage medium 1 and the substrate 6 are separated from the resin layer 7, whereby a resin mold 8 is fabricated (see FIG. 11(c)). The step in FIG. 11(c) of separating the substrate 6 and the resin layer 7 may be omitted if there are no problems in subsequent steps (FIG. 11(d) to FIG. 11(f)), or if the substrate 6 and the resin layer 7 are strongly contacted and separation thereof is difficult.

Then a reproduction substrate 10' constituted by quartz, which has a first surface 11' and a second surface 12' facing the first surface 11', is prepared, and a resist layer 9 is formed on the first surface 11' of the reproduction substrate 10'. Then the surface on which the reverse pattern is formed on the resin mold 8 is contacted to this resist layer 9, and the resist layer 9 is cured in this state (see FIG. 11(d)).

After the resist layer 9 is cured, the resin mold 8 is separated from the resist layer 9, whereby a resist pattern 91, on which the reverse pattern of the resin mold 8 is transferred, is formed (see FIG. 11(e)). Using this resist pattern 91 as a mask, the first surface 11' of the reproduction substrate 10' is etched. Thereby the reproduction 1' of the data storage medium 1 can be fabricated (see FIG. 11(f)). As long as the curing of the resist layer 9 is not affected, the reproduction substrate 10', where a hard mask layer constituted by chromium oxide or the like is formed on the first surface 11' side, may be used. In this case, the resist pattern 91 is formed on the hard mask layer, a hard mask pattern is formed by etching using the resist pattern 91 as a mask, the first surface 11' of the reproduction substrate 10' is etched using the hard mask pattern as a mask, and then the hard mask pattern is removed, whereby the reproduction 1' of the data storage medium 1 can be fabricated.

As described above, according to Embodiment 1, the data storage medium 1 can be easily fabricated by using a known conventional lithography technique which is used for semiconductor manufacturing processes or the like. Further, a reproduction as a backup of the recorded and stored data, in the case, for example, of damage to the data storage medium 1, can be easily fabricated using a known conventional imprint technique.

[Data Read Out Apparatus, Data Read Out Method]

Figure 12:
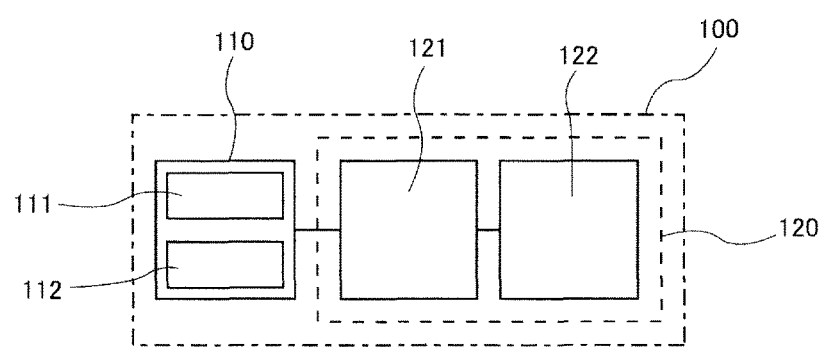
FIG. 12 is a block diagram depicting a general configuration of a data read out apparatus according to Embodiments 1 to 3 of this invention.

A data read out apparatus for reading data recorded and stored in the data storage medium 1 having the above configuration, and a data read out method using this data read out apparatus will be described. FIG. 12 is a block diagram depicting a general configuration of the data read out apparatus according to Embodiment 1.

The data read out apparatus 100 according to Embodiment 1 has: an image data acquisition unit 110 configured to acquire the image data in the storage area SA of the data storage medium 1; and a control device 120 which includes a control unit 121 configured to perform data processing or the like based on this image data, and a storage unit 122 configured to store the image data acquired by the image data acquisition unit 110, various data generated by the control unit 121, and various programs.

The image data acquisition unit 110 includes: an imaging unit 111 configured to capture an image in a predetermined photographing target region, such as a CCD camera, as an image data; and a scanning unit 112 configured to perform scanning processing such that the photographing target area sequentially and relatively moves on each unit storage area UA of the storage area SA of the data storage medium 1 with respect to the imaging unit 111. For this image data acquisition unit 110, a general purpose optical microscope or the like can be used.

The control unit 121 performs computing processing according to the instructions of various programs. In concrete terms, the control unit 121 performs such processing operations as: determining whether the unit data (unit bit string) can be read or not based on the image data of the unit data pattern 31 formed in each unit storage area UA; reading the unit data (unit bit string) based on the image data of the unit data pattern 31; reading the position information of the unit storage area UA based on the image data of the address pattern AP formed in the non-data storage area NA; generating an error data when it is determined that reading of the unit data (unit bit string) is not possible; causing the storage unit 122 to store image data acquired by the image data acquisition unit 110 and the various generated data; and restoring the data recoded and stored in the data storage medium 1 by combining the read unit data (unit bit strings).

The storage unit 122 not only stores image data of the storage area SA (unit storage area UA) acquired by the image data acquisition unit 110, but also: stores the association of the unit data (unit bit string) which is read based on the image data of the unit data pattern 31 formed in the unit storage area UA, and the position information of the unit storage area UA which is read based on the image data of the address pattern AP; and stores the association of the error data generated by the control unit 121 and the position information of the unit storage area UA from which reading of the unit data (unit bit string) was determined impossible. For the control device 120 having such a control unit 121 and storage unit 122, a general purpose computer or the like can be used.

Figure 13:
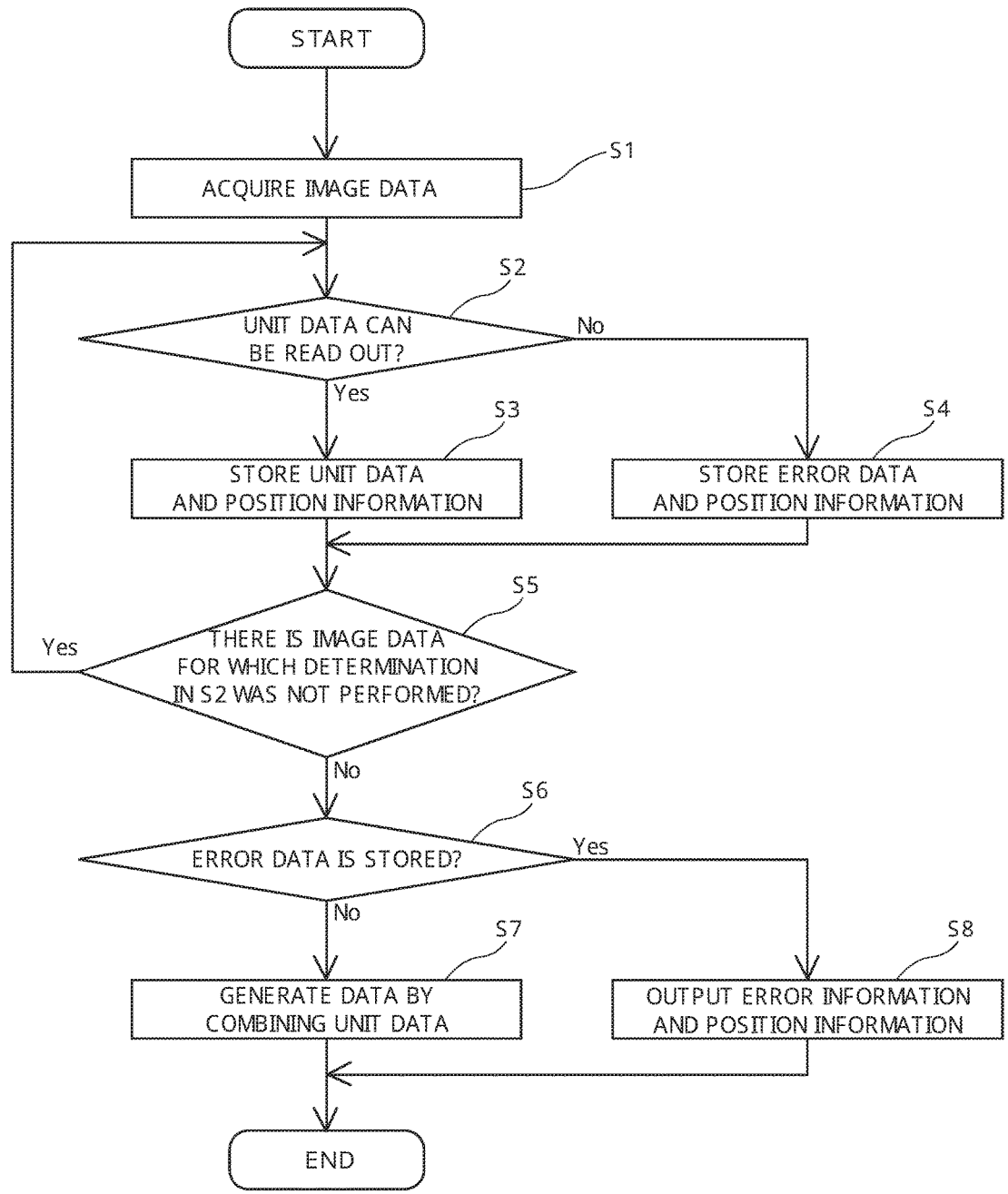
FIG. 13 is a flow chart depicting a data read out method according to Embodiment 1 of this invention.

A method of reading data recorded and stored in the data storage medium 1 using the data read out apparatus 100 having this configuration will be described. FIG. 13 is a flow chart depicting each step of the data read out method according to Embodiment 1.

First, when the data storage medium 1 is set in the image data acquisition unit 110, the image data acquisition unit 110 relatively moves the data storage medium 1 with respect to the imaging unit 111 using the scanning unit 112, and sequentially images each unit storage area UA of the storage area SA of the data storage medium 1 using the imaging unit 111, and acquires the image data which includes images of each unit storage area UA and the address pattern AP corresponding to each unit storage area UA (S1).

The scanning unit 112 of the image data acquisition unit 110 recognizes the boundary pattern 50 of the data storage medium 1, so as to relatively move the data storage medium 1 with respect to the imaging unit 111 such that the unit storage area UA and the corresponding address pattern AP are included in the photographing target area. Thereby an image captured by the imaging unit 111 includes at least one unit storage area UA, the corresponding address pattern AP, and the boundary pattern 50.

Each image data acquired by the image data acquisition unit 110 is stored in the storage unit 122 of the control device 120, and the control unit 121 determines, from each image data, whether the unit data (unit bit string) can be read or not based on the unit data pattern that is formed in the unit storage area UA (S2). In concrete terms, it is determined whether the convexoconcave structure 3 of the unit data pattern 31 formed in the unit storage area UA is damaged or not.

If it is determined that the unit data (unit bit sting) can be read out based on the unit data pattern 31 (YES in S2), in other words, if it is determined that the convexoconcave structure 3 of the unit data pattern 31 is not damaged, then the control unit 121 reads out the unit data (unit bit string) from the image data based on the unit data pattern 31, and reads out the position information of this unit storage area UA based on the address pattern AP, and stores the unit data (unit bit string) in association with the position information in the storage unit 122 (S3).

When the unit data (unit bit string) is read out based on the unit data pattern 31, the control unit 121 defines the virtual grid Gr on the image data which includes the unit storage area UA and the boundary pattern 50. This virtual grid Gr is defined so as to pass through the reference points Cp of the boundary patterns 50, which are located on the four corners of the unit storage area. Then the control unit 121 determines whether a concave portion 311 exists at each intersection PI of the virtual grid Gr in the unit storage area UA. Whether the concave portion 311 exists or not is determined based on the light intensity distribution in the image data, for example.

The control unit 121 sets bit "1" in an intersection PI where it is determined that the concave portion 311 exists, and sets bit "0" in an intersection PI where it is determined that the concave portion 311 does not exist, whereby the unit data (unit bit string) is read out.

When the unit data (unit bit string) is read out based on the unit data pattern 31, the control unit 121 recognizes the boundary pattern 50 located at the upper left of the image data, and starts determining whether the concave portion 311 exists in the right direction from the intersection PI of the virtual grid Gr within the unit storage area UA located at the lower right of the reference point Cp, using the reference point Cp of the boundary pattern 50.

If it is determined that the unit data (unit bit string) cannot be read out based on the unit data pattern 31 (NO in S2), in other words, if it is determined that the convexoconcave structure 3 of the unit data pattern 31 is damaged, then the control unit 121 reads out the position information of this unit storage area UA based on the address pattern AP, and generates error data to indicate that the unit data (unit bit string) cannot be read out, and stores the error data and in association with the position information in the storage unit 122 (S4).

After storing the unit data (unit bit string) in association with the position information in the storage unit 122 (S3), or storing the error data in association with the position information in the storage unit 122 in (S4), the control unit 121 determines whether image data, for which it is not determined whether unit data (unit bit string) can be read out or not, exists in the storage unit 122 (S5), and if this data exists in the storage unit 122 (YES in S5), S2 and subsequent processing operations are performed repeatedly.

If this image data does not exist in the storage unit 122 (NO in S5), on the other hand, the control unit 121 determines whether error data exists in the storage unit 122 (S6), and if error data does not exist in the storage unit 122 (NO in S6), then the control unit 121 generates data (bit string) by combining the unit data (unit bit strings) stored in the storage unit 122 (S7).

When the data (bit string) is generated, the control unit 121 determines the sequence of combining the unit data (unit bit strings) based on the position information which is stored in association with the unit data (unit bit strings). In concrete terms, regarding the row number of the position information as the first priority and the column number as the second priority, the control unit 121 combines the unit data (unit bit strings) in ascending order of rows numbers and column numbers. In this way, the data stored in the data storage medium 1 can be restored.

If the error data exists in the storage unit 122 (YES in S6), on the other hand, the control unit 121 outputs, based on this error data, the information that the unit data (unit bit string) cannot be read out, and the position information of this unit storage area UA (S8). Based on the output of this position information, the unit data (unit bit string) recorded and stored in this unit storage area UA is generated from the reproduction of the data storage medium 1, and this unit data (unit bit string) is combined with the unit data (unit bit strings) stored in the storage unit 122, whereby the data stored in the data storage medium 1 can be restored accurately.

Embodiment 2

[Data Storage Medium]

Figure 15:
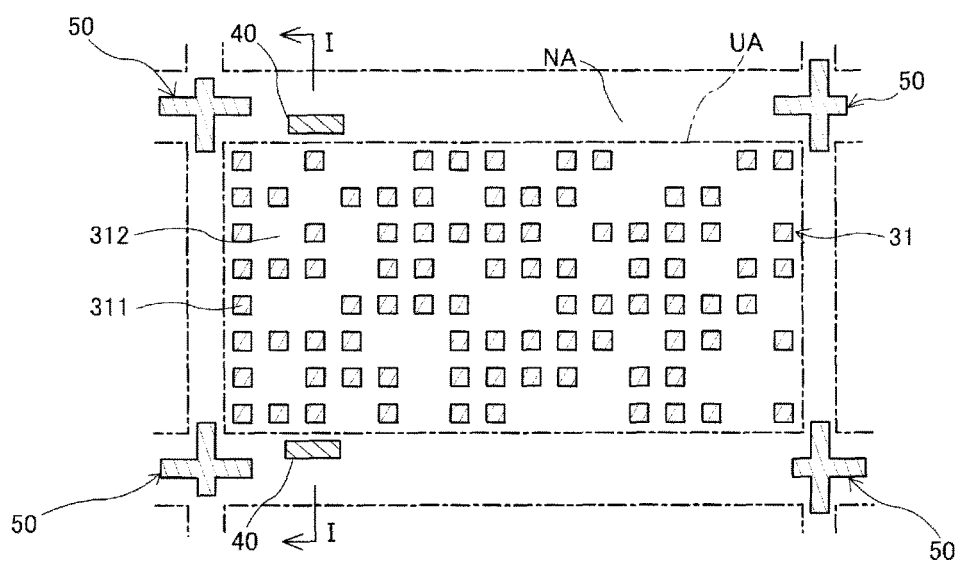
FIG. 15 is a plan view depicting a general configuration of the unit storage area according to Embodiment 2 of this invention.
Figure 16:
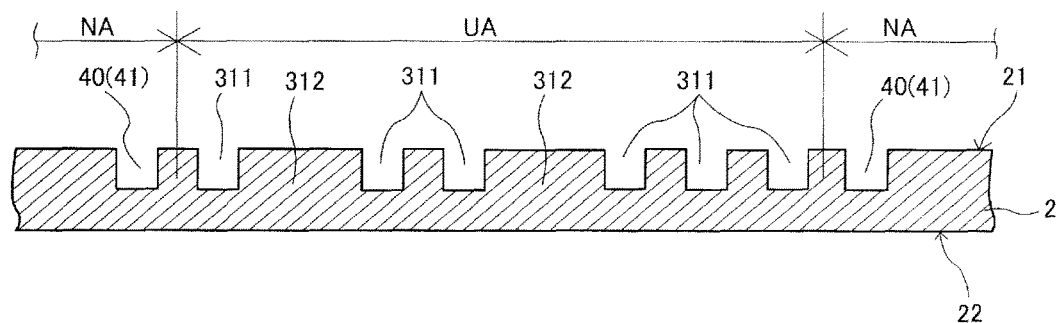
FIG. 16 is an enlarged partial cross-sectional end view of the data storage medium according to Embodiment 2 of this invention, and is a cross-sectional end view sectioned at the I-I line in FIG. 15.

FIG. 1 is a plan view depicting a general configuration of a data storage medium according to Embodiment 2, FIG. 15 is a plan view depicting a general configuration of a unit storage area according to Embodiment 2, FIG. 3 is a plan view depicting a storage area according to Embodiment 2, and FIG. 16 is an enlarged partial cross-sectional end view of the data storage medium according to Embodiment 2, and is a cross-sectional end view sectioned at the I-I line in FIG. 15.

The data storage medium 1 according to Embodiment 2 includes an approximately rectangular substrate 2 constituted by quartz glass having a first surface 21 and a second surface 22 facing the first surface 21, and a data pattern expressing the data content (bit string) of data, stored in an approximately rectangular storage area SA defined on the first surface 21 of the substrate 2, and is formed by a physical structure corresponding to each bit of the data content (bit string) of this stored data.

In the storage area SA, a plurality of unit storage areas UA are arrayed in an M rows×N columns matrix (one of M and N is 2 or greater integer, the other is 1 or greater integer). As illustrated in FIG. 3, in Embodiment 2, 24 unit storage areas UA are arrayed in a 4 rows (M=4)×6 columns matrix (N=6), but this invention is not limited to this form.

The storage area SA includes a plurality of unit storage areas UA, and the non-data storage areas NA which are positioned like "foot paths between rice fields" between adjacent unit storage areas UA. Each unit storage area UA is an area where unit data patterns 31 are formed, and the non-data storage area NA is an area where an arrangement direction index pattern 40 and a boundary pattern 50 are formed.

The size of the unit storage area UA is appropriately set in accordance with the size of the area that can be imaged by a later mentioned imaging unit 111 (the size of the area where the physical structure (concave portions 311 and convex portions 312) of the unit data pattern 31 formed in the unit storage area UA). The size of the non-data storage area NA is not especially limited as long as the arrangement direction index pattern 40 can be formed, but if the size of the non-data storage area NA is minimized, the ratio of the unit storage area UA in the storage areas SA can be increased, thereby the data recording capacity can be increased. In this case, it is preferable that the width $W_{NA}$ of the non-data storage area NA is set such that the width $W_{NA}$ does not match with an integral multiple of the interval of the physical structure (concave portions 311 and convex portions 312) of the unit data pattern 31 in the unit storage area UA. Thereby the non-data storage area NA can be recognized clearly.

The unit data pattern 31 formed in each unit storage area UA is constituted by concave portions (holes) 311 and convex portions (portions where holes do not exist) 312, which express the data content (unit bit strings) of the unit data where data recorded and stored in the data storage medium 1 is divided into a plurality of data. In Embodiment 2, bit "1" in the unit bit string of this unit data is defined as the concave portion 311, and bit "0" is defined as the convex portion 312. For example, in FIG. 15, the unit data expressed by a unit bit string (unit bit matrix) of "1010011101 . . . " from the upper left corner to the right is recorded and stored in the unit storage area UA of the data storage medium 1. Bit "1" of the unit bit string may be defined as the convex portion 312, and bit "0" thereof may be defined as the concave portion 311.

The concave portions 311 and the convex portions 312 of the unit data pattern 31 are arranged in a matrix in the unit storage area UA, and the matrix arrangement of the concave portions 311 and the convex portions 312 are arrangement corresponding to the unit bit matrix when the unit bit string of the unit data is converted into the matrix arrangement.

The type of data recorded and stored in the data storage medium 1 is not especially limited, and text data, image data such as a moving image and still image, and voice data, for example, can be used.

Figure 17:
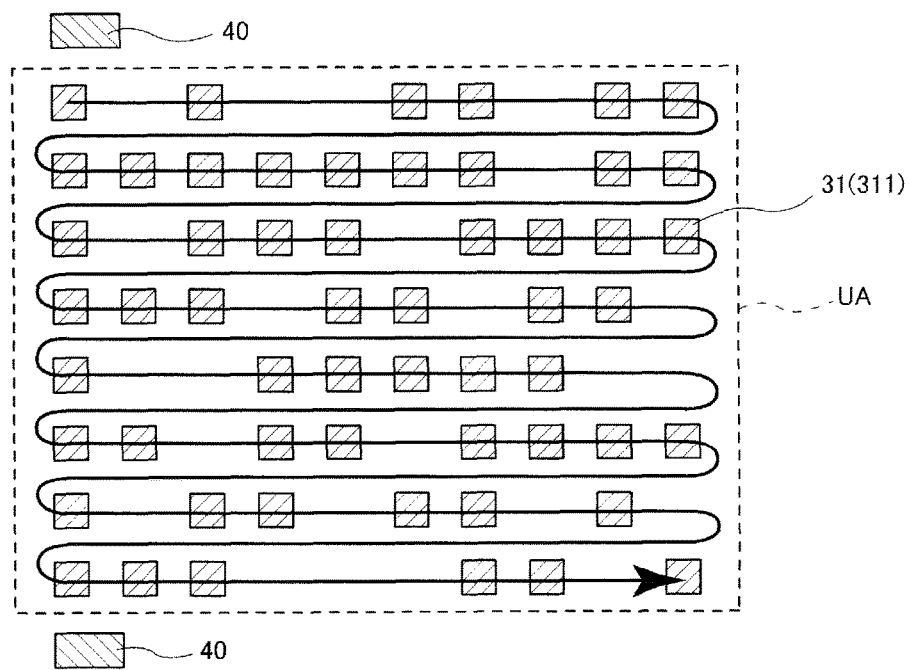
FIG. 17 is a plan view depicting the arrangement direction of the unit data pattern according to Embodiment 2 of this invention.

The arrangement direction index pattern 40 is a pattern to indicate information on the arrangement direction of the unit bit string (unit bit matrix) expressed by the unit data pattern 31 (concave portions 311 and convex portions 312) which is formed in each unit storage area UA. The arrangement direction index pattern 40 is disposed corresponding to each unit storage area UA, and is constituted by a concave portion 41 as a physical structure. The arrangement direction index pattern 40 indicates the information on the matrix arrangement of the unit data patterns 31 (unit bit string of unit data) formed in the unit storage area UA. In the illustrated example, the arrangement direction index pattern 40 is formed near the upper left corner and near the lower left corner of the rectangular unit storage area UA, and when the arrangement direction index patterns 40 are formed in these positions, the data storage medium 1 is in the normal position. Based on this position, the unit data patterns 31 (concave portions 311 and the convex portions 312) are formed in a matrix arrangement (matrix arrangement from upper left to lower right of the unit storage area UA) corresponding to the unit bit string (unit bit matrix). In FIG. 17, the unit data patterns (concave portions 311 and convex portions 312), corresponding to each bit of the unit bit strings of the unit data, are arranged in the arrow direction.

Figure 18:
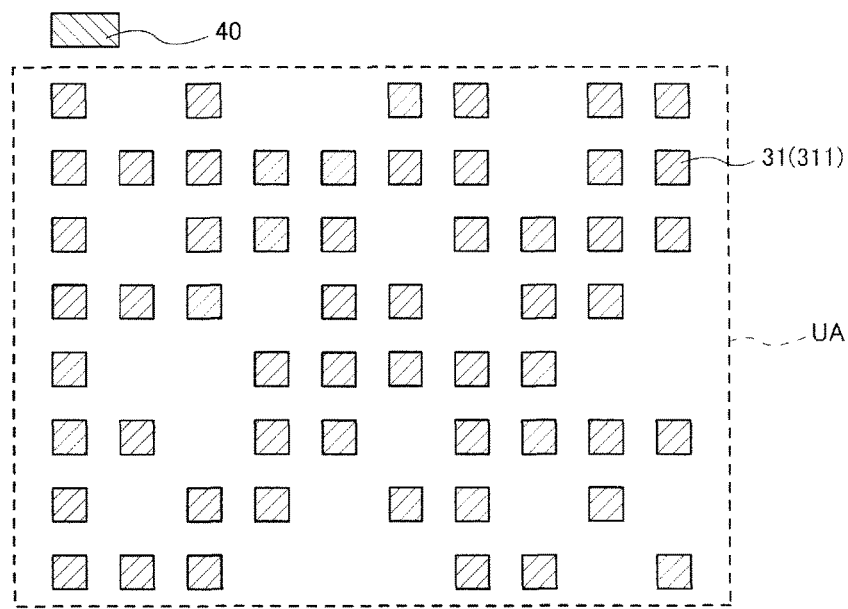
FIG. 18 is a plan view depicting another aspect (No. 1) of the arrangement direction index pattern according to Embodiment 2 of this invention.
Figure 19:
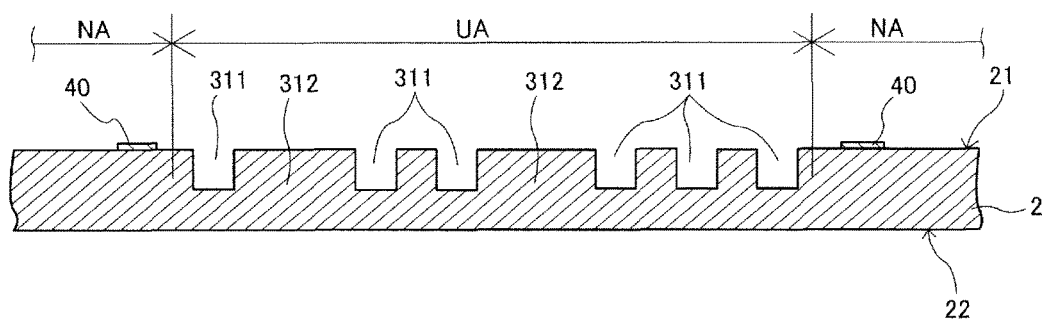
FIG. 19 is a cross-sectional end view depicting another aspect (No. 2) of the arrangement direction index pattern according to Embodiment 2 of this invention.

The arrangement direction index pattern 40 is not limited to the above mode, but may be formed in a position which can specify the arrangement direction of the unit bit string (unit bit matrix) expressed by the unit data patterns 31 formed in each unit storage area UA. The arrangement direction index pattern 40 is preferably formed in a position where the entire shape constituted by the unit storage area UA and the arrangement direction index pattern 40 does not have symmetry, such as point-symmetry, line symmetry and rotational symmetry. For example, if the shape of the unit storage area UA is approximately rectangular, the arrangement direction index pattern 40 may be formed near one corner (upper left corner in the example depicted in FIG. 18), out of the four corners of the unit storage area UA, along one side (long side or short side, the upper long side in the example depicted in FIG. 18.) If the arrangement direction index pattern 40 is formed in such a position, it can be easily recognized whether the positional relationship of the storage area SA (unit storage area UA) and the imaging unit 111 of the data read out apparatus 100 is correct or not when the data storage medium 1 is set in the data read out apparatus 100.

The arrangement direction index pattern 40 according to Embodiment 2 may be a material that is different from substrate 2, which is a metal thin film of chromium oxide or the like, as long as the expected service life and stability of the data storage medium 1 are not affected. The shape, dimensions and the like of the arrangement direction index pattern 40 are not especially limited, but are preferably different from those of the physical structure (concave portion 311 and convex portion 312) constituting the unit data pattern 31. If the shape and dimensions of the physical structure constituting the unit data pattern 31 are different from those of the arrangement direction index pattern 40, the arrangement direction index pattern 40 can be easily recognized in the image data acquired by the imaging unit 111 of the data read out apparatus 100.

Figure 20:
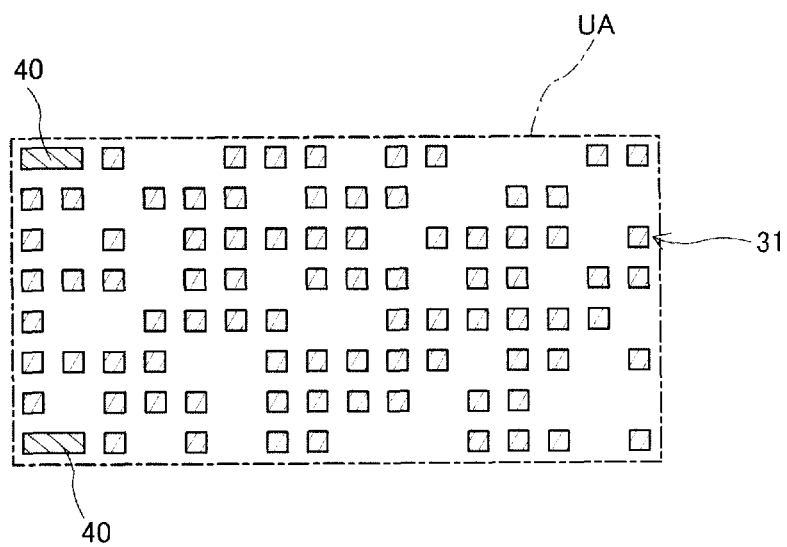
FIG. 20 is a plan view depicting another aspect (No. 3) of the arrangement direction index pattern according to Embodiment 2 of this invention.

The arrangement direction index pattern 40 may be formed in the unit storage area UA as depicted in FIG. 20. In this case, the non-data storage area NA need not exist in the storage area SA. Thereby the recording capacity of the data storage medium 1 can be increased.

Figure 21:
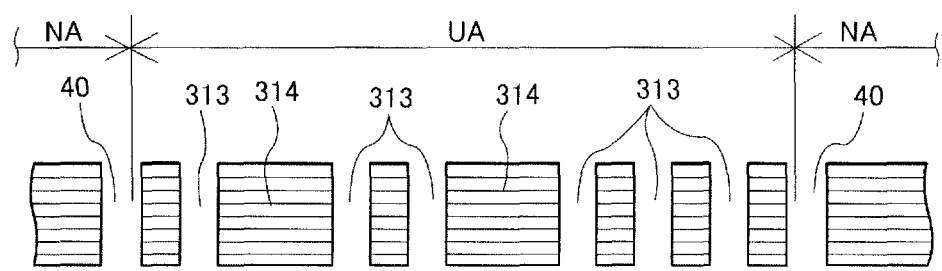
FIG. 21 is a cross-sectional end view depicting another aspect of the physical structure of the unit data pattern according to Embodiment 2 of this invention.

The unit data pattern 31 according to Embodiment 2 is not limited to the concave portion 311 or the convex portion 312, as long as it is constituted by an optically recognizable physical structure. For example, as depicted in FIG. 21, the unit data pattern may be constituted by a through hole portion 313 which corresponds to bit "1" of the unit bit string, and a non-hole portion 314 which corresponds to bit "0". In this case, it is preferable that the arrangement direction index pattern 40 is constituted by the same physical structure as the unit data pattern 31, that is, by a through hole portion, in terms of simplifying the fabrication of the data storage medium 1. One of the unit data pattern 31 and the arrangement direction index pattern 40 may be constituted by a non-through concave portion, and the other may be constituted by a through hole portion. In this case, when the image data on the second surface 22 side of the data storage medium 1 is acquired by the later mentioned imaging unit 111 of the data read out apparatus 100 (see FIG. 12), the presence of either one of the unit data pattern 31 and the arrangement direction index pattern 40 cannot be detected, therefore the front and back reversal of the data storage medium 1, which is set in the data read out apparatus 100, can be easily recognized.

Figure 22:
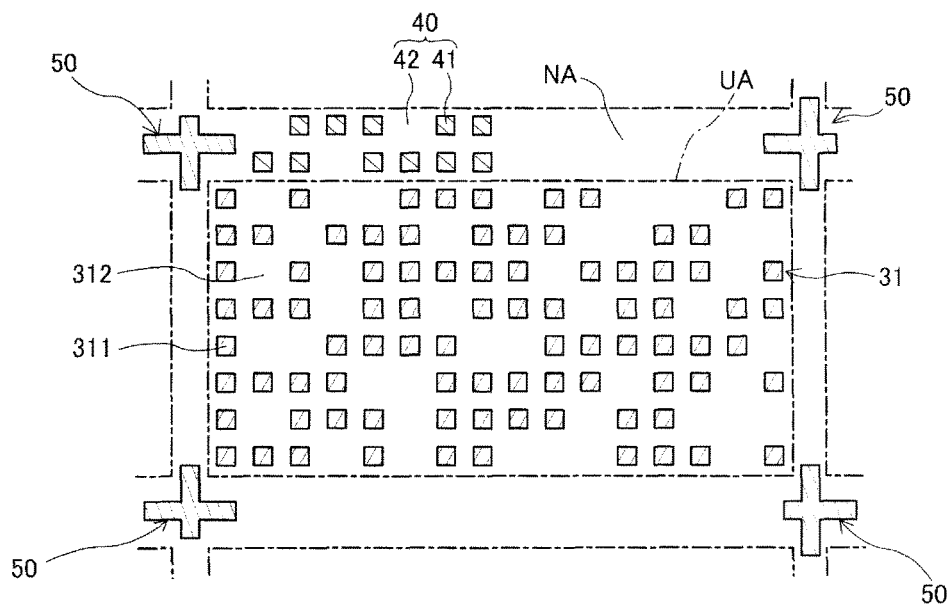
FIG. 22 is a plan view depicting another aspect (No. 4) of the arrangement direction index pattern according to Embodiment 2 of this invention.

The arrangement direction index pattern 40 not only indicates the information on the arrangement direction of the unit data patterns 31 formed in each unit storage area UA, but also indicates the position information of each unit storage area UA in the storage area SA. For example, the arrangement direction index pattern 40 indicates the array position of each unit storage area UA arranged in a matrix in the storage area SA, and expresses braille-like patterns indicating the array position of each unit storage area UA as (p, q), by the pth row (p is an integer of 1≤p≤M), and the qth column (q is an integer of 1≤q≤N) (see FIG. 5), and this pattern is expressed by the physical structure (concave portions 41 and the convex portions 42). In FIG. 22, the arrangement direction index pattern 40 indicates that the unit storage area UA is an area located at the 04th row and the 02nd column.

In this case, the arrangement direction index pattern 40 may be constituted by the physical structure (concave portions 41 and convex portions 42) expressing the bit strings of binarized row numbers and column numbers similarly to the unit data pattern 31.

The boundary pattern 50 is a pattern indicating the boundary between one unit storage area UA and other adjacent unit storage areas UA which are adjoined via the non-data storage area NA in the row direction and column direction, and is formed so as to be located outside the four corners of each approximately rectangular unit storage area UA. By forming this boundary pattern 50, the imaging unit 111 of the data read out apparatus 100 can easily recognize each unit storage area UA, and data which is recorded and stored as a plurality of unit data patterns 31 can be accurately read out.

Figure 6:
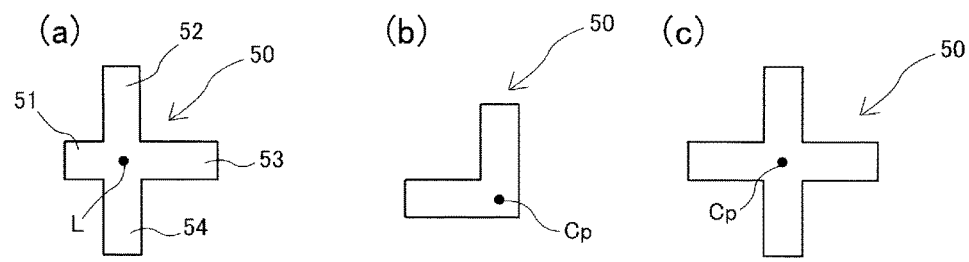
FIG. 6 shows plan views depicting the configuration of the boundary pattern according to Embodiments 1 to 3 of this invention.
Figure 7:
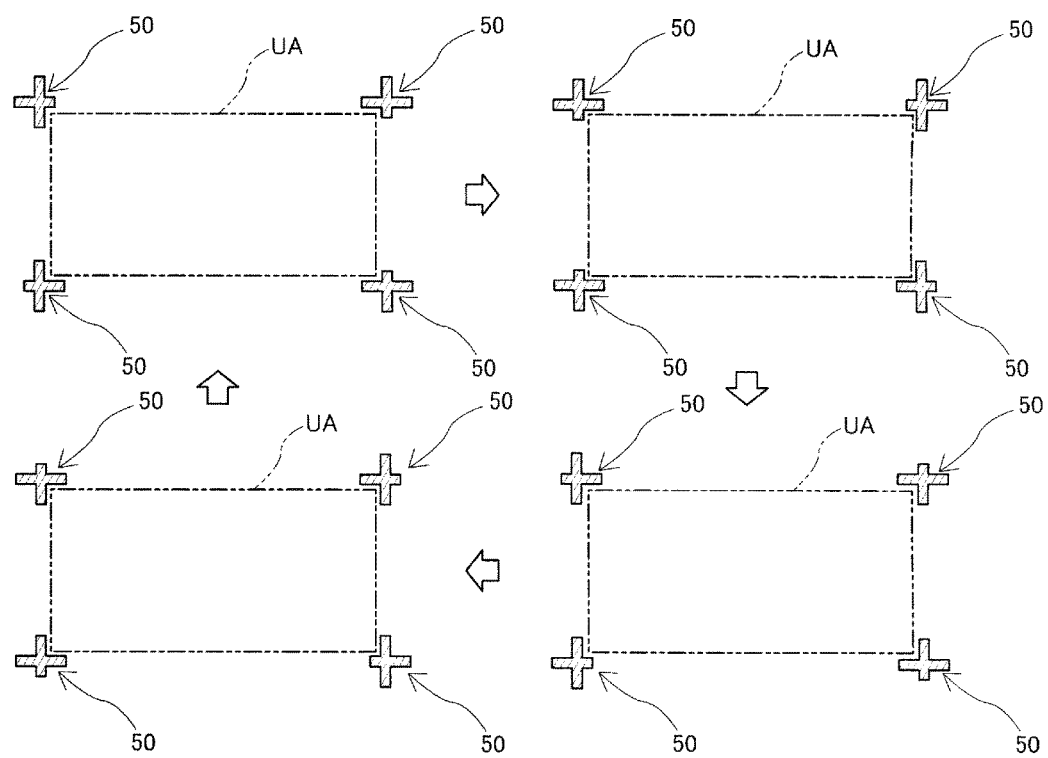
FIG. 7 shows plane views depicting arrangement examples of the boundary patterns according to Embodiments 1 to 3 of this invention.

In Embodiment 2, the boundary pattern 50 has an approximately cross-shape, and the length of one pattern 51, out of four patterns 51 to 54, which extend out from the intersection L thereof (length of the pattern in the extending direction from the intersection), is shorter than those of the three other patterns 52 to 54 (see FIG. 6(*a*)). The boundary pattern 50 having this shape is formed so as to be rotated 90° each time in the array sequence (sequence from the upper left in the horizontal direction in FIG. 3) of the plurality of unit storage areas UA in the storage area SA (see FIG. 7). As mentioned later, when the data recorded and stored in the data storage medium 1 according to Embodiment 2 is read out, the image data in each unit storage are UA is acquired while moving the imaging unit 111 relatively with the data storage medium 1. Therefore the position of the imaging unit 111 is aligned each time the imaging unit 111 is moved, and then image data is acquired, but the boundary pattern 50 is rotated 90° each time in the array sequence of the unit storage areas UA, hence the image data can be acquired in the array sequence of the unit storage areas UA while scanning the imaging unit 111.

The plan view of the boundary pattern 50 may be approximately L-shaped (having two patterns which extend from the reference point Cp in two directions perpendicular to each other) (see FIG. 6(*b*)), or may be approximately cross-shaped in which four patterns extend out from the reference point Cp, where the lengths of the four patterns (lengths of the patterns from the intersection in the extending direction) are substantially the same (see FIG. 6(*c*)).

In Embodiment 2, the concave portion 311 constituting the unit data pattern 31 has approximately a rectangular hole shape in the plan view. The dimensions of this concave portion 311 can be any dimensions with which a standard imaging element can optically recognize the concave portion 311, but in order to increase the data capacitance which can be recorded and stored in the data storage medium 1, the dimensions of the concave portion 311 of the unit data pattern 31 may be set to 400 nm or less, preferably around 100 to 250 nm, for example.

Figure 23:
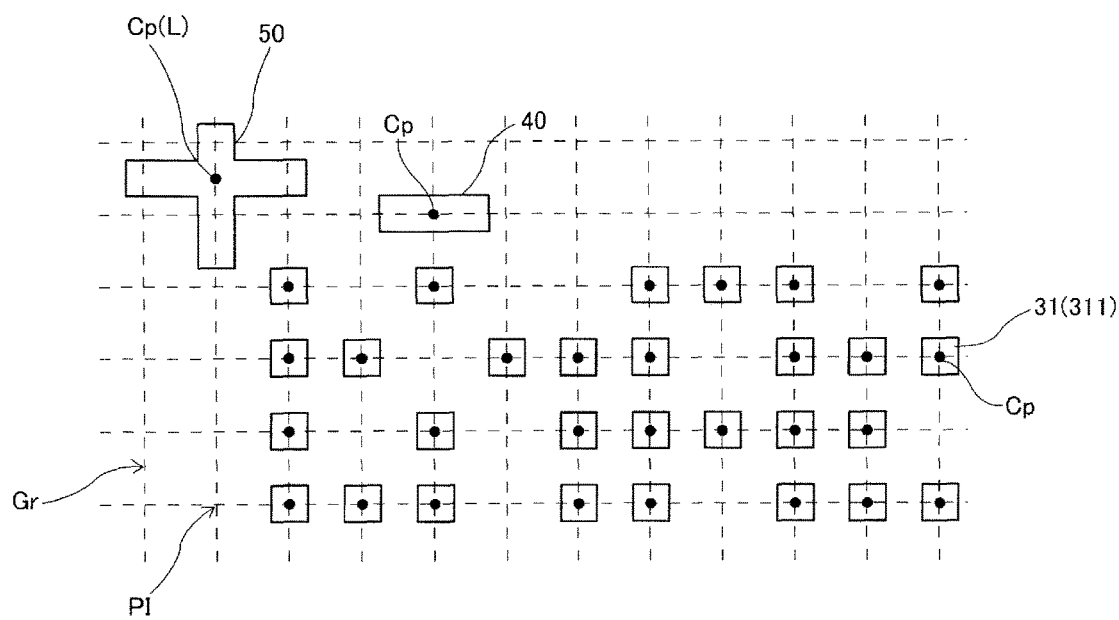
FIG. 23 is a partial plan view depicting an arrangement example of a unit data pattern, an arrangement direction index pattern, and a boundary pattern according to Embodiment 2 of this invention.

As illustrated in FIG. 23, both the unit data pattern 31 and the arrangement direction index pattern 40 are formed so as to overlap with the intersections PI of the virtual grid Gr which is set in the storage area SA, and the boundary pattern 50 is formed so that the boundary pattern 50 overlaps with the grid line of the virtual grid Gr. In concrete terms, the unit data pattern 31, the arrangement direction index pattern 40, and the boundary pattern 50 are formed so that the reference point Cp of the boundary pattern 50 overlaps with the grid line of the virtual grid Gr, and is also located approximately at the center of the adjacent intersections PI (adjacent intersections PI in the vertical direction in FIG. 23), whereby the respective reference points Cp of the unit data pattern 31 (concave portions 311) and the arrangement direction index pattern 40 overlap with the intersections PI of the virtual grid Gr. Here in the plan view, the reference points Cp of the unit data pattern 31 and the arrangement direction index pattern 40 are the center points of the physical structures constituting the unit data pattern 31 and the arrangement direction index pattern 40, and the reference point Cp of the boundary pattern 50 is an intersection L of the approximately cross-shaped pattern. It is sufficient that at least the reference point Cp of the unit data pattern 31 overlaps with the intersection PI of the virtual grid Gr, and the reference points Cp of the arrangement direction index pattern 40 and the boundary pattern 50 may overlap with the intersections PI of the virtual grid Gr, or may not overlap with the intersections PI but overlap with the grid lines of the virtual grid Gr, or may overlap with neither the intersections PI nor the grid lines of the virtual grid Gr.

In the data storage medium 1 according to Embodiment 2 having the above configuration, the data content (bit strings) of the recorded and stored data is expressed by the unit data patterns 31 (concave portions 311 and the convex portions which are arranged in a matrix as the physical structure)

formed in each unit storage area UA of the storage area SA. The arrangement direction index pattern 40 to be the index of the arrangement sequence of the physical structure (concave portions 311 and convex portions 312) in the unit data pattern 31 is formed corresponding to each unit storage area UA. Therefore the sequence of reading data can be recognized accurately by recognizing the arrangement direction index pattern 40, and the data can be accurately restored.

The data storage medium 1 according to Embodiment 2 can be fabricated by processing a substrate constituted by quartz, and has extremely good heat resistance and water resistance. Therefore even if the storing environment were changed, the recorded and stored data (unit data patterns 31), and the arrangement direction index pattern 40 would not be lost, and the data can be stored for a very long time (at the level of several hundred years). Further, even after a very long time span, the sequence of reading out the data stored in the data storage medium 1 can be recognized accurately by recognizing the arrangement direction index pattern 40, and the data can be accurately restored.

Further, in the data storage medium 1 according to Embodiment 2, the data can be recorded and stored by the data pattern (concave portions 311 and convex portions 312 as the physical structure) formed on the first surface 21 of the substrate 2, hence reproduction (backup) of the data storage medium 1, in which this data is recorded and stored, can be easily fabricated by performing imprint lithography processing using this data storage medium 1, even if this source data (digital data) does not exist, as mentioned in detail later.

Further, the data recorded and stored in the data storage medium 1 according to Embodiment 2 is expressed by the physical structure which can be optically recognized using a standard imaging element, hence even in a very distant future, the data can easily be restored by imaging this physical structure (concave portions 311 and convex portions 312) using an imaging element that is available at a time in future, and converting the image into bit strings.

Furthermore, in the data storage medium 1 according to Embodiment 2, the arrangement direction index pattern 40, which indicates a position information of each unit storage area UA in the storage area SA, where data is recorded and stored, is formed, hence even in the case of reading a part of the data recorded and stored in the data storage medium 1 (unit data patterns 31 formed in a part of the unit storage areas UA of the plurality of unit storage areas UA), the target data (a part of the data) can be easily read out based on this arrangement direction index pattern 40. Even if a part of the physical structure (concave portions 311) formed in the unit storage area UA is damaged, the unit storage area UA, where a part of the physical structure is damaged, can be specified by the arrangement direction index pattern 40. Therefore, if only reproduction (backup) of the data storage medium 1 has been fabricated in advance, data recorded and stored in this unit storage area UA can be easily read out from this reproduction, and if this data is combined with the data read out from the other unit storage areas UA of the data storage medium 1, the data recorded and stored in the data storage medium 1 can be restored.

[Manufacturing Method for Data Storage Medium]

Figure 24:
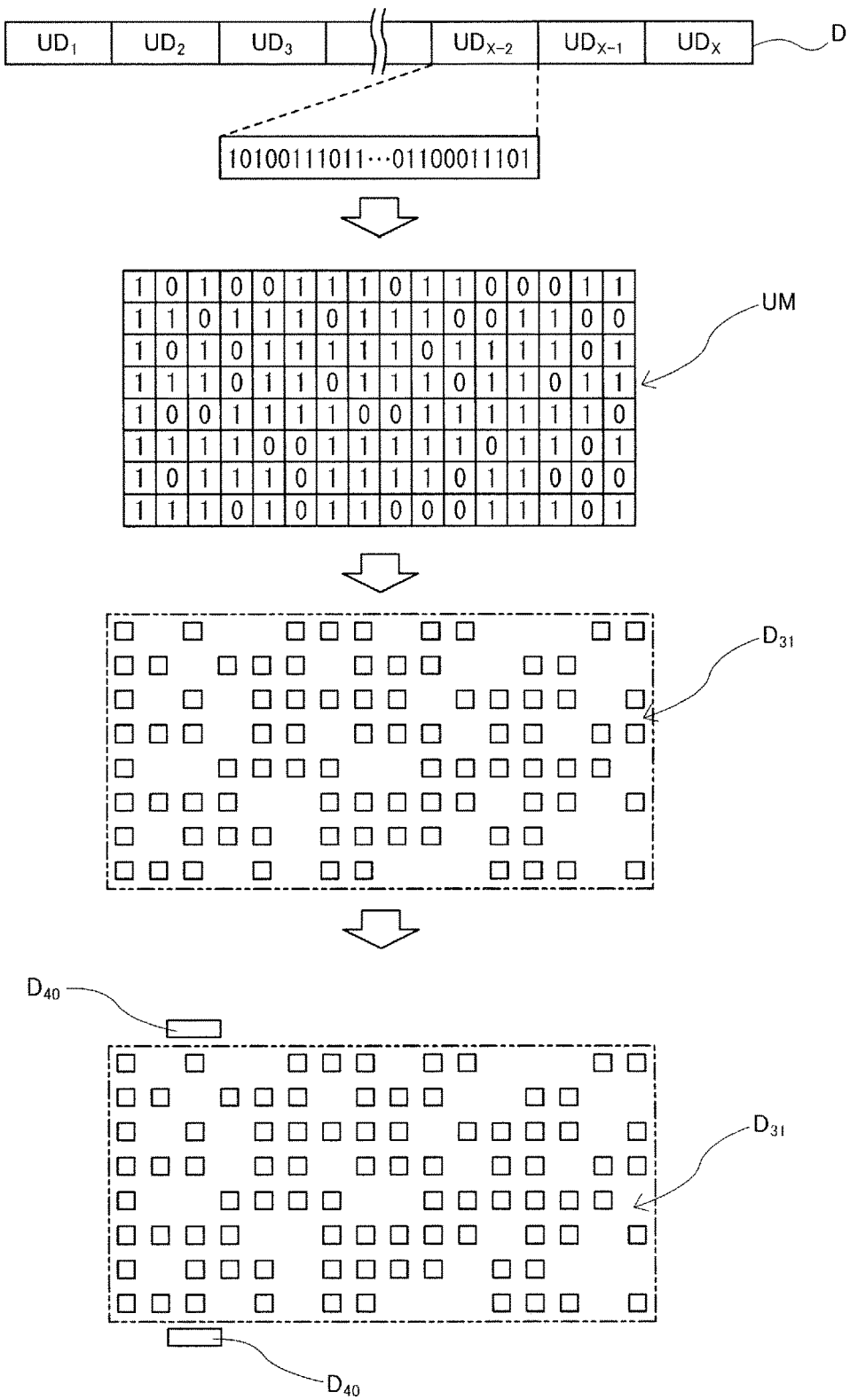
FIG. 24 is a schematic diagram depicting the steps of generating drawing data according to Embodiment 2 of this invention.
Figure 25:
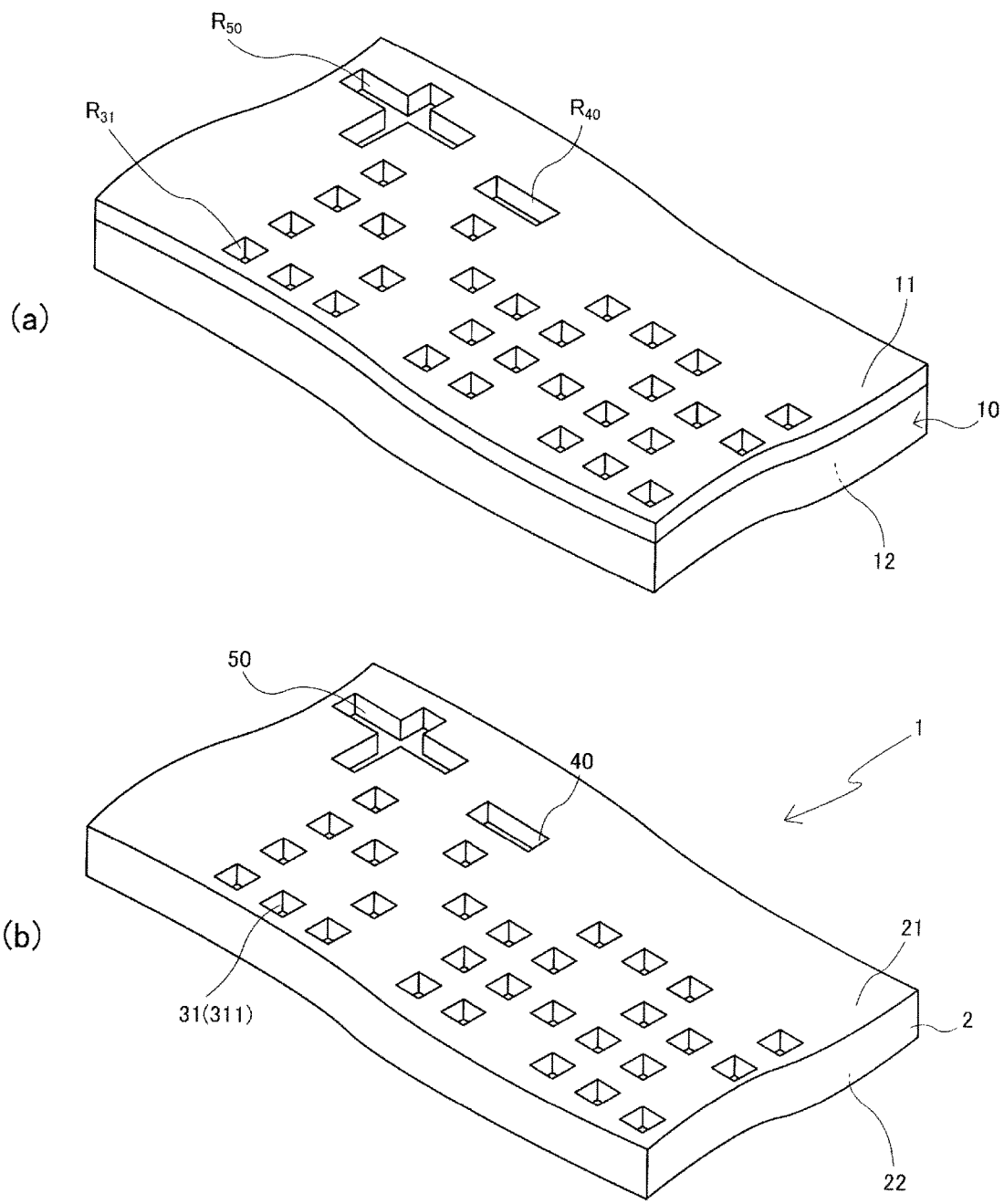
FIG. 25 shows perspective views depicting steps of the manufacturing method for the data storage medium according to Embodiment 2 of this invention.

The data storage medium 1 having the above configuration can be fabricated as follows. FIG. 24 is a flow chart depicting steps of designing the drawing data as a previous stage of fabricating the data storage medium 1 according to Embodiment 2, and FIG. 25 is an enlarged partial perspective view depicting steps of fabricating the data storage medium 1 according to Embodiment 2.

[Drawing Data Design Step]

First, the drawing data to form the unit data patterns 31 and the arrangement direction index pattern 40 in the storage area SA (each unit storage area UA) of the data storage medium 1 is designed based on the data D which is recorded and stored in the data storage medium 1.

In concrete terms, all the bit strings of the data D are divided into X number of unit bit strings (X is 2 or greater integer) from the beginning of the data D by predetermined bit length units, so as to generate the unit data $UD_1$ to $UD_x$ which include the unit bit strings. The bit length of the unit bit string of each unit data UD may be set to the same length as the bit length that can be recorded and stored in the unit storage area UA. If data can be stored in each unit storage area UA in an 8 rows×16 columns bit matrix in Embodiment 2, all the bit strings of the data D to be recorded and stored are divided into 128-bit long unit bit strings of the unit data UD from the beginning of the data D. If all the bit strings of the data D to be stored can be recorded and stored in one unit storage area UA without dividing, all the bit strings of the data D need not be divided.

Then the unit bit strings of each unit data UD are converted into an 8 rows×16 columns unit bit matrix UM, and the unit pattern data $D_{31}$ is generated based on this unit bit matrix UM. In Embodiment 2, the virtual grid Gr is defined in an area corresponding to the unit storage area UA, and a bit graphic (square graphic) corresponding to the concave portion 311 is disposed only in positions corresponding to bit "1" in the unit bit matrix UM, so as to overlap with the intersections PI of the virtual grid Gr, and the bit graphic is not disposed in positions corresponding to bit "0" (see FIG. 24). This unit pattern data $D_{31}$ expresses 128-bit information constituting the unit bit matrix UM by the presence/absence of the bit graphic in each position constituting the 8 rows×16 columns of the matrix. This unit pattern data $D_{31}$ is used as the drawing data to form the unit data patterns 31 (concave portions 311) in the unit storage area UA.

Then the arrangement direction index pattern data $D_{40}$ is added to the outside of each unit pattern data $D_{31}$ (non-data storage area NA, near the upper left corner and near the lower left corner of the unit storage area UA). This arrangement direction index pattern data $D_{40}$ is used as the drawing data to form the arrangement direction index pattern 40 in the non-data storage area NA.

After generating the unit pattern data $D_{31}$ which is a drawing data of the unit data patterns 31 to be formed in each unit storage area UA and the arrangement direction index pattern data $D_{40}$ which is the drawing data of the arrangement direction index pattern 40 to be formed in the non-data storage area NA, this pattern data are disposed in a matrix, and the boundary pattern data $D_{50}$, which is the drawing data of the boundary pattern 50, is added to the non-data storage area NA, whereby the drawing data can be generated.

The arrangement direction index pattern 40 may not be added in the above mentioned sequence, and in some cases may be better if added in a sequence other than the above. For example, in the case when the arrangement direction index pattern 40 is disposed inside the unit storage area UA, as depicted in FIG. 20, the bit length of the unit data UD that can be arranged in the unit storage are UA is limited depending on the area occupied by the arrangement direction index pattern 40 within the unit storage area UA (a number of the intersections PI of the virtual grid Gr that is required to dispose the arrangement direction index pattern 40). In such a case, it is preferable that the unit pattern data $D_{31}$ is designed after the arrangement direction index pattern data $D_{40}$ is generated, and then all the data strings of the data D to be stored are divided by a bit length unit with which the unit pattern data $D_{31}$ can be arranged in locations of the unit storage area UA, excluding an area where the arrangement direction index pattern 40 is disposed (intersections PI of the virtual grid Gr).

[Data Storage Medium Fabrication Steps]

A data storage medium substrate 10 constituted by quartz, which has a first surface 11 and a second surface 12 facing the first surface 11, is prepared, and resist patterns $R_{31}$, $R_{40}$ and $R_{50}$, corresponding to the unit data pattern 31, the arrangement direction index pattern 40, and the boundary pattern 50 are formed on the first surface 11 of this substrate 10 (see FIG. 25(a)).

These resist patterns $R_{31}$, $R_{40}$ and $R_{50}$ can be formed using a known conventional exposure device (e.g. electron beam lithography apparatus, laser lithography apparatus) that is used for semiconductor manufacturing processes or the like. Using this exposure apparatus, a pattern latent image is formed on a resist layer, which is formed on the first surface 11 side of the data storage medium substrate 10, based on the drawing data generated as above, and the development processing is performed, whereby the resist patterns $R_{31}$, $R_{40}$ and $R_{50}$ can be formed.

The material constituting the resist layer is not especially limited, and a known conventional energy line sensitive resist material (e.g. electron beam sensitive resist material) can be used. In the example depicted in FIG. 25(a), a positive type energy line sensitive resist material is used, hence concave resist patterns $R_{31}$, $R_{40}$ and $R_{50}$ are formed by developing the resist layer on which the pattern latent image is formed.

After forming the resist patterns $R_{31}$, $R_{40}$ and $R_{50}$ like this, the first surface 11 of the data storage medium substrate 10 is etched by a wet etching method or a dry etching method using these resist patterns $R_{31}$, $R_{40}$ and $R_{50}$ as a mask (see FIG. 25(b)), and the remaining resist patterns $R_{31}$, $R_{40}$ and $R_{50}$ are removed. Thereby the data storage medium 1, according to Embodiment 2 where the unit data pattern 31, the arrangement direction index pattern 40, and the boundary pattern 50 are formed on the first surface 21 of the substrate 2, can be fabricated. If necessary, a data storage medium substrate 10, where a hard mask layer constituted by chromium oxide or the like is formed on the first surface 11 side, may be used, and in this case, the hard mask pattern is formed by etching the hard mask layer using the resist patterns $R_{31}$, $R_{40}$ and $R_{00}$ as a mask, then the first surface 21 of the data storage medium substrate 10 is etched using this hard mask pattern, and the hard mask pattern is removed, whereby the data storage medium 1 is fabricated.

A method of fabricating a reproduction of the data storage medium 1 fabricated like this will be described. FIG. 11 is a process flow diagram which shows cross-sectional end views of the steps of fabricating the reproduction of the data storage medium 1 according to Embodiment 2.

First, a data storage medium 1, where the unit data pattern 31, the arrangement direction index pattern 40, and the boundary pattern 50 are formed on the first surface 21 of the substrate 2, and a substrate 6 which has a first surface 61 and a second surface 62 facing the first surface 61, and has a resin layer 7 which is disposed on the first surface 61, are prepared (see FIG. 11(a)).

The material constituting the substrate 6 is not especially limited, and a single layer substrate constituted by: such glass substrate as quartz glass substrate, soda glass substrate, fluorite substrate, calcium fluoride substrate, magnesium fluoride substrate, acrylic glass substrate and borosilicate glass substrate; or such resin substrate as polycarbonate substrate, polypropylene substrate, polyethylene substrate and polyolefin substrate may be used, or a multilayer substrate constituted by laminating two or more substrates selected from the above substrates, may be used.

The resin layer 7 is a layer in which the reverse patterns of the unit data pattern 31, the arrangement direction index pattern 40 and the boundary pattern 50 of the data storage medium 1 are formed in a later step (see FIG. 11(b)). For the resin material constituting the resin layer 7, such resin material as thermoplastic resin, thermosetting resin and UV curable resin can be used, and in concrete terms, an acrylic resin, styrene resin, olefin resin, polycarbonate resin, polyester resin, epoxy resin and silicone resin or the like can be used.

Then the first surface 21 of the data storage medium 1 is contacted with the resin layer 7 of the substrate 6 to transfer the unit data pattern 31, the arrangement direction index pattern 40 and the boundary pattern 50 of the data storage medium 1 to the resin layer 7, so that the reverse patterns thereof are formed (see FIG. 11(b)). After the resin layer 7 is cured, the data storage medium 1 and the substrate 6 are separated from the resin layer 7, whereby a resin mold 8 is fabricated (see FIG. 11(c)). The step in FIG. 11(c) of separating the substrate 6 and the resin layer 7 may be omitted if there are no problems in subsequent steps (FIG. 11(d) to FIG. 11(f)), or if the substrate 6 and the resin layer 7 are strongly contacted and separation thereof is difficult.

Then a reproduction substrate 10' constituted by quartz, which has a first surface 11' and a second surface 12' facing the first surface 11', is prepared, and a resist layer 9 is formed on the first surface 11' of the reproduction substrate 10'. Then the surface on which the reverse pattern is formed on the resin mold 8 is contacted to this resist layer 9, and the resist layer 9 is cured in this state (see FIG. 11(d)).

After the resist layer 9 is cured, the resin mold 8 is separated from the resist layer 9, whereby a resist pattern 91, on which the reverse pattern of the resin mold 8 is transferred, is formed (see FIG. 11(e)). Using this resist pattern 91 as a mask, the first surface 11' of the reproduction substrate 10' is etched. Thereby the reproduction 1' of the data storage medium 1 can be fabricated (see FIG. 11(f)). As long as the curing of the resist layer 9 is not affected, the reproduction substrate 10', where a hard mask layer constituted by chromium oxide or the like is formed on the first surface 11' side, may be used, and in this case, a hard mask pattern is formed by etching the hard disk layer using the resist pattern 91 as a mask, the first surface 11' of the reproduction substrate 10' is etched using the hard mask pattern as a mask, and then the hard mask pattern is removed, whereby the reproduction 1' of the data storage medium 1 can be fabricated.

As described above, according to Embodiment 2, the data storage medium 1 can be easily fabricated by using a known conventional lithography technique which is used for semiconductor manufacturing processes or the like. Further, a reproduction as a backup of the recorded and stored data, in the case of damage to the data storage medium 1, can be easily fabricated using a known conventional imprint technique.

[Data Read Out Apparatus, Data Read Out Method]

A data read out apparatus for reading data recorded and stored in the data storage medium 1 having the above configuration, and a data read out method using this data read out apparatus will be described. FIG. 12 is a block diagram depicting a general configuration of the data read out apparatus according to Embodiment 2.

The data read out apparatus 100 according to Embodiment 2 has: a stage on which the data storage medium 1 is mounted (set); an image data acquisition unit 110 configured to acquire the image data in the storage area SA of the data storage medium 1; and a control device 120 which includes a control unit 121 configured to perform data processing or the like based on this image data, and a storage unit 122 configured to store the image data acquired by the image data acquisition unit 110, various data generated by the control unit 121, and various programs. The data storage medium 1 can be set on the stage at a normal position with respect to the image data acquisition unit 110, but the data storage medium 1 can also be set in a state of being rotated 90° to the left, being rotated 90° to the right, or being rotated 180°, with respect to the image data acquisition unit 110.

The image data acquisition unit 110 includes: an imaging unit 111 configured to capture an image in a predetermined photographing target region, such as a CCD camera, as an image data; and a scanning unit 112 configured to perform scanning processing such that the photographing target area sequentially and relatively moves each unit storage area UA of the storage area SA of the data storage medium 1 with respect to the imaging unit 111. For this image data acquisition unit 110, a general purpose optical microscope or the like can be used.

The control unit 121 performs the computing processing according to the instruction of various programs. In concrete terms, the control unit 121 performs such processing as: reading out the unit data (unit bit strings) from the image data based on the unit data patterns 31 formed in each unit storage area UA; generating data on the combining sequence (combining sequence data) of the unit data (unit bit string); determining the extraction direction of the unit data (unit bit string) corresponding to the unit data patterns 31 based on the arrangement direction index pattern 40; storing the image data acquired by the image data acquisition unit 110 and various generated data in the storage unit 122; and combining the read unit data (unit bit strings) and restoring the data recorded and stored in the data storage medium 1.

The storage unit 122 stores such data as: the image data of the storage area SA (unit storage area UA) acquired by the image data acquisition unit 110; and combining sequence data of the unit data (unit bit strings) which are read from the image data based on the unit data patterns 31 formed in the unit storage area UA. For the control device 120 having such a control unit 121 and storage unit 122, a general purpose computer or the like can be used.

Figure 26:
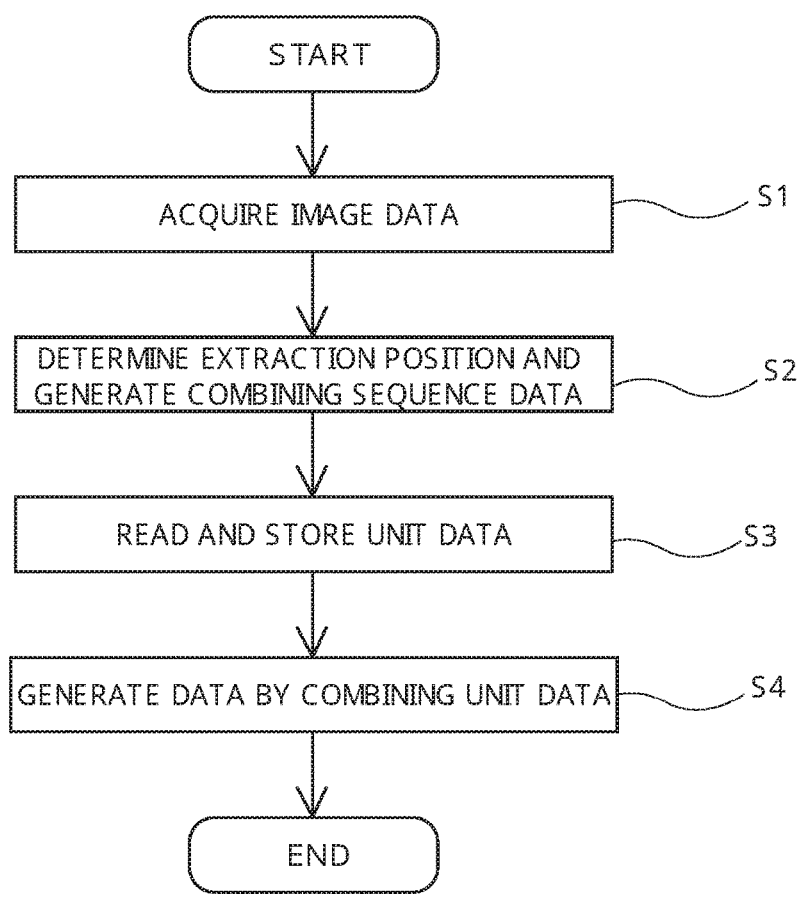
FIG. 26 is a flow chart depicting a data read out method according to Embodiment 2 of this invention.

A method of reading data recorded and stored in the data storage medium 1 using the data read out apparatus 100 having this configuration will be described. FIG. 26 is a flow chart depicting each step of the data read out method according to Embodiment 2.

First, when the data storage medium 1 is set in the image data acquisition unit 110, the image data acquisition unit 110 relatively moves the data storage medium 1 with respect to the imaging unit 111 using the scanning unit 112, and the imaging unit 111 images each unit storage area UA of the storage area SA of the data storage medium 1 according to a predetermined sequence, and acquires image data which includes at least images of the unit storage area UA and the arrangement direction index pattern 40 (S1). In the case when the entire shape of the unit storage areas UA is rectangular, and the unit storage areas UA are arranged in the storage area SA in an M rows×N columns matrix (M≠N) (see FIG. 3), the entire shape of the unit storage areas UA is recognized before acquiring the image data, and if this entire shape is a horizontally long rectangle, it is determined that the data storage medium 1 is set in a normal position, or in a state rotated 180° from the normal position. Therefore in this case, the imaging unit 111 is scanned in the row direction of the M rows×N columns, and the M×N number of image data is acquired. If the entire shape of the unit storage areas UA is a vertically long rectangle, on the other hand, it is determined that the data storage medium 1 is set in a state rotated 90° to the right or left from the normal position. Therefore in this case, the imaging unit 111 is scanned in the row direction of N rows×M columns, and M×N number of the image data is acquired. In the case when the entire shape of the unit storage areas UA is a square, and the unit storage area UA are arranged in the storage area SA in an M rows×N columns matrix (M=N), it is not necessary to determine whether the data storage medium 1 is set in a normal position or in a state rotated 180° from the normal position, or in a state rotated 90° to the left or right from the normal position.

Then the control unit 121 determines the positional relationship of the unit storage areas UA with respect to the normal position of one image data, which is arbitrarily selected from each image data stored in the storage unit 122, and determines, based on this positional relationship, a direction of extracting the physical structure (concave portions 311 and convex portions 312) of the unit data patterns 31 formed in the unit storage area UA (extraction direction), and generates the combining sequence data which indicates the combining sequence of the unit data (unit bit strings) which are read out from each image data (S2).

Figure 27:
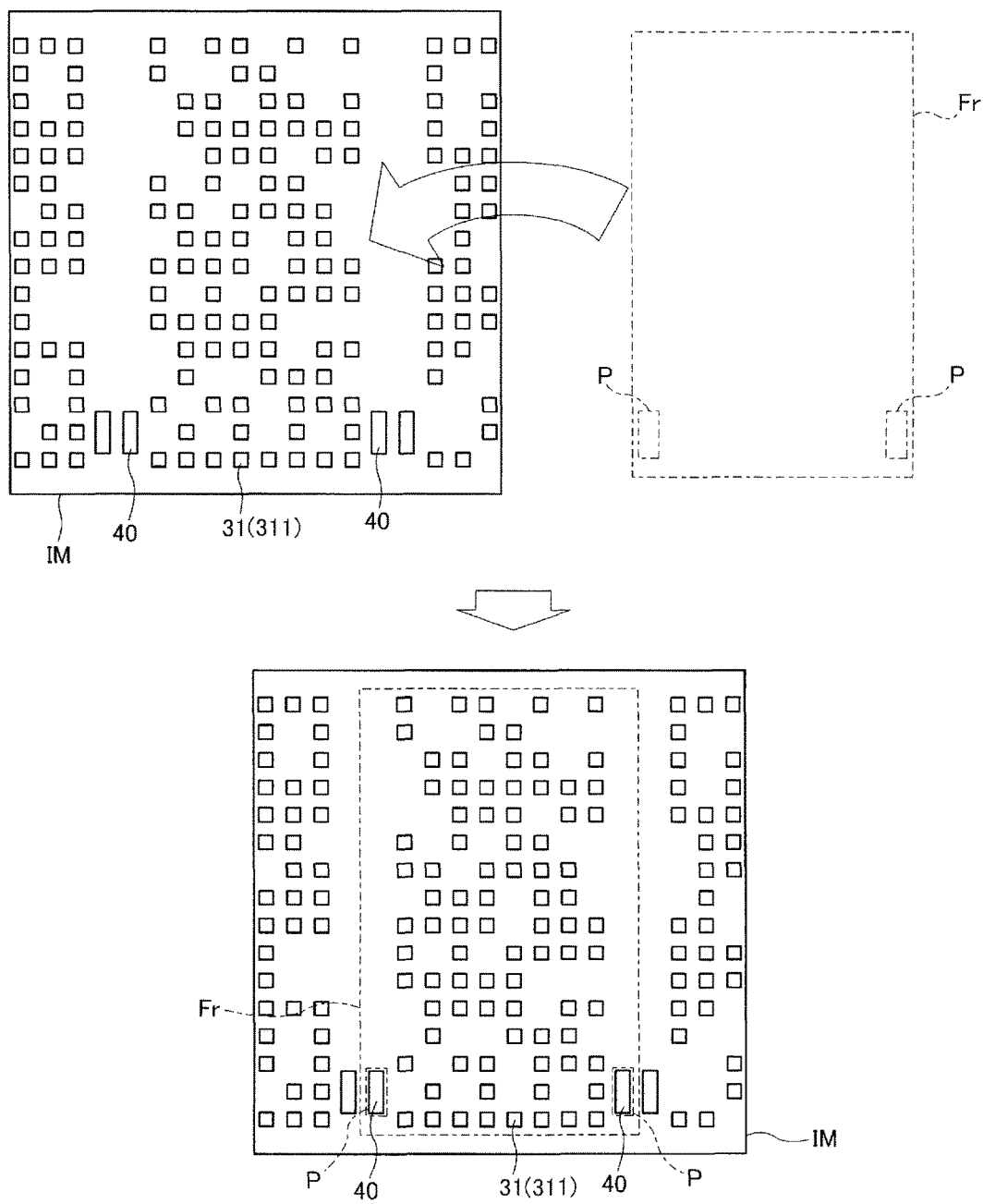
FIG. 27 is a plan view depicting a method of determining the direction of extracting the physical structure of the unit data pattern (extraction direction) according to Embodiment 2 of this invention.

In concrete terms, as depicted in FIG. 27, the control unit 121 defines a rectangular frame Fr, which physically includes the unit storage area UA and the corresponding arrangement direction index patterns 40, and rotates the frame Fr so that the positions P where the arrangement direction index patterns 40 in the frame Fr should be disposed match with the arrangement direction index pattern 40 in the image data IM. In the case of the example in FIG. 27, it is determined that the frame Fr after the above matching is rotated 90° to the left from the normal position of the unit storage area UA. Therefore the control unit 121 determines that the unit data patterns 31, formed in the unit storage area UA in the image data IM, are arranged in a matrix from lower left to upper right, and determines the extraction direction of the physical structure (concave portions 311 and convex portions 312) according to this matrix arrangement. Further, the control unit 121 generates the combining sequence data for combining the unit data in the sequence of ascending from the image data located at the lower left along the column line, when the image data is arranged in a matrix in the imaging sequence.

Then according to the extraction direction which was determined as above, the control unit 121 extracts the physical structure (concave portions 311 and convex portions 312) of the unit data patterns 31 from each image data stored in the storage unit 122, reads the unit data (unit bit strings) based on this physical structure, and stores the unit data (unit bit strings) in the storage unit 122 (S3).

When the physical structure (concave portions 311 and convex portions 312) of the unit data patterns 31 is extracted and the unit data (unit bit strings) is read based on the physical structure, the control unit 121 defines the virtual grid Gr on the image data which includes the unit storage area UA, the arrangement direction index pattern 40, and the boundary pattern 50. This virtual grid Gr is defined so as to pass through the reference points Cp of the boundary patterns 50, which are located on the four corners of the unit storage area. Then the control unit 121 determines whether a concave portion 311 exists at each intersection PI of the virtual grid Gr in the unit storage area UA. Whether the concave portion 311 exists or not is determined based on light intensity distribution in the image data, for example.

The control unit 121 sets bit "1" in an intersection PI where it is determined that the concave portion 311 exists, and sets bit "0" in an intersection PI where it is determined that the concave portion 311 does not exist, whereby the unit data (unit bit strings) is read out.

The control unit 121 stores the unit data (unit bit strings) in the storage unit 122 for all the image data (S3), then generates the data (bit string) by combining the unit data (unit bit strings) according to the combining sequence data (S4). In this way, the data stored in the data storage medium 1 can be restored.

As mentioned above, according to the data read out apparatus according to Embodiment 2 and the data read out method using this data read out apparatus, the arrangement direction index pattern 40 is disposed in the data storage medium 1, therefore the data stored in the data storage medium 1 can be accurately restored regardless of the direction of the data storage medium 1, which is set in the data read out apparatus.

Embodiment 3

[Data Storage Medium]

Figure 29:
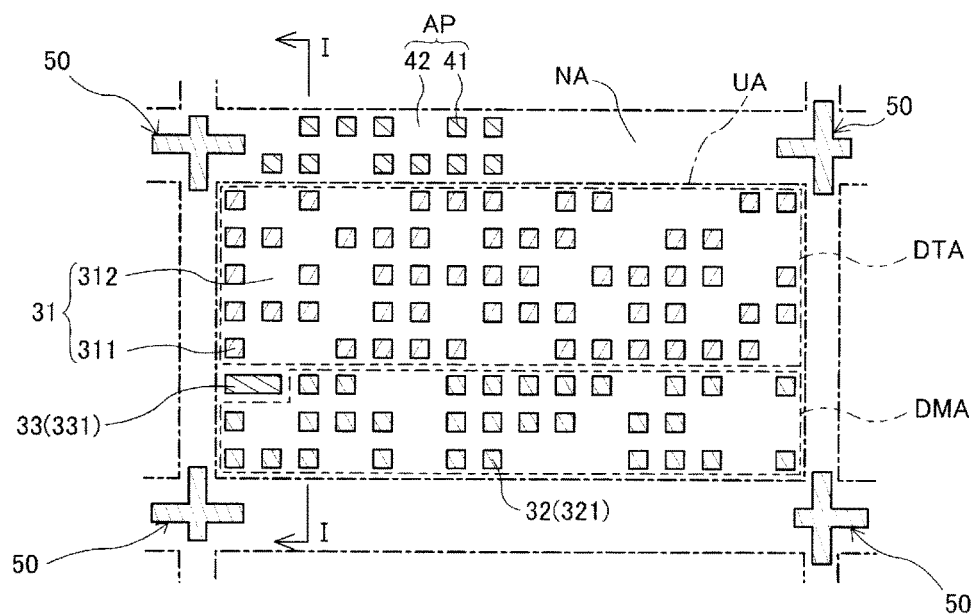
FIG. 29 is a plan view depicting a general configuration of a unit storage area according to Embodiment 3 of this invention.
Figure 30:
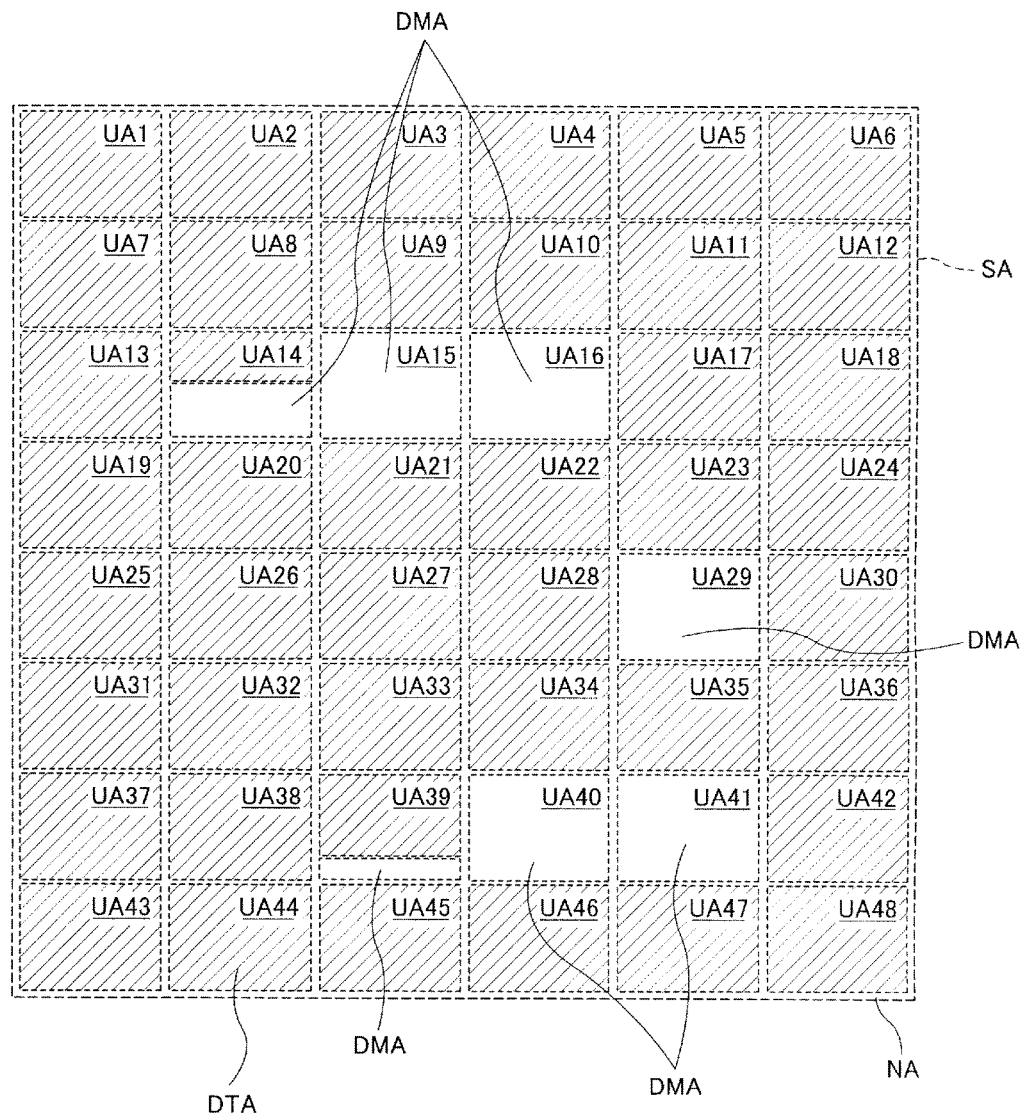
FIG. 30 is a plan view depicting a storage area according to Embodiment 3 of this invention.
Figure 31:
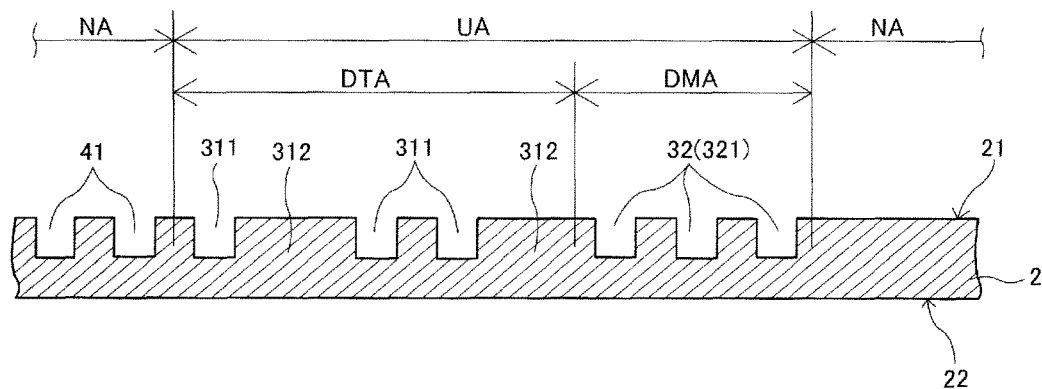
FIG. 31 is an enlarged partial cross-sectional end view depicting the data storage medium according to Embodiment 3, and is a cross-sectional end view sectioned at the I-I line in FIG. 29.

FIG. 1 is a plan view depicting a general configuration of a data storage medium according to Embodiment 3, FIG. 29 is a plan view depicting a general configuration of a unit storage area according to Embodiment 3, FIG. 30 is a plan view depicting a storage area according to Embodiment 3, and FIG. 31 is an enlarged partial cross-sectional end view of the data storage medium according to Embodiment 3, and is a cross-sectional end view sectioned at the I-I line in FIG. 29.

The data storage medium 1 according to Embodiment 3 includes an approximately rectangular substrate 2 constituted by quartz glass having a first surface 21 and a second surface 22 facing the first surface 21, and a convexoconcave structure formed in a storage area SA, which is set on the first surface 21 of the substrate 2.

In the storage area SA, a plurality of unit storage area UA are arrayed in an M rows×N columns matrix (one of M and N is 2 or greater integer, the other is 1 or greater integer). As illustrated in FIG. 30, in Embodiment 3, 48 unit storage areas UA (UA1 to UA8) are arrayed in an 8 rows (M=8)×6 columns (N=6) matrix, but this invention is not limited to this form.

The storage area SA includes a plurality of unit storage areas UA and non-data storage areas NA which are positioned like "foot paths between rice fields" between adjacent unit storage areas UA. In Embodiment 3, each unit storage area UA is an area where a unit data pattern 31 as a convexoconcave structure, a dummy pattern 32, and a discernment pattern 33, are formed, and the non-data storage area NA is an area where an address pattern AP and a boundary pattern 50 are formed.

The size of the unit storage area UA is appropriately set in accordance with the size of the area that can be imaged by a later mentioned imaging unit 111. The size of the non-data storage area NA is not especially limited, as long as the address pattern AP can be formed, but if the size of the non-data storage area NA is minimized, the ratio of the unit storage area UA in the storage area SA can be increased, thereby the data recording capacity can be increased.

The unit data pattern 31 formed in each unit storage area UA is constituted by concave portions (holes) 311 and convex portions (portions where holes do not exist) 312, which express the data content (unit bit strings) of the unit data where data recorded and stored in the data storage medium 1 is divided into a plurality of data. In Embodiment 3, bit "1" in the unit bit string of this unit data is defined as the concave portion 311, and bit "0" is defined as the convex portion 312. For example, in FIG. 29, the unit data expressed by a unit bit string (unit bit matrix) of "1010011101 . . . " from the upper left corner is recorded and stored in the unit storage area UA of the data storage medium 1. Bit "1" of the unit bit string may be defined as the convex portion 312, and bit "0" thereof may be defined as the concave portion 311.

The type of data recorded and stored in the data storage medium 1 is not especially limited, and text data, image data such as a moving image and still image, and voice data, for example, can be used.

In each storage unit UA, an area in which the unit data patterns 31 are formed is a data area DTA, and an area in the unit storage area UA, other than the data area DTA, is a dummy area DMA. Dummy patterns 32 are formed in the dummy area DMA.

The ratio of the total area of the dummy patterns (concave portions 321) with respect to the total area of the dummy area DMA (hereafter "area density of dummy pattern 32") is substantially the same as the ratio of the total area of the unit data patterns 31 (concave portions 311) with respect to the total area of the data area DTA (hereafter "area density of unit data pattern 31"). In concrete terms, the area density of the dummy pattern 32 is about 90% to 110%, preferably 95% to 105%, of the area density of the unit data pattern 31. If the area density of the dummy pattern 32 is substantially the same as the area density of the unit data pattern 31, generation of pattern defects in the transfer patterns can be prevented when reproduction of the data storage medium 1 is fabricated by imprint processing using this data storage medium 1, as described later.

It is preferable that the shapes (plan view shapes) of the unit data pattern 31 and the dummy pattern 32 are substantially the same. As depicted in FIG. 29, the concave portions 311 and 321 constituting the unit data pattern 31 and the dummy pattern 32 according to Embodiment 3 are square hole shapes in plan views. The dimensions of the concave portion 311 of the unit data pattern 31 can be any dimensions which allow a standard imaging element to optically recognize the concave portion 311, but in order to increase the data capacity that can be recorded and stored in the data storage medium 1, the dimensions of the concave portion 311 of the unit data pattern 31 is set to 400 μm or less, preferably 100 to 250 μm. The dimensions of the concave portion 321 of the dummy pattern 32 are not especially limited, but preferably are the same as the dimensions of the concave portion 311 of the unit data pattern 31. If the shapes and dimensions of the concave portion 311 of the unit data pattern 31 and the concave portion 321 of the dummy pattern 32 are substantially the same, generation of pattern defects in the transfer patterns can be prevented when reproduction of the data storage medium 1 is fabricated by imprint processing using this data storage medium 1.

In Embodiment 3, the unit data patterns 31 and the dummy patterns 32 can be formed in one unit storage area UA. Hence if the unit data pattern 31 (concave portion 311) and the dummy pattern 32 (concave portion 321) have substantially the same shape and dimensions, it is difficult to determine the boundary between the unit data pattern 31 (data area DTA) and the dummy pattern 32 (dummy area DMA). Therefore in Embodiment 3, a discernment pattern 33, which plays a role of clearly discerning the boundary between the unit data patterns (data area DTA) and the dummy patterns 32 (dummy area DMA) is formed between the unit data pattern 31 (concave portion 311 or convex portion 312) corresponding to the last bit of the bit string of the data, and the dummy patterns 32, out of the plurality of unit data patterns 31 corresponding to each bit of a bit string of the data.

In order to execute this role, the discernment pattern 33 is formed as a concave portion 311 having a shape and dimensions which are different from those of the unit data pattern 31 (concave portion 311) and the dummy pattern 32 (concave portion 321). In Embodiment 3, the shape (plan view shape) of the discernment pattern 33 is a rectangle of which long sides are in the row direction. Thereby when the later mentioned data read out apparatus 100 reads out the data from the data storage medium 1, only the unit data patterns 31 can be selectively extracted, and can accurately read out the data stored in the data storage medium 1.

Most of the data stored in the data storage medium 1 includes a control symbol to indicate the end of the data file (EOF) in the data content, hence a pattern corresponding to the control symbol to indicate the end of the data file may be used as the discernment pattern 33, instead of disposing a separate discernment pattern 33. A pattern corresponding to a bit string, generated by binarizing a symbol that is the same as the control symbol, may be used as the discernment pattern 33, or a binarized bit string to indicate the end of the data file may be determined separately, so that a pattern corresponding to this bit string may be used as the discernment pattern 33. In Embodiment 3, it is sufficient if at least one discernment pattern 33 is formed, but a plurality of types of patterns (e.g. two types of patterns: a pattern (concave portion 331) of which shape and dimensions are different from those of the unit data pattern 31 (concave portion 311) and the dummy pattern (concave portion 321); and a pattern corresponding to the control symbol indicating the end of the data file) may be formed as the discernment pattern 33.

In Embodiment 3, the address pattern AP formed in the non-data storage area NA is constituted by a concave portion 41 and a convex portion 42 which express the position information of each unit storage area UA in the storage area SA. In Embodiment 3, the address pattern AP indicates the position information of each unit storage area UA in the storage area SA, and expresses braille-like patterns indicating the array position of each unit storage area UA as (p, q), by the pth row (p is an integer of 1≤p≤M), and the qth column (q is an integer of 1≤q≤N) (see FIG. 5), and this pattern is expressed by the concave portions 41 and the convex portions 42. In FIG. 29, the address pattern AP indicates that the unit storage area UA is an area located at the 04th row and the 02nd column.

The address pattern AP in Embodiment 3 may be constituted by the convexoconcave structure 4 (concave portions 41 and convex portions 42) which indicates the bit string generated by binarizing the row number and column number similarly to the unit data pattern 31.

The boundary pattern 50 is a pattern indicating the boundary between one unit storage area UA and the other adjacent unit storage areas UA which are adjoined via the non-data storage area NA in the row direction and column direction, and is formed so as to be located outside the four corners of each approximately rectangular unit storage area UA. By forming this boundary pattern 50, the imaging unit 111 can easily recognize each unit storage area UA, as mentioned later, and data which is recorded and stored as a plurality of unit data patterns 31 can be accurately read out.

In Embodiment 3, the boundary pattern 50 has an approximately cross-shape, and the length of one pattern 51, out of four patterns 51 to 54, which extend out from the intersection L thereof (length of the pattern in the extending direction from the intersection), is shorter than those of the three other patterns 52 to 54 (see FIG. 6(a)). The boundary pattern 50 having this shape is formed so as to be rotated 90° each time in the array sequence (sequence from the upper left in the horizontal direction in FIG. 30) of the plurality of unit storage areas UA in the storage area SA (see FIG. 7). As mentioned later, when the data recorded and stored in the data storage medium 1 according to Embodiment 3 is read out, the image data in each unit storage are UA is acquired while moving the imaging unit 111 relatively with the data storage medium 1. Therefore the position of the imaging unit 111 is aligned each time the imaging unit 111 is moved, and then image data is acquired, but the boundary pattern 50 is rotated 90° each time in the array sequence of the unit storage areas UA, hence the image data can be acquired in the array sequence of the unit storage areas UA while scanning the imaging unit 111.

The plan view of the boundary pattern 50 may be approximately L-shaped (having two patterns which extend from the reference point Cp in two directions perpendicular to each other) (see FIG. 6(b)), or may be approximately cross-shaped in which four patterns extend out from the reference point Cp, where the lengths of the four patterns (lengths of the patterns from the intersection in the extending direction) are substantially the same (see FIG. 6(c)).

Figure 32:
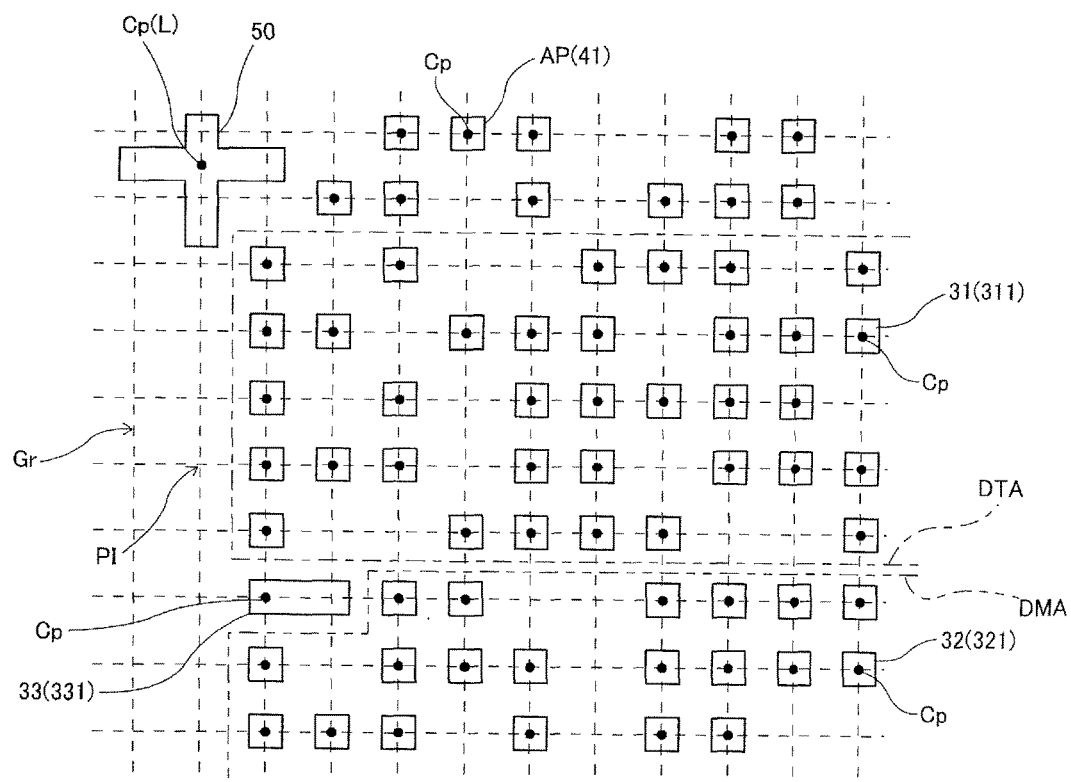
FIG. 32 is a partial plan view depicting an arrangement example of a unit data pattern, a dummy pattern, a discernment pattern, an address pattern, and a boundary pattern according to Embodiment 3 of this invention.

As illustrated in FIG. 32, all of the unit data pattern 31, the dummy pattern 32, the discernment pattern 33 and the address pattern AP are formed so as to overlap with the intersections PI of the virtual grid Gr which is set inside the storage area SA, and the boundary pattern 50 is formed so as to overlap with the grid line of the virtual grid Gr. In concrete terms, the unit data pattern 31, the dummy pattern 32, the discernment pattern 33, the address pattern AP and the boundary pattern 50 are formed so that the reference point Cp of the boundary pattern 50 overlaps with the grid line of the virtual grid Gr, and is also located approximately at the center of the adjacent intersections PI (adjacent intersections PI in the vertical direction in FIG. 32), whereby the respective reference points Cp of the unit data pattern 31 (concave portion 311), the dummy pattern 32 (concave portion 321), the discernment pattern 33 (concave portion 311), and the address pattern AP (concave portion 41) overlap with the intersections PI of the virtual grid Gr. Here the reference points Cp of the unit data pattern 31, the dummy pattern 32 and the address pattern AP are the center points of the concave portions 311, 321 and 41 constituting the unit data pattern 31, the dummy pattern 32 and the address pattern AP respectively in the plan view. The reference point Cp of the discernment pattern 33 is a point decentered to the left side of the row direction in the plan view, and the reference point Cp of the boundary pattern 50 is an approximately cross-shaped intersection L. It is sufficient that at least the respective reference points Cp of the unit data pattern 31, the dummy pattern 32 and the discernment pattern 33 overlap with the intersections PI of the virtual grid Gr, and the reference points Cp of the address pattern AP and the boundary pattern 50 may overlap with the intersections PI of the virtual grid Gr, or may not overlap with the intersections PI but overlap with the grid lines of the virtual grid Gr, or may overlap neither with the intersections PI nor the grid lines of the virtual grid Gr.

In the data storage medium 1 according to Embodiment 3 having the above configuration, the data content of the recorded and stored data is expressed by the convexoconcave structure (unit data patterns 31) formed in each unit storage area UA of the storage area SA. This data storage medium 1 can be fabricated by processing a substrate constituted by quartz, and has extremely good heat resistance and water resistance. Therefore, even if the storing environment were changed, the recorded and stored data would not be lost, and the data can be stored for a very long time (at the level of several hundred years).

In the data storage medium 1 according to Embodiment 3, the data can be recorded and stored by the convexoconcave structure (unit data patterns 31) formed on the first surface 21 of the substrate 2. Therefore reproduction (backup) of the data storage medium 1, in which this data is recorded and stored, can be easily fabricated by performing imprint lithography processing using this data storage medium 1, even if this source data (digital data) does not exist, as mentioned in detail later. Further, by forming the dummy patterns 32 in an area of this data storage medium 1 where the unit data patterns 31 are not formed (dummy area DMA), generation of transfer defects by imprint processing using the data storage medium 1 can be prevented, and reproduction (backup) can be accurately fabricated.

Further, the data recorded and stored in the data storage medium 1 according to Embodiment 3 is expressed by the convexoconcave structure which can be optically recognized using a standard imaging element, hence even in a very distant future, the data can be easily restored by imaging this convexoconcave structure (concave portions 311 and convex portions 312 of the unit data pattern 31) using an imaging element that is available at this time in future, and converting the image into bit strings.

Furthermore, in the data storage medium 1 according to Embodiment 3, the address pattern AP, which indicates a position in each unit storage area UA in the storage area SA, in which data is recorded and stored as the convexoconcave structure, is formed, hence even in the case of reading a part of the data recorded and stored in the data storage medium 1 (unit data patterns 31 formed in a part of the unit storage areas UA of the plurality of unit storage areas UA), the target data (a part of the data) can be easily read out based on this address pattern AP. Even if a part of the convexoconcave structure (concave portions 311 of the unit data pattern 31) formed in the unit storage area UA is damaged, the unit storage area UA, where a part of the convexoconcave structure is damaged, can be specified by an address pattern AP, therefore if a reproduction (backup) of the data storage medium 1 has been fabricated in advance, the data recorded and stored in this unit storage area UA can be easily read out from this reproduction, and if this data is combined with the data read out from the other unit storage areas UA of the data storage medium 1, the data recorded and stored in the data storage medium 1 can be restored.

[Manufacturing Method for Data Storage Medium]

Figure 33:
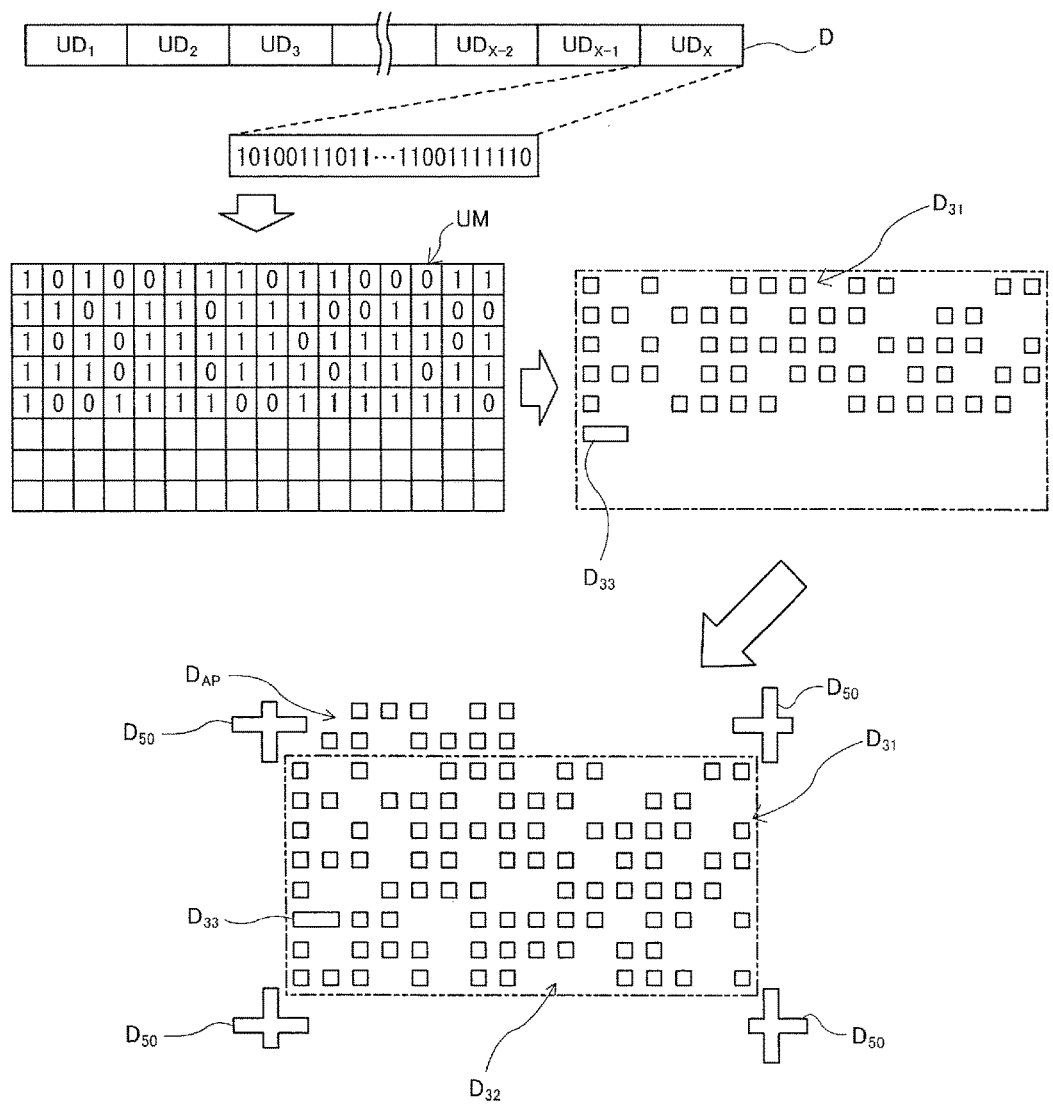
FIG. 33 is a schematic diagram depicting the steps of generating drawing data according to Embodiment 3 of this invention.
Figure 34:
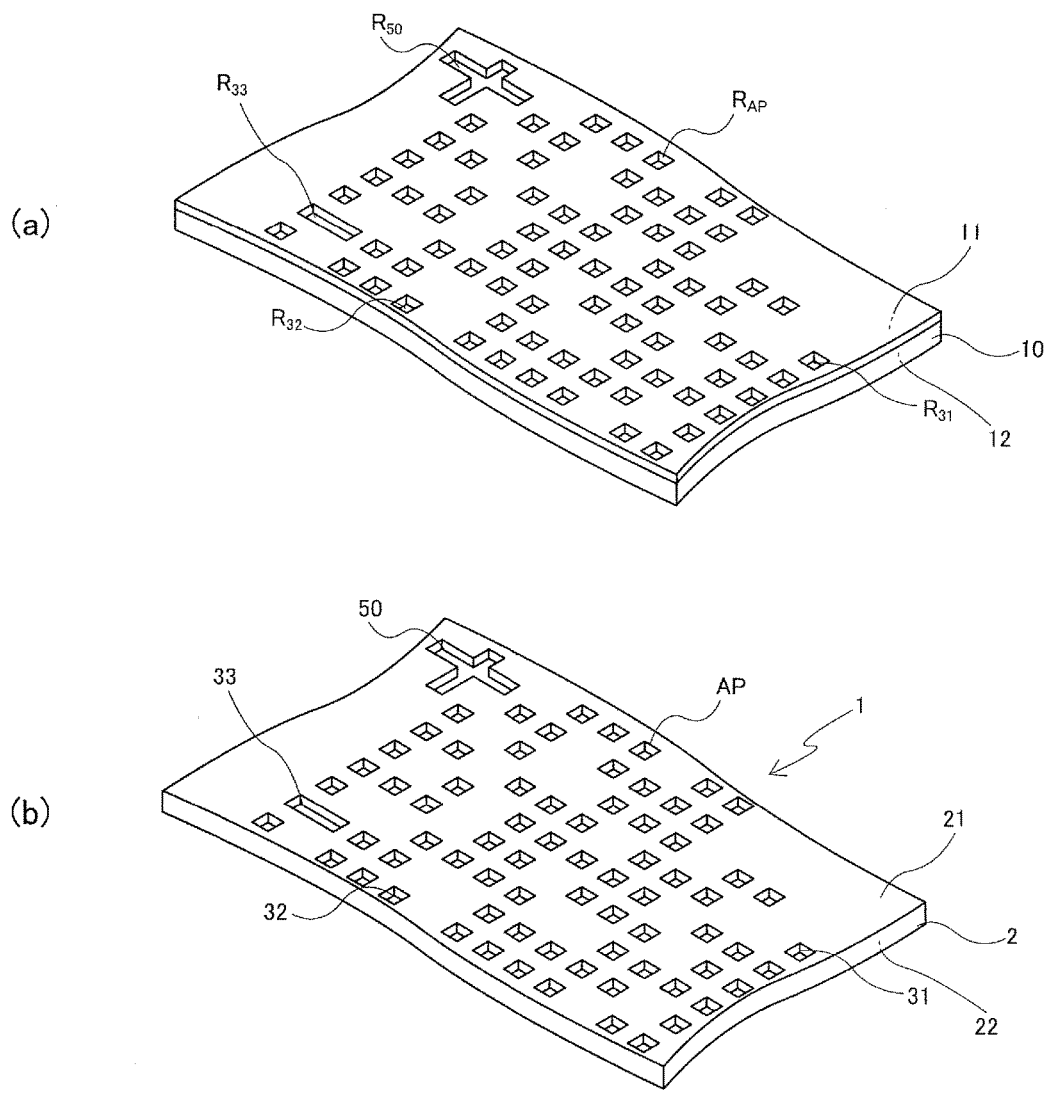
FIG. 34 shows perspective views depicting steps of the manufacturing method for the data storage medium according to Embodiment 3 of this invention.

The data storage medium 1 having the above configuration can be fabricated as follows. FIG. 33 is a flow chart depicting steps of generating the drawing data as a previous stage of fabricating the data storage medium 1 according to Embodiment 3, and FIG. 34 shows cross-sectional views depicting a flow of the steps of fabricating the data storage medium 1 according to Embodiment 3.

[Drawing Data Generation Step]

The first drawing data to form the unit data patterns 31 in a plurality of unit storage areas UA of the storage area SA of the data storage medium 1 is generated based on the data D which is recorded and stored in the data storage medium 1.

In concrete terms, all the bit strings of the data D are divided into X number of unit bit strings (X is 2 or greater integer) from the beginning of the data D by predetermined bit length units, so as to generate the unit data $UD_1$ to $UD_x$ which include the unit bit strings. The bit length of the unit bit string of each unit data UD may be set to the same length as the bit length that can be recorded and stored in the unit storage area UA. If data can be stored in each unit storage area UA in an 8 rows×16 columns bit matrix in Embodiment 3, all the bit strings of the data D to be recorded and stored are divided into 128-bit long unit bit strings of the unit data UD from the beginning of the data D. If all the bit strings of the data D to be stored can be recorded and stored in one unit storage area UA without dividing, all the bit strings of the data D need not be divided.

Then the unit bit strings of each unit data UD are converted into an 8 rows×16 columns unit bit matrix UM, and the unit pattern data $D_{31}$ is generated based on this unit bit matrix UM. In Embodiment 3, the virtual grid Gr is defined in a unit pattern data generation area corresponding to the unit storage area UA, and a bit graphic (square graphic) corresponding to the concave portion 311 is disposed only in positions corresponding to bit "1" in the unit bit matrix UM, so as to overlap with the intersections PI of the virtual grid Gr, and the bit graphic is not disposed in positions corresponding to bit "0" (See FIG. 32). This unit pattern data $D_{31}$ expresses 128-bit information constituting the unit bit matrix UM by the presence/absence of the bit graphic in each position constituting the 8 rows×16 columns of the matrix. This unit pattern data $D_{31}$ is used as the drawing data to form the unit data patterns 31 in the unit storage area UA.

Then the discernment pattern data $D_{33}$ is added to the unit pattern data $D_{31}$ of the unit bit string $UD_x$ including the end of the bit string of the data D, out of the above mentioned unit pattern data $D_{31}$. In concrete terms, if the end of the bit string of the data D is bit "1", the graphic cell (rectangular graphic cell) corresponding to the discernment pattern 33 is disposed after the graphic cell disposed at the end of the unit pattern data $D_{31}$. If the end of the bit string of the data D is bit "0", on the other hand, the graphic cell (rectangular graphic cell) corresponding to the discernment pattern 33 is disposed after the intersection PI of the virtual grid Gr, where the graphic cell was not disposed at the end of the unit pattern data $D_{31}$ (see FIG. 33).

The unit pattern data $D_{31}$, to which the discernment pattern data $D_{33}$ was added like this, is disposed in a matrix with disposing non-data storage areas NA positioned like "foot paths between rice fields", and the address pattern data $D_{AP}$ and the boundary pattern data $D_{50}$ corresponding to each unit pattern data $D_{31}$ disposed in a matrix, are added.

The address pattern data $D_{AP}$ is added according to the array sequence of the unit data UD in the data D to be recorded and stored in the data storage medium 1. This address pattern data $D_{AP}$ is used as the drawing data to form the address pattern AP in the non-data storage area NA.

From the first drawing data which includes the unit pattern data $D_{31}$, the discernment pattern data $D_{33}$, the address pattern data $D_{AP}$ and the boundary pattern data $D_{50}$, which were generated like this, an area corresponding to the dummy area DMA (dummy pattern data generation area) is extracted. This dummy pattern data area is extracted, based on the discernment pattern data $D_{33}$, as an area which includes an intersection PI (intersection PI where a graphic cell is not disposed) in accordance with the matrix arrangement sequence after the intersection PI where a graphic cell corresponding to the discernment pattern 33.

The dummy pattern data generation area is extracted like this, and the area density $AD_{UP}$(%) of the unit data pattern 31 in subsequent areas (areas to which the unit pattern data $D_{31}$ is added, out of all the unit pattern data generation areas) is calculated. This area density $AD_{UP}$ is calculated as a ratio of: the total surface area of all the graphic cells disposed in the areas where the graphic cells, corresponding to the unit pattern data 31, are disposed (in the case of FIG. 30, these areas are the unit pattern data generation areas corresponding to the unit storage areas UA1 to UA13, a part of UA14, UA17 to UA28, UA30 to UA38, a part of UA39 and UA42 to UA48) with respect to the total surface area of these areas. In Embodiment 3, the virtual grid Gr is defined such that the pitch of the adjacent graphic cells is double the size (length of one side) of the graphic cell corresponding to the unit data pattern 31, hence the area density, when the graphic cell is disposed on the intersections PI in all unit pattern data generation areas, is 25%. Therefore the area density $AD_{UP}$ (%) of the unit data pattern 31 is calculated by the following expression.

$$AD_{UP}=N_{b1}/N_{ab}\times 25$$

Here $N_{b1}$ denotes a "total number of bit is in all the bit strings of data D", and $N_{ab}$ denotes a "total number of bits of data D".

Using the area density $AD_{UP}$ (%) calculated like this as an index, the dummy pattern data $D_{32}$ is added to the extracted dummy pattern data generation area. The area density $AD_{UP}$ (%) calculated as above indicates the area density of the unit data pattern 31 in the storage area SA, hence the graphic cells corresponding to the dummy pattern 32 are disposed in the dummy pattern data generation area so that the area density of the dummy pattern 32 in the dummy pattern data generation area becomes an area density substantially the same as the area density $AD_{UP}$(about 90% to 110%, preferably 95% to 105% of the area density $AD_up$). When the graphic cells corresponding to the dummy patterns 32 are disposed, an intersection PI to which the graphic cell corresponding to the dummy pattern 32 is disposed, out of the intersections PI in the dummy pattern data generation area, can be determined using a random number table, for example. In this way, the dummy pattern data $D_{32}$ (second drawing data) is generated, and is added to the first drawing data, whereby the drawing data can be generated.

[Data Storage Medium Fabrication Steps]

A data storage medium substrate 10 constituted by quartz, which has a first surface 11 and a second surface 12 facing the first surface 11, is prepared, and resist patterns $R_{31}$, $R_{32}$, $R_{33}$, $R_{AP}$ and $R_{50}$ corresponding to the unit data pattern 31, the dummy pattern 32, the discernment pattern 33, the address pattern AP and the boundary pattern 50, are formed on the first surface 11 of this substrate 10 (see FIG. 34(a)).

These resist patterns $R_{31}$, $R_{32}$, $R_{33}$, $R_{AP}$ and $R_{50}$ can be formed using a known conventional exposure device (e.g. electron beam lithography apparatus, laser lithography apparatus) that is used for semiconductor manufacturing processes or the like. Using this exposure apparatus, a pattern latent image is formed on a resist layer, which is formed on the first surface 11 side of the data storage medium substrate 10, based on the drawing data generated as above, and the development processing is performed, whereby the resist patterns $R_{31}$, $R_{32}$, $R_{33}$, $R_{AP}$ and $R_{50}$ can be formed.

The material constituting the resist layer is not especially limited, and a known conventional energy line sensitive resist material (e.g. electron beam sensitive resist material) can be used. In the example depicted in FIG. 34(a), a positive type energy line sensitive resist material is used, hence concave resist patterns $R_{31}$, $R_{32}$, $R_{33}$, $R_{AP}$ and $R_{50}$ are formed by developing the resist layer on which the pattern latent image is formed.

After forming the resist patterns $R_{31}$, $R_{32}$, $R_{33}$, $R_{AP}$ and $R_{50}$ like this, the first surface 11 of the data storage medium substrate 10 is etched by a wet etching method or a dry etching method using these resist patterns $R_{31}$, $R_{32}$, $R_{33}$, $R_{AP}$ and $R_{50}$ as a mask (see FIG. 34(b)), and the remaining resist patterns $R_{31}$, $R_{32}$, $R_{33}$, $R_{AP}$ and $R_{50}$ are removed. Thereby the data storage medium 1 according to Embodiment 3, where the unit data pattern 31, the dummy pattern 32, the discernment pattern 33, the address pattern AP and the boundary pattern 50 are formed on the first surface 21 of the substrate 2, can be fabricated. A data storage medium substrate 10, where a hard mask layer constituted by chromium oxide or the like is formed on the first surface 11 side, may be used. In this case, the hard mask pattern is formed by etching using the resist patterns $R_{31}$, $R_{32}$, $R_{33}$, $R_{AP}$ and $R_{50}$ as a mask, the first surface 11 of the data storage medium substrate 10 is etched using this hard mask pattern as a mask, and the hard mask pattern is removed, whereby the data storage medium 1 is fabricated.

A method of fabricating a reproduction of the data storage medium 1 fabricated like this will be described. FIG. 11 is a process flow diagram which shows cross-sectional end view of steps of fabricating the reproduction of the data storage medium 1 according to Embodiment 3.

First a data storage medium 1, where the unit data pattern 31, the dummy pattern 32, the discernment pattern 33, the address pattern AP and the boundary pattern 50 are formed on the first surface 21 of the substrate 2, and a substrate 6 which has a first surface 61 and a second surface 62 facing the first surface 61, and has a resin layer 7 which is disposed on the first surface 61, are prepared (see FIG. 11(a)).

The material constituting the substrate 6 is not especially limited, and a single layer substrate constituted by: such glass substrate as quartz glass substrate, soda glass substrate, fluorite substrate, calcium fluoride substrate, magnesium fluoride substrate, acrylic glass substrate and borosilicate glass substrate; or such resin substrate as polycarbonate substrate, polypropylene substrate, polyethylene substrate and polyolefin substrate may be used, or a multilayer substrate constituted by laminating two or more substrates selected from the above substrates, may be used.

The resin layer 7 is a layer in which the reverse patterns of the unit data pattern 31, the dummy patterns 32, the discernment pattern 33, the address pattern AP and the boundary pattern 50 of the data storage medium 1 are formed in a later step (see FIG. 11(b)). For the resin material constituting the resin layer 7, such resin material as thermoplastic resin, thermosetting resin and UV curable resin can be used, and in concrete terms, an acrylic resin, styrene resin, olefin resin, polycarbonate resin, polyester resin, epoxy resin and silicone resin or the like can be used.

Then the first surface 21 of the data storage medium 1 is contacted with the resin layer 7 of the substrate 6 to transfer the unit data pattern 31, the dummy pattern 32, the discernment pattern 33, the address pattern AP and the boundary pattern 50 of the data storage media 1 to the resin layer 7, so that the reverse patterns thereof are formed (see FIG. 11(b)). After the resin layer 7 is cured, the data storage medium 1 and the substrate 6 are separated from the resin layer 7, whereby a resin mold 8 is fabricated (see FIG. 11(c)). In the case of the data storage medium 1 according to Embodiment 3, the dummy patterns 32 are formed in the area where the unit data patterns 31 are not formed (dummy area DMA), hence the stress applied to the entire surface of the first surface 21 of the data storage medium 1 becomes substantially uniform when the substrate 6 and the resin layer 7 are separated. As a result, a resin mold 8 having an accurate reverse pattern can be fabricated without generating transfer defects. The step in FIG. 11(*c*) of separating the substrate 6 and the resin layer 7 may be omitted if there are no problems in subsequent steps (FIG. 11(*d*) to FIG. 11(*f*)), or if the substrate 6 and the resin layer 7 are strongly contacted and separation thereof is difficult.

Then a reproduction substrate 10' constituted by quartz, which has a first surface 11' and a second surface 12' facing the first surface 11', is prepared, and a resist layer 9 is formed on the first surface 11' of the reproduction substrate 10'. Then the surface on which the reverse pattern is formed on the resin mold 8 is contacted to this resist layer 9, and the resist layer 9 is cured in this state (see FIG. 11(*d*)).

After the resist layer 9 is cured, the resin mold 8 is separated from the resist layer 9, whereby a resist pattern 91, on which the reverse pattern of the resin mold 8 is transferred, is formed (see FIG. 11(*e*)). In this case as well, the resin mold 8 has reverse patterns generated by accurately transferring the dummy patterns 32 of the data storage medium 1 according to Embodiment 3, hence stress that is applied to the entire surface of the resin mold 8 becomes substantially uniform when the substrate 6 and the resin layer 7 are separated.

Then the first surface 11' of the reproduction substrate 10' is etched using the resist pattern 91 as a mask. Thereby the reproduction 1' of the data storage medium 1 can be fabricated (see FIG. 11(*f*)). As long as the curing of the resist layer 9 is not affected, the reproduction substrate 10', where a hard mask layer constituted by chromium oxide or the like is formed on the first surface 11' side, may be used. In this case, the resist pattern 91 is formed on the hard mask layer, a hard mask pattern is formed by etching using the resist pattern 91 as a mask, the first surface 11' of the reproduction substrate 10' is etched using the hard mask pattern as a mask, and then the hard mask pattern is removed, whereby the reproduction 1' of the data storage medium 1 can be fabricated.

As described above, according to Embodiment 3, the data storage medium 1 can be easily fabricated by using a known conventional lithography technique which is used for semiconductor manufacturing processes or the like. Further, a reproduction as a backup of the recorded and stored data, in the case of damage to the data storage medium 1, can be easily fabricated using a known conventional imprint technique.

[Data Read Out Apparatus, Data Read Out Method]

A data read out apparatus for reading data recorded and stored in the data storage medium 1 having the above configuration, and a data read out method using this data read out apparatus will be described. FIG. 12 is a block diagram depicting a general configuration of the data read out apparatus according to Embodiment 3.

The data read out apparatus 100 according to Embodiment 3 has: an image data acquisition unit 110 configured to acquire the image data in the storage area SA of the data storage medium 1; and a control device 120 which includes a control unit 121 configured to perform data processing or the like based on this image data, and a storage unit 122 configured to store the image data acquired by the image data acquisition unit 110, various data generated by the control unit 121, and various programs.

The image data acquisition unit 110 includes: an imaging unit 111 configured to capture an image in a predetermined photographing target region, such as a CCD camera, as an image data; and a scanning unit 112 configured to perform scanning processing such that the photographing target area sequentially and relatively moves on each unit storage area UA of the storage area SA of the data storage medium 1 with respect to the imaging unit 111. For this image data acquisition unit 110, a general purpose optical microscope or the like can be used.

The control unit 121 performs the computing processing according to the instructions of various programs. In concrete terms, the control unit 121 performs such processing operations as: reading out the unit data (unit bit strings) based on the image data of the unit data patterns 31 formed in each unit storage area UA; discerning the end of the unit data (unit bit strings) based on the image data of the discernment pattern 33; reading out the position information of the unit storage area UA based on the image data of the address pattern AP formed in the non-data storage area NA; storing the image data acquired by the image data acquisition unit 110 and various generated data to the storage unit 122; and restoring the data recorded and stored in the data storage medium 1 by combining the unit data (unit bit strings) which are read out.

The storage unit 122 not only stores image data of the storage area SA (unit storage area UA) acquired by the image data acquisition unit 110, but also stores the association of the unit data (unit bit string) which is read based on the image data of the unit data pattern 31 formed in the unit storage area UA, and the position information of the unit storage area UA which is read based on the image data of the address pattern AP. For the control device 120 having such a control unit 121 and storage unit 122, a general purpose computer or the like can be used.

A method of reading out the data recorded and stored in the data storage medium 1 using the data read out apparatus 100 having this configuration will be described.

First, when the data storage medium 1 is set in the image data acquisition unit 110, the image data acquisition unit 110 relatively moves the data storage medium 1 with respect to the imaging unit 111 using the scanning unit 112, and sequentially images each unit storage area UA of the storage area SA of the data storage medium 1 using the imaging unit 111, and acquires the image data which includes images of each unit storage area UA and the address pattern AP corresponding to each unit storage area UA.

The scanning unit 112 of the image data acquisition unit 110 recognizes the boundary pattern 50 of the data storage medium 1, so as to relatively move the data storage medium 1 with respect to the imaging unit 111 such that the unit storage area UA and the corresponding address pattern AP are included in the photographing target area. Thereby an image captured by the imaging unit 111 includes at least one unit storage area UA, and the corresponding address pattern AP.

Each image data acquired from the image data acquisition unit 110 is stored in the storage unit 122 of the control device 120, and the control unit 121 reads out the unit data (unit bit strings) from each image data stored in the storage unit 122 based on the unit data patterns 31 formed in the unit storage area UA, and also reads the position information of the unit storage area UA based on the address pattern AP, and stores the unit data (unit bit strings) in association with the position information in the storage unit 122.

When the unit data (unit bit string) is read out based on the unit data pattern 31, the control unit 121 defines the virtual grid Gr on the image data which includes the unit storage area UA and the boundary pattern 50. This virtual grid Gr is defined so as to pass through the reference points Cp of the boundary patterns 50, which are located on the four corners of the unit storage area. Then the control unit 121 determines whether a concave portion 311 exists at each intersection PI of the virtual grid Gr in the unit storage area UA. Whether the concave portion 311 exists or not is determined based on the light intensity distribution in the image data, for example.

The control unit 121 sets bit "1" in an intersection PI where it is determined that the concave portion 311 exists, and sets bit "0" in an intersection PI where it is determined that the concave portion 311 does not exist, whereby the unit data (unit bit string) is read out.

When the unit data (unit bit string) is read out based on the unit data pattern 31, the control unit 121 recognizes the boundary pattern 50 located at the upper left of the image data, using the reference point Cp of this boundary pattern 50, and starts determining whether the concave portion 311 exists, in the right direction from the intersection PI, of the virtual grid Gr located at the lower right of this reference point Cp, and is also located within the unit storage area UA.

The control unit 121 reads out the unit data (unit bit strings) from each image data based on the unit pattern data 31, and when the discernment pattern 33 is recognized, the control unit 121 determines that the convexoconcave structure after the discernment pattern 33 is the dummy pattern 32, and stops reading the unit data (unit bit strings).

Then the control unit 121 combines the unit data (unit bit strings) stored in the storage unit 122, whereby the data (bit strings) is generated.

When the data (bit string) is generated, the control unit 121 determines the sequence of combining the unit data (unit bit strings) based on the position information which is stored in association with the unit data (unit bit strings). In concrete terms, regarding the row number of the position information as the first priority and the column number as the second priority, the control unit 121 combines the unit data (unit bit strings) in ascending order of rows numbers and column numbers. In this way, the data stored in the data storage medium 1 can be restored.

As described above, according to the data read out apparatus and the data read out method according to Embodiment 3, the discernment pattern 33 is recognized, whereby only the unit data can be read out based on the unit pattern data 31, without reading out the data based on the dummy pattern 32, and as a result, the data stored in the data storage medium 1 can be accurately restored.

The above described embodiments are to make understanding of the present invention easier, and are not intended to limit the scope of the invention. Therefore each element disclosed in the above embodiments include all the design changes and equivalents that are within the technical scope of the present invention.

Figure 14:
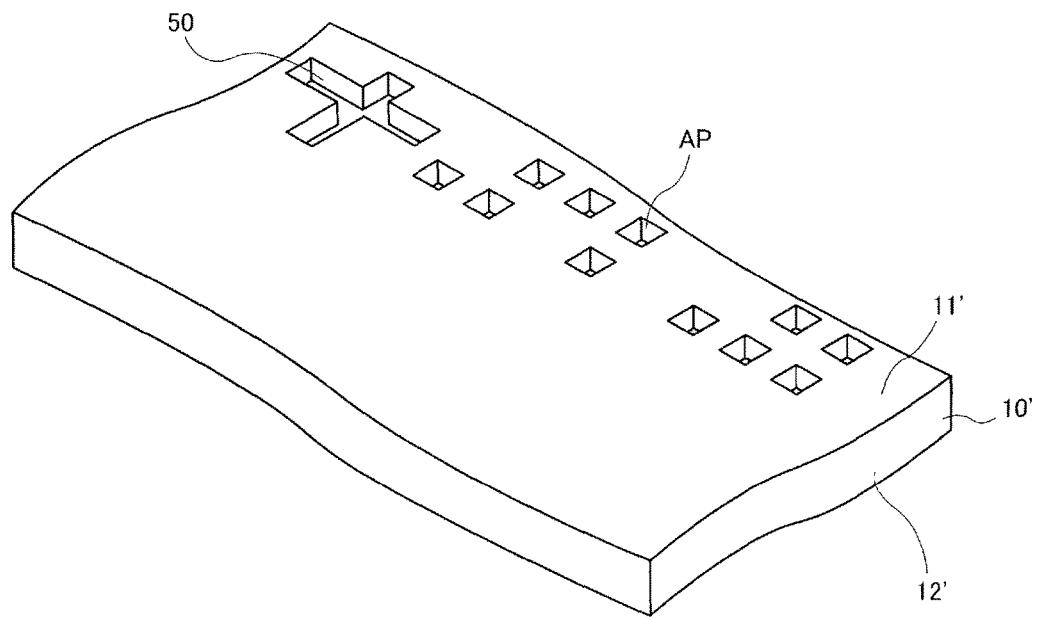
FIG. 14 is an enlarged partial perspective view depicting a general configuration of a data storage medium according to Embodiment 1 and Embodiment 3 of this invention.

In Embodiment 1, the data storage medium 1 is fabricated by simultaneously forming the unit data pattern 31, the address pattern AP and the boundary pattern 50 on the first surface 11 of the data storage medium substrate 10, which is constituted by quartz and has the first surface 11 and the second surface 12 facing the first surface 11 (see FIG. 10), but the present invention is not limited to this mode. For example, as illustrated in FIG. 14, a data storage medium, where a storage area SA including a plurality of unit storage areas UA and a non-data storage area NA is set on a first surface 11' of a substrate 10', which is constituted by quartz and has the first surface 11' and the second surface 12' facing the first surface 11', and the address pattern AP, corresponding to each unit storage area UA, and the boundary pattern 50 are formed in the non-data storage area NA of this storage area SA, may be prepared, so that the data storage medium 1 is fabricated by forming the unit data patterns 31 in each unit storage area UA of the data storage medium.

In Embodiment 1, the mode of forming the resist patterns $R_{31}$, $R_{AP}$ and $R_{50}$ using the positive energy line sensitive resist material was described as an example (see FIG. 10), but the present invention is not limited to this mode, and the resist patterns may be formed using a negative energy line sensitive resist material. Thereby a data storage medium 1, where the unit data pattern 31 and the address pattern AP are convex portions (pillars) and non-convex portions, the boundary pattern 50 is a convex portion (pillar), can be fabricated.

In Embodiment 2, the data storage medium 1 is constituted by a plurality of unit storage areas UA which are arranged in a matrix in one storage area SA defined on the first surface 21 of the substrate 2, but the present invention is not limited to this mode, and data patterns which express bit strings of the data may be formed in one storage area SA, for example.

Figure 28:
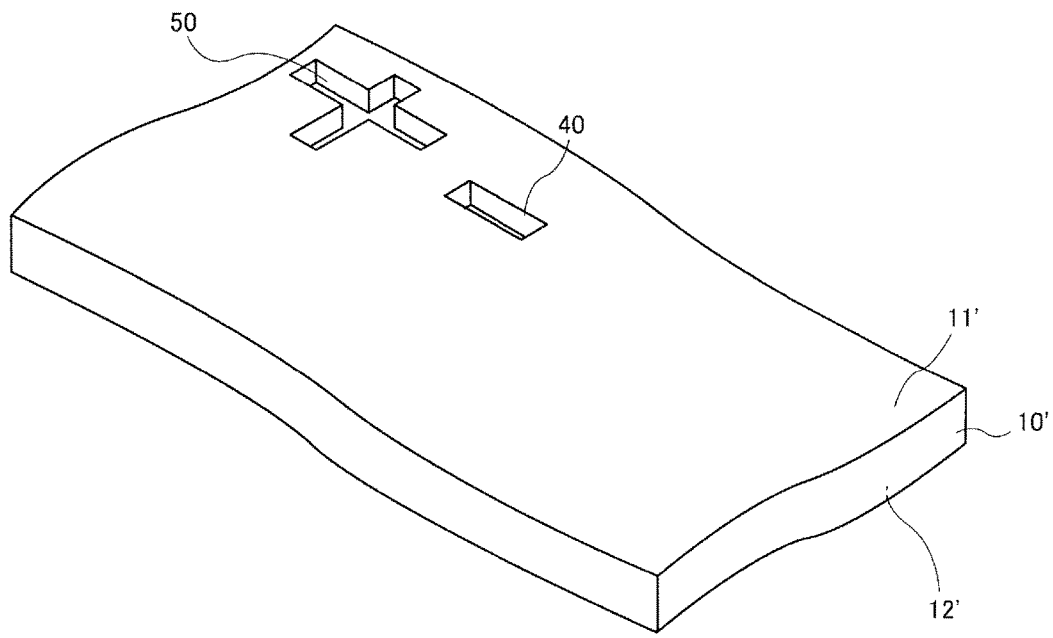
FIG. 28 is an enlarged partial perspective view depicting a general configuration of a data storage medium according to Embodiment 2 of this invention.

In Embodiment 2, the data storage medium 1 is fabricated by simultaneously forming the unit data pattern 31, the arrangement direction index pattern 40, and the boundary pattern 50 on the first surface 11 of the data storage medium substrate 10, which is constituted by quartz and has the first surface 11 and the second surface 12 facing the first surface (see FIG. 25), but the present invention is not limited to this mode. For example, as illustrated in FIG. 28, a data storage medium, where a storage area SA including a plurality of unit storage areas UA and a non-data storage areas NA is set on a first surface 11' of a substrate 10', which is constituted by quartz and has the first surface 11' and a second surface 12' facing the first surface 11', and the arrangement direction index pattern 40 corresponding to each unit storage area UA and the boundary pattern 50 are formed in the non-data storage area NA of this storage area SA, may be provided, so that the data storage medium 1 is fabricated by forming the unit data patterns 31 in each unit storage area UA of the data storage medium. In this case, if the unit data patterns 31 are formed in each unit storage area UA of the data storage medium, the arrangement direction index pattern 40 is recognized in advance, and the unit pattern data $D_{31}$, which is a drawing data used for forming the unit data patterns 31, is arranged based on the arrangement direction index pattern 40.

In the data storage medium 1 according to Embodiment 2, the physical structure constituting the unit data pattern 31, the arrangement direction index pattern 40 and the boundary pattern 50 may be dot-shaped convex portions. In this case, a negative type energy line sensitive resist material is used when the data storage medium is fabricated.

In Embodiment 2, the extraction direction of the physical structure of the unit data patterns 31 is determined based on the image data acquired by the image data acquisition unit 110 of the data read out apparatus 100, and the unit data (unit bit strings) is read by extracting the physical structure according to this extraction direction, but the present invention is not limited to this mode. For example, the position relationship of the unit storage area UA with respect to the normal position of the image data may be determined from the image data acquired by the image data acquisition unit 110, so that if the unit storage area UA does not match the normal position of the image data, the image data is rotated back to the normal position, and the unit data (unit bit strings) is read by extracting the physical structure in the matrix arrangement from the upper left to the lower right.

In the data read out apparatus 100 and the data read out method according to Embodiment 2, the arrangement direction index pattern 40 can be recognized by the image data acquisition unit 110, but first image data in which recognition of the unit data pattern 31 is impossible or difficult, may be acquired first, so that the setting direction of the data storage medium 1 (normal position, or rotated position from the normal position by 90° to the left, 90° to the right, or 180°) is determined based on the first image data, and then second image data in which recognition of the unit data patterns 31 is acquired is possible, may be acquired. In this case, it is sufficient that the first image data is one image data including one unit storage area UA which is arbitrarily selected from the plurality of unit storage areas UA, and after the second image data is acquired, the image data, generated by rotating the second image data back to the normal position, is stored in the storage unit 122 according to the setting direction of the data storage medium 1. Thereby the control unit 121 can read the unit data (unit bit strings) by extracting the physical structure (concave portions 311 and convex portions 312) of the unit data patterns 31 from the image data stored in the storage unit 122, based on the assumption that the data storage medium 1 is set to a normal position.

The data read out apparatus 100 according to Embodiment 2 may include an alert function, whereby upon the imaging unit 111 capturing an image, one image data, including one unit storage area UA, is acquired, and it is determined whether the data storage medium 1 is set in the correct direction based on the arrangement direction index pattern 40 in this image data, and if it is determined that the data storage medium 1 is set in the incorrect direction, the operator is notified to set the data storage medium in the correction direction.

In Embodiment 2, when the data is read, it may be checked whether the data storage medium 1 is set in the state of the first surface 21 facing the imaging unit 111, or in the state of the second surface 22 facing the imaging unit 111. In the case when focus of the imaging unit 111 is set on the first surface 21 facing the imaging unit 111, if the second surface 22 faces the imaging unit 111, it becomes difficult to acquire image data, in which the unit data pattern 31 and the arrangement direction index pattern 40 formed on the first surface 21 can be recognized, depending on the thickness of the substrate 2 of the data storage medium 1, or depending on the focal length of the imaging unit 111. Therefore, if it is checked whether the data storage medium 1 is set in a state of the first surface 21 facing the imaging unit 111 or in a state of the second surface 22 facing the imaging unit 111, the image data, in which the unit data pattern 31 and the arrangement direction index pattern 40 formed on the first surface 21 can be recognized, can be acquired with certainty.

In Embodiment 3, the data storage medium 1 is fabricated by simultaneously forming the unit data pattern 31, the dummy pattern 32, the discernment pattern 33, the address pattern AP and the boundary pattern 50 on the first surface 11 of the data storage medium substrate 10, which is constituted by quartz and has the first surface 11 and the second surface 12 facing the first surface (see FIG. 34), but the present invention is not limited to this mode. For example, as illustrated in FIG. 14, a data storage medium, where a storage area SA, including a plurality of unit storage areas UA and a non-data storage area NA, is set on a first surface 11' of a substrate 10', which is constituted by quartz and has the first surface 11' and a second surface 12' facing the first surface 11', and the address pattern AP corresponding to each unit storage area UA and the boundary pattern 50 are formed in the non-data storage area NA of this storage area SA, may be provided, as illustrated in FIG. 14, so that the data storage medium 1 fabricated by simultaneously forming the unit data pattern 31, the dummy pattern 32 and the discernment pattern 33 in each unit storage area UA of the data storage medium.

In Embodiment 3, the mode of forming the resist patterns $R_{31}$, $R_{32}$, $R_{33}$, $R_{AP}$ and $R_{50}$ using a positive energy line sensitive resist material was described as an example (see FIG. 34), but the present invention is not limited to this mode, and the resist patterns may be formed using a negative energy line sensitive resist material. Thereby a data storage medium 1, where the unit data pattern 31, the dummy pattern 32, the discernment pattern 33, and the address pattern AP are portions having convex portions (pillars) and non-convex portions, and the boundary pattern 50 is a convex portion (pillar), can be fabricated.

In Embodiment 3, the area density $AD_{UP}$ of the unit pattern data $D_{31}$ in an area other than the dummy pattern data generation area (area where the unit data pattern 31 is formed in the storage area SA) is calculated, and the dummy pattern data $D_{32}$ is generated using this area density $AD_{UP}$ as an index, but the present invention is not limited to this mode. For example, the dummy pattern data generation area is extracted, and then the area density $AD_{UP}$ of the unit pattern data $D_{31}$ in the area corresponding to the unit storage area surrounding this area is calculated, and a graphic cell corresponding to the dummy pattern 32 is disposed in the dummy pattern data generation area using the area density $AD_{UP}$ as an index. In the case of FIG. 30, for example, the area corresponding to the unit storage areas UA14 (a part of UA14) to UA16 make up the dummy pattern data generation area, hence using the area density $AD_{UP}$ of the unit pattern data $D_{31}$ in the areas corresponding to the unit storage areas UA7 to UA11, UA13, UA17 and UA19 to UA23, which surround the dummy pattern data area, as an index, the graphic cell corresponding to the dummy pattern 32 is disposed. The area density of the unit data pattern 31 is normally different depending on the plurality of unit storage areas in the storage area SA. For example, even if the area density of the unit data pattern 31 in the entire storage area SA is 15%, the area density of the unit data pattern 31 in the area around the dummy area DMA may be 10% or 20% in some cases. Therefore even if the dummy patterns 32 are formed in the dummy area DMA at a 15% area density, using the area density of the unit data pattern 31 in the entire storage area SA as an index, the difference of the area density between the dummy area DMA and the data area DTA become large if the area density of the unit data pattern 31 is 10% in an area around the dummy area DMA. In the case of fabricating a reproduction by imprint processing using this data storage medium 1, stress during separation becomes high at the boundary between the data area DTA and the dummy area DMA, and defects may be generated. However, if the area density of the unit data pattern 31 in the unit storage area around the dummy area DMA is substantially the same as the area density of the dummy pattern 32 in the dummy area DMA, then the stress during separation at the boundary between the data area DTA and the dummy area DMA can be decreased, and reproduction can be accurately fabricated by imprint processing.

It is also preferable that the dummy pattern data generation area is extracted, and the area density $AD_{UP}$ of the unit pattern data D31 in each unit storage area UA in the storage area SA is calculated, and then: the gradient of the change of the area density $AD_{UP}$ in the storage area SA centered around the extracted area is calculated; the area density of the dummy pattern 32 in the dummy area DMA is determined using this gradient as an index; and the graphic cell corresponding to the dummy pattern 32 is disposed based on the area density of the dummy pattern 32. By forming the dummy pattern 32 in this mode, the change of the stress applied to the entire storage area SA during separation can be decreased, and as a result, reproduction can be accurately fabricated by imprint processing.

REFERENCE SIGNS LIST

1 Data storage medium
2 Substrate
21 First surface
22 Second surface
3, 4 Convexoconcave structure
31 Unit data pattern
311, 41 Concave portion
312, 42 Convex portion
32 Dummy pattern
33 Discernment pattern
40 Arrangement direction index pattern
50 Boundary pattern
SA Storage area
UA Unit storage area
NA Non-data storage area
AP Address pattern
Gr Virtual grid
PI Intersection

The invention claimed is:

1. A data storage medium in which data is stored, the medium comprising:
a substrate constituted by quartz, and having a first surface and a second surface facing the first surface; and
a convexoconcave structure formed in a storage area which is set on the first surface of the substrate, wherein
the storage area includes a plurality of unit storage areas which are arrayed at least in one direction, and non-data storage areas which are disposed between the unit storage areas which are adjacent to each other,
the convexoconcave structure includes a plurality of unit data patterns which are constituted by concave pattern and convex pattern indicating a unit bit string of a plurality of unit data acquired by dividing the data, address patterns which indicate respective position information of the plurality of unit storage areas in the storage area, and boundary patterns which indicate the boundary of the unit storage areas which are adjacent to each other,
only each of the plurality of unit data patterns is formed in each of the plurality of unit storage areas in an array sequence of the plurality of unit storage areas, and
the address patterns are formed in the non-data storage areas so as to correspond to the plurality of unit storage areas respectively, in which the plurality of unit data patterns are formed respectively.

2. The data storage medium according to claim 1, wherein at least the unit data patterns are disposed so as to overlap with an intersection of virtual grids when the virtual grid is set in the storage area.

3. The data storage medium according to claim 1, wherein the unit data pattern and the address pattern substantially have the same dimensions.

4. The data storage medium according to claim 1, wherein the plurality of unit storage areas are arrayed in an M rows×N columns matrix (one of M and N is 2 or greater integer, and the other is 1 or greater integer) in the storage area, and
the address pattern is constituted by a convexoconcave structure, which indicates an array position of each unit storage area in the pth row (p is an integer of 1≤p≤M) and the qth column (q is an integer of 1≤q≤N).

5. A data read out apparatus reading out data stored in the data storage medium according to claim 1, the apparatus comprising:
an image data acquisition unit configured to acquire a plurality of image data including the plurality of unit storage areas and the address pattern which indicates position information of each of the plurality of unit storage areas;
a data read out unit configured to read out the unit data from the image data, based on the unit data pattern which is formed in each of the plurality of unit storage areas;
a position information read out unit configured to read out the position information of each of the unit storage areas from the image data, based on the address pattern formed in the non-data storage area;
a storage unit configured to store in association with each other the unit data read out by the data read out unit and the position information of the unit storage area; and
data restoration unit configured to restore the data, based on the plurality of unit data which has been read out by the data read out unit.

6. A data read out method of reading out data stored in the data storage medium according to claim 1, the method comprising:
a step of acquiring a plurality of image data including the plurality of unit storage areas and the address pattern which indicates position information of each of the plurality of unit storage areas;
a step of reading out the unit data from the image data, based on the unit data pattern formed in each of the plurality of unit storage areas;
a step of reading out the position information of each of the unit storage areas from the image data, based on the address pattern formed in the non-data storage area;
a step of storing in association with each other the unit data and the position information of the unit storage area; and
a step of restoring the data, based on the plurality of unit data.

7. The data read out method according to claim 6, further comprising:
a step of determining whether reading of the unit data is possible or not from the image data, based on the unit data pattern formed in the unit storage area; and
a step of generating error data when the reading of the unit data is determined impossible, wherein
in the step of reading the unit data, the unit data is read out based on the unit data pattern when reading of the unit data is determined possible, and
in the step of storing, the unit data and the corresponding position information of the unit storage area, or the error data and the position information of the unit storage area, are stored in association with each other.

8. The data read out method according to claim 7, further comprising a step of acquiring, when the error data is stored, based on the position information of the unit storage area stored in association with the error data, image data including the unit storage area, which is specified by the address pattern indicating position information that is the same as the position information in a reproduction of the data storage medium.

9. A data storage medium in which data is stored, the medium comprising:
a substrate constituted by quartz, and having a first surface and a second surface facing the first surface;
a data pattern which is formed in a rectangular storage area defined on the first surface of the substrate, and expresses a data bit string of the data by a physical structure corresponding to each bit of the data bit string; and
an arrangement direction index mark which is disposed on the first surface of the substrate so as to correspond to the storage area, and indicates information on an arrangement direction of the data bit string expressed by the physical structure of the data pattern formed in the storage area, wherein
the arrangement direction index mark is disposed in a position which enables specifying the arrangement direction of the data bit string expressed by the physical structure of the data pattern.

10. The data storage medium according to claim 9, wherein
a plurality of storage areas disposed in a matrix are defined on the first surface of the substrate,
in each of the plurality of storage areas, a unit data pattern, which expresses each data bit string of a plurality of unit data acquired by dividing the data, by using a unit physical structure corresponding to each bit of the data bit string, is formed, and
the arrangement direction index mark corresponds to each of the plurality of storage areas, and is disposed in a position which enables specifying an arrangement direction of the data bit string of the unit data expressed by the unit physical structure of the unit data pattern, which is formed in each of the plurality of storage areas.

11. The data storage medium according to claim 9, wherein the arrangement direction index mark is disposed in a position where an overall shape of the storage area and the arrangement direction mark is not symmetric.

12. The data storage medium according to claim 9, wherein the arrangement direction index mark is disposed in an area outside the storage area.

13. The data storage medium according to claim 9, wherein the arrangement direction index mark is disposed inside the storage area.

14. The data storage medium according to claim 9, wherein the physical structure is constituted by a concave portion and a convex portion corresponding to each bit of the data bit string.

15. The data storage medium according to claim 14, wherein the arrangement direction index mark is constituted by a concave portion or a convex portion.

16. The data storage medium according to claim 9, wherein the physical structure is constituted by a through hole and a non-hole portion corresponding to each bit of the data bit string.

17. The data storage medium according to claim 16, wherein the arrangement direction index mark is constituted by a through hole or a non-hole portion.

18. A data read out apparatus reading out data stored in the data storage medium according to claim 9, the apparatus comprising:
a medium mounting unit on which the data storage medium is mounted;
an image data acquisition unit configured to acquire image data of an area which includes the storage area of the data storage medium mounted on the medium mounting unit;
an extraction direction determination unit configured to determine a direction to extract a physical structure of the data pattern formed in the storage area from the image data acquired by the image data acquisition unit; and
a data read out unit configured to extract the physical structure from the image data in accordance with the extraction direction of the physical structure determined by the extraction direction determination unit, and read the data from the physical structure, wherein
the extraction direction determination unit recognizes the arrangement direction index mark from the image data acquired by the image data acquisition unit, and determines the extraction direction of the physical structure, based on a positional relationship of the arrangement direction index mark with respect to the storage area.

19. The data read out apparatus according to claim 18, wherein
the image data acquisition unit acquires image data by which the arrangement direction index mark and the data pattern formed in the storage area can be recognized.

20. The data read out apparatus according to claim 19, wherein
the image data acquisition unit acquires first image data by which the arrangement direction index mark can be recognized but the data pattern cannot be recognized, and second image data by which the physical structure of the data pattern can be recognized,
the extraction direction determination unit determines the extraction direction of the physical structure, based on the first image data,
the image data acquisition unit acquires the second image data to display the physical structure of the data pattern at a normal position, based on the extraction direction determined by the extraction direction determination unit, and
the data read out unit reads out the physical structure, based on the second image data.

21. A data read out method of reading out data stored in the data storage medium according to claim 9, the method comprising:
an image data acquisition step of acquiring image data in an area including the storage area of the data storage medium;
an extraction direction determination step of determining a direction of extracting a physical structure of the data pattern formed in the storage area from the image data; and
a data read out step of extracting the physical structure from the image data in accordance with the extraction direction of the physical structure determined in the extraction direction determination step, and reading the data from the physical structure, wherein
in the extraction direction determination step, the arrangement direction index mark is recognized from the image data, and the extraction direction of the physical structure is determined based on a positional relationship of the arrangement direction index mark with respect to the storage area.

22. The data read out method according to claim 21, wherein
in the image data acquisition step, the image data, by which the arrangement direction index mark and the data pattern formed in the storage area can be recognized, is acquired.

23. The data read out method according to claim 22, wherein
the image data acquisition step is a first image data acquisition step of acquiring first image data by which the arrangement direction index mark can be recognized but the data pattern cannot be recognized,
the extraction direction of the physical structure is determined based on the first image data in the extraction direction determination step,
a second image data acquisition step of acquiring second image data by which the physical structure of the data pattern is displayed at a normal position based on the determined extraction direction, and by which the physical structure of the data pattern can be recognized, is further included, and
in the data read out step, the physical structure is read out based on the second image data.

24. A data storage medium in which data is stored, the medium comprising:
a substrate constituted by quartz, and having a first surface and a second surface facing the first surface; and
a convexoconcave structure formed in a storage area which is set on the first surface of the substrate, wherein
the storage area includes a plurality of unit storage areas which are arrayed in at least one direction, and non-data storage areas which are disposed between the unit storage areas which are adjacent to each other,
the convexoconcave structure includes: a data pattern which is formed in a data area in the unit storage area and expresses data content of the data; a dummy pattern which is formed in a dummy area, which is an area other than the data area in the unit storage area; and a discernment pattern which is formed in the unit storage area so as to discern the boundary between the data pattern and the dummy pattern, and
each of the data pattern and the dummy pattern is formed in the data area and the dummy area so that an area density of the convexoconcave structure in the storage area becomes substantially uniform.

25. The data storage medium according to claim 24, wherein
the data pattern and the dummy pattern have substantially the same shapes and dimensions, and
the discernment pattern has a shape and dimensions which are different from those of the data pattern and the dummy pattern.

26. A data read out apparatus reading out data stored in the data storage medium according to claim 24, the apparatus comprising:
an image data acquisition unit configured to acquire image data which includes the storage area; and
a data read out unit configured to extract the data pattern out of the convexoconcave structure formed in the storage area, from the image data, and read out the data, based on the extracted data pattern.

27. The data read out apparatus according to claim 26, wherein the data read out unit extracts the data pattern, out of the convexoconcave structure, from the image data using the discernment pattern as an index.

28. A data read out method of reading out the data stored in the data storage medium according to claim 24, the method comprising:
an image data acquisition step of acquiring image data including the storage area; and
a data read out step of extracting the data pattern out of the convexoconcave structure formed in the storage area, from the image data, and reading out the data, based on the extracted data pattern.

29. The data read out method according to claim 28, wherein in the data read out step, the data pattern, out of the convexoconcave structure, is extracted from the image data, using the discernment pattern as an index.

30. A data storage medium which is used for storing data, the medium comprising a substrate constituted by quartz, and having a first surface and a second surface facing the first surface, wherein
a storage area, in which a plurality of unit storage areas are arrayed, is set on the first surface of the substrate,
the storage area includes a plurality of unit storage areas which are arrayed in at least one direction, and non-data storage areas which are disposed between the unit storage areas which are adjacent to each other,
each of the plurality of unit storage areas is an area, in which only each of the plurality of unit data patterns, constituted by concave pattern and convex pattern indicating a unit bit string of unit data acquired by dividing the data content of the data into a plurality of data, is to be formed,
in the non-data storage area, address patterns which indicate respective position information of the plurality of unit storage areas in the storage area are formed so as to correspond to the plurality of unit storage areas respectively, and boundary patterns which indicate a boundary of the unit storage areas adjacent to each other are formed, and
the address patterns and the boundary patterns are both constituted by convexoconcave structures.

31. The data storage medium according to claim 16, wherein
in the storage area, the plurality of unit storage areas are arrayed in an M rows×N columns matrix (one of M and N is 2 or greater integer, and the other is 1 or greater integer), and
the address pattern is constituted by a convexoconcave structure which indicates an arrayed position of each unit storage area in the pth row (p is an integer of $1 \leq p \leq M$) and the qth column (q is an integer of $1 \leq q \leq N$).

32. A manufacturing method for a data storage medium in which data is stored, the medium comprising:
a substrate constituted by quartz, and having a first surface and a second surface facing the first surface; and
a convexoconcave structure formed in a storage area which is set on the first surface of the substrate, wherein
the storage area includes a plurality of unit storage areas which are arrayed at least in one direction, and non-data storage areas which are disposed between the unit storage areas which are adjacent to each other,
the convexoconcave structure includes a plurality of unit data patterns which are constituted by concave pattern and convex pattern indicating a unit bit string of a plurality of unit data acquired by dividing the data, address patterns which indicate respective position information of the plurality of unit storage areas in the storage area, and boundary patterns which indicate the boundary of the unit storage areas which are adjacent to each other, each of the plurality of unit data patterns is formed in each of the plurality of unit storage areas in an array sequence of the plurality of unit storage areas, and the address patterns are formed in the non-data storage areas so as to correspond to the plurality of unit storage areas respectively, in which the plurality of unit data patterns are formed respectively, the method comprising:

setting a virtual grid in an area corresponding to a storage area of the data storage medium, on a first surface side of a data storage medium substrate constituted by quartz and having a first surface and a second surface facing the first surface;

forming a resist pattern, corresponding to the unit data pattern which is constituted by concave pattern and convex pattern indicating a unit bit string of the data acquired by dividing the data content of the data into a plurality of the data stored in the data storage medium, on an intersection of virtual grids in an area corresponding to each of the unit storage areas of the data storage medium;

forming resist patterns corresponding to the address pattern and the boundary pattern respectively in an area corresponding to the non-data storage area of the data storage medium; and etching the first surface of the data storage medium substrate using the resist pattern as a mask.

33. The manufacturing method for the data storage medium according to claim 32, wherein
the resist patterns corresponding to the unit data pattern and the address pattern respectively are formed to have substantially the same dimensions.

34. The manufacturing method for the data storage medium according to claim 32, wherein
the data storage medium substrate has a hard mask layer on the first surface,
the resist pattern is formed on the hard mask layer and a hard mask pattern is formed by etching the hard mask layer using the resist pattern as a mask, and
the first surface of the data storage medium substrate is etched using the hard mask pattern of a mask.

35. A manufacturing method for a data storage medium in which data is stored, the method comprising:
a pattern data generation step of generating pattern data, which is used for forming a convexoconcave structure on a first surface side of a data storage medium substrate constituted by quartz and having a first surface and a second surface facing the first surface; and
a convexoconcave structure formation step of forming the convexoconcave structure on the first surface of the data storage medium substrate based on the pattern data, wherein
the convexoconcave structure includes: a data convexoconcave structure which is formed in a data area in a storage area defined on the first surface side of the data storage substrate and expresses the data content of the data; and a dummy convexoconcave structure which is formed in a dummy area, which is an area other than the data area in the storage area,
the pattern data generation step includes a first step of generating a first pattern data corresponding to the data convexoconcave structure, and a second step of generating the pattern data by adding a second pattern data corresponding to the dummy convexoconcave structure to the first pattern data, and
in the second step, the second pattern data is added to the first pattern data, so that an area density of the convexoconcave structure in the storage area becomes substantially uniform based on the first pattern data.

36. The manufacturing method for the data storage medium according to claim 35, wherein
in the pattern data generation step, a pattern data generation area corresponding to the storage area is set,
in the first step, the first pattern data is generated by disposing a first graphic cell corresponding to the data convexoconcave structure in the pattern data generation area, and
the second step includes: a step of extracting, as a first pattern data generation area, an area, in which the first graphic cell is disposed, in the pattern data generation area, based on the first pattern data; a step of extracting, as a second pattern data generation area corresponding to the dummy area, an area other than the first pattern data generation area; and a step of generating the second pattern data by disposing a second graphic cell corresponding to the dummy convexoconcave structure in the second pattern data generation area.

37. The manufacturing method for the data storage medium according to claim 35, wherein
the storage area includes a plurality of unit storage areas arranged in a matrix,
the data convexoconcave structure is constituted by a plurality of unit data convexoconcave structures which express respective data content of a plurality of unit data acquired by dividing the data,
a plurality of unit pattern data generation areas, corresponding to the plurality of unit storage areas respectively, are set in the pattern data generation step,
in the first step, the first pattern data is generated by disposing the first graphic cell corresponding to each of the unit data convexoconcave structures in each of the plurality of unit pattern data generation areas in the sequence of the matrix arrangement of the unit pattern data generation areas, and
the second step includes: a step of extracting, as a first pattern data generation area, an area in which the first graphic cell is disposed, in each of the plurality of unit pattern data generation areas, based on the first pattern data; a step of extracting, as a second pattern data generation area corresponding to the dummy area, an area other than the first pattern data generation area; and a step of generating the second pattern data by disposing the second graphic cell corresponding to the dummy convexoconcave structure in the second pattern data generation area.

38. The manufacturing method for the data storage medium according to claim 37, wherein in the step of generating the second pattern data, a ratio of a total area of the first graphic cell with respect to a total area of the first pattern data generation area in which the first graphic cell is disposed is calculated based on the first pattern data, and the second pattern data is generated by disposing the second graphic cell in the second pattern data generation area at substantially the same area ratio as the ratio of the total area of the first graphic cell.

39. The manufacturing method for the data storage medium according to claim 37, wherein in the step of generating the second pattern data, the unit pattern data generation area located around the second pattern data generation area is extracted based on the first pattern data, a ratio of a total area of the first graphic cell, with respect to a total area of the extracted unit pattern data generation area, is calculated, and the second pattern data is generated by disposing the second graphic cell in the section pattern data generation area at substantially the same area ratio as the ratio of the total area of the first graphic cell.

40. The manufacturing method for the data storage medium according to claim 39, wherein in the step of generating the second pattern data, a gradient of the ratio of the total area of the first graphic cell in the unit pattern data generation area is calculated from the ratio of the total area of the first graphic cell in the unit pattern data generation area located around the second pattern data generation area, and the second pattern data is generated by disposing the second graphic cell in the second pattern data generation area based on the gradient of the ratio of the total area of the first graphic cell.

41. The manufacturing method for the data storage medium according to claim 35, wherein
the convexoconcave structure further includes a determination convexoconcave structure for determining a boundary between the data convexoconcave structure and the dummy convexoconcave structure,
the pattern data generation step further comprises a step of adding a third pattern data corresponding to the determination convexoconcave structure to the first pattern data generated in the first step, and
in the second step, the second pattern data is added to the first pattern data, to which the third pattern data has been added.

42. The manufacturing method for the data storage medium according to claim 35, wherein the data convexoconcave structure and the dummy convexoconcave structure have substantially the same dimensions.

43. A data read out apparatus reading out data stored in a data storage medium in which data is stored, the medium comprising:
a substrate constituted by quartz, and having a first surface and a second surface facing the first surface; and
a convexoconcave structure formed in a storage area which is set on the first surface of the substrate, wherein
the storage area includes a plurality of unit storage areas which are arrayed at least in one direction, and non-data storage areas which are disposed between the unit storage areas which are adjacent to each other,
the convexoconcave structure includes a plurality of unit data patterns which are constituted by concave pattern and convex pattern indicating a unit bit string of a plurality of unit data acquired by dividing the data, address patterns which indicate respective position information of the plurality of unit storage areas in the storage area, and boundary patterns which indicate the boundary of the unit storage areas which are adjacent to each other,
each of the plurality of unit data patterns is formed in each of the plurality of unit storage areas in an array sequence of the plurality of unit storage areas, and
the address patterns are formed in the non-data storage areas so as to correspond to the plurality of unit storage areas respectively, in which the plurality of unit data patterns are formed respectively, the apparatus comprising:
an image data acquisition unit configured to acquire a plurality of image data including the plurality of unit storage areas and the address pattern which indicates position information of each of the plurality of unit storage areas;
a data read out unit configured to read out the unit data from the image data, based on the unit data pattern which is formed in each of the plurality of unit storage areas;
a position information read out unit configured to read out the position information of each of the unit storage areas from the image data, based on the address pattern formed in the non-data storage area;
a storage unit configured to store in association with each other the unit data read out by the data read out unit and the position information of the unit storage area;
data restoration unit configured to restore the data, based on the plurality of unit data which has been read out by the data read out unit;
a determination unit configured to determine whether reading of the unit data is possible or not from the image data acquired by the image data acquisition unit, based on the unit data pattern formed in the unit storage area; and
an error data generation unit configured to generate error data when the determination unit determines that reading of the unit data is impossible, wherein
the data read out unit reads out the unit data, based on the unit data pattern when the determination unit determines that reading of the unit data is possible, and
the storage unit stores in association with each other another the unit data which has been read out by the data read out unit and the corresponding position information of the unit storage area, or stores in association with each other the error data generated by the error data generation unit and the position information of the unit storage area.

44. The data read out apparatus according to claim 43, wherein when the error data generated by the error data generation unit is stored in the storage unit, the image data acquisition unit acquires, based on the position information of the unit storage area stored in the storage unit in association with the error data, image data including the unit storage area, which is specified by the address pattern indicating position information that is the same as the position information in a reproduction of the data storage medium.

* * * * *